US007524771B2

(12) United States Patent
Izumi et al.

(10) Patent No.: US 7,524,771 B2
(45) Date of Patent: Apr. 28, 2009

(54) SUBSTRATE PROCESSING METHOD USING ALKALINE SOLUTION AND ACID SOLUTION

(75) Inventors: Akira Izumi, Kamikyo-ku (JP); Kenichi Sano, Kamikyo-ku (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/690,912

(22) Filed: Oct. 22, 2003

(65) Prior Publication Data

US 2004/0087158 A1 May 6, 2004

(30) Foreign Application Priority Data

| Oct. 29, 2002 | (JP) | ............................ P2002-314561 |
| Nov. 12, 2002 | (JP) | ............................ P2002-328018 |
| Mar. 19, 2003 | (JP) | ............................ P2003-074875 |
| Aug. 11, 2003 | (JP) | ............................ P2003-291008 |
| Aug. 19, 2003 | (JP) | ............................ P2003-295269 |

(51) Int. Cl.
*H01L 21/302* (2006.01)

(52) U.S. Cl. ............................ 438/745; 134/1; 134/147

(58) Field of Classification Search ................ 438/745, 438/753, 756; 134/1, 3, 105, 147, 148
See application file for complete search history.

(56) References Cited

U.S. PATENT DOCUMENTS

| 4,326,553 | A | * | 4/1982 | Hall | ............................ 134/153 |
| 5,635,053 | A | * | 6/1997 | Aoki et al. | .................. 205/746 |
| 5,730,163 | A | * | 3/1998 | Meyer et al. | .............. 134/102.2 |
| 5,932,022 | A | | 8/1999 | Linn et al. | ...................... 134/2 |
| 5,934,566 | A | | 8/1999 | Kanno et al. | ................. 239/398 |
| 5,972,123 | A | * | 10/1999 | Verhaverbeke | .................. 134/3 |
| 6,039,059 | A | * | 3/2000 | Bran | ........................... 134/105 |
| 6,423,147 | B1 | * | 7/2002 | Chang | ........................... 134/2 |
| 6,423,148 | B1 | * | 7/2002 | Aoki | .............................. 134/3 |
| 6,431,185 | B1 | * | 8/2002 | Tomita et al. | ................. 134/1.3 |
| 6,465,403 | B1 | * | 10/2002 | Skee | ........................... 510/175 |
| 6,901,938 | B2 | * | 6/2005 | Sato et al. | ................... 134/99.1 |

(Continued)

FOREIGN PATENT DOCUMENTS

JP           07-263395           10/1995

(Continued)

OTHER PUBLICATIONS

English translation of Japanese Official Action dated Jul. 22, 2008 corresponding to Japanese Application No. 2003-295269.

(Continued)

*Primary Examiner*—Kin-Chan Chen
(74) *Attorney, Agent, or Firm*—Ostrolenk, Faber, Gerb & Soffen, LLP

(57) ABSTRACT

Particles adhering to the surface of a substrate are removed by physical action of injection of droplets or megasonic vibrations or by combination of the physical action and slight etching on the surface of the substrate. On the other hand, metal contaminants adhering to the surface of the substrate are altered to hydroxides with an alkaline solution and thereafter dissolved with an acid solution to be removed. Thus, it is possible to rapidly process the substrate while minimizing the quantity of etching on the surface of the substrate.

2 Claims, 28 Drawing Sheets

U.S. PATENT DOCUMENTS

| | | | | |
|---|---|---|---|---|
| 6,951,221 | B2* | 10/2005 | Okuda et al. | 134/56 R |
| 2002/0035762 | A1* | 3/2002 | Okuda et al. | 15/77 |
| 2002/0059947 | A1* | 5/2002 | Sato et al. | 134/102.1 |
| 2003/0170988 | A1* | 9/2003 | Izumi et al. | 438/689 |
| 2003/0178047 | A1* | 9/2003 | Hirae | 134/26 |

FOREIGN PATENT DOCUMENTS

| | | |
|---|---|---|
| JP | 8-078647 | 3/1996 |
| JP | 8-318181 | 12/1996 |
| JP | 2688293 | 8/1997 |
| JP | 10-004074 | 1/1998 |
| JP | 10-256211 | 9/1998 |
| JP | 11-181494 | 7/1999 |
| JP | 11-340175 | 12/1999 |
| JP | 2000-188273 | 7/2000 |
| JP | 2000-315670 | 11/2000 |
| JP | 2001-007067 | 1/2001 |
| JP | 2001-334221 | 12/2001 |
| JP | 2002-050607 | 2/2002 |
| JP | 2002-170811 | 6/2002 |
| JP | 2002-270564 | 9/2002 |
| JP | 2002-329691 | 11/2002 |
| JP | 2003-088817 | 2/2003 |
| JP | 2003-282527 | 10/2003 |

OTHER PUBLICATIONS

Office Action issued by Japanese Patent Office on Jul. 1, 2008 in connection with corresponding Japanese Patent Application No. 2003-074875.

English translation of Japanese Office Action issued against application 2003-074875 submitted as a statement of relevancy of the prior art against instant application.

Office Action issued by Japanese Patent Office on Jul. 22, 2008 in connection with corresponding Japanese Patent Application No. 2003-291008.

English translation of Japanese Office Action issued against application 2003-291008 submitted as a statement of relevancy of the prior art against instant application.

* cited by examiner

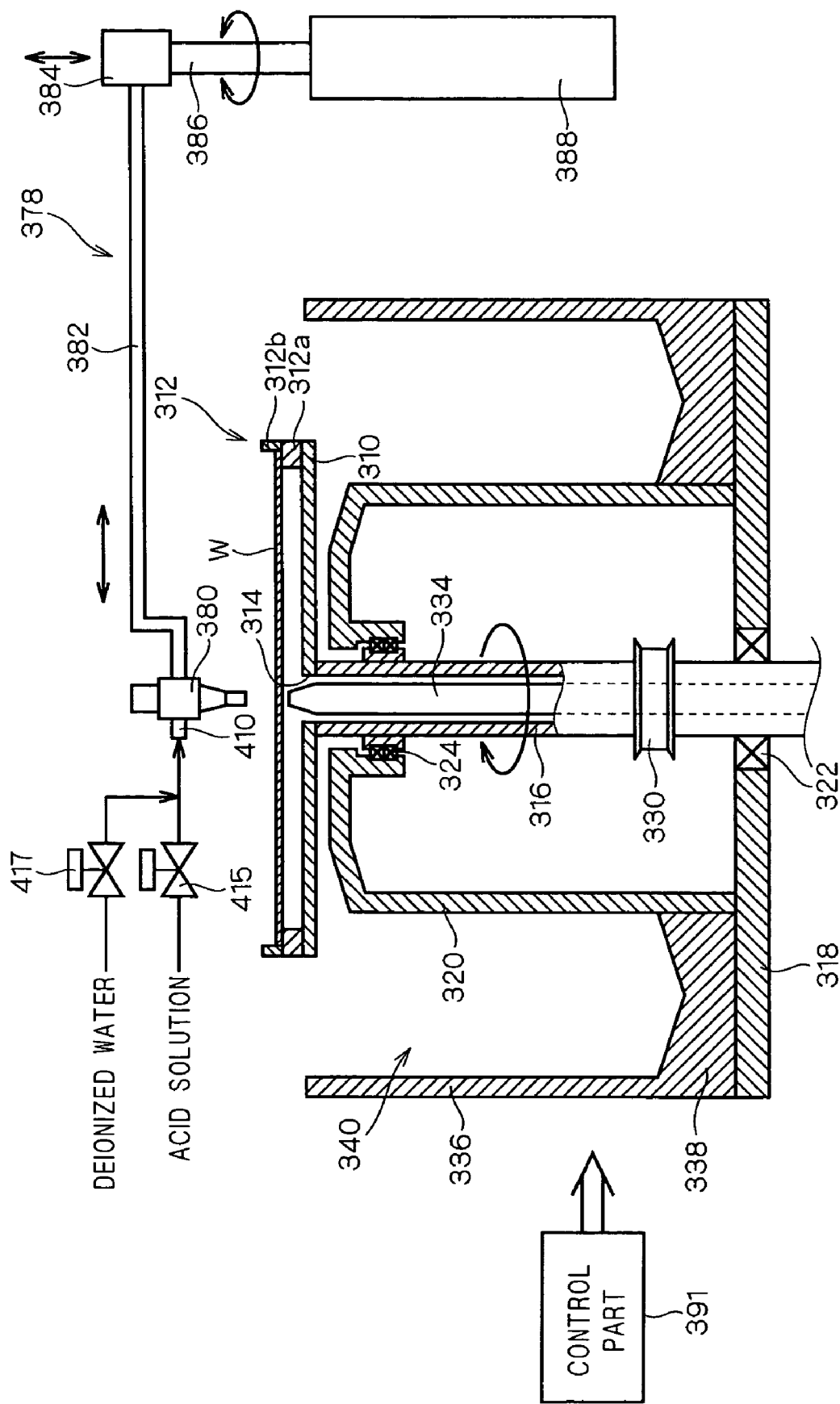
F I G . 2 5

SUBSTRATE PROCESSING METHOD USING ALKALINE SOLUTION AND ACID SOLUTION

BACKGROUND OF THE INVENTION

1. Field of the Invention

The present invention relates to a substrate processing method and a substrate processing apparatus cleaning the surface of a substrate such as a semiconductor wafer, a glass substrate for a liquid crystal display, a glass substrate for a photomask or a substrate for an optical disk.

2. Description of the Background Art

In steps of manufacturing a substrate, particulate foreign materials (hereinafter referred to as "particles") and various metal contaminants adhere to the surface of the substrate. Therefore, the surface of the substrate must be cleaned in a proper stage. The substrate can be cleaned by a batch method of simultaneously dipping a large number of substrates in a cleaning solution and processing the same and a single-substrate type method of rotating substrates one by one and supplying a cleaning solution to the surfaces of the substrates for processing the same.

A single-substrate type substrate processing apparatus has many advantages in process performance such as uniformity of the processing, reduction of particles, prevention of transfer of metal contaminants from another substrate etc. as compared with a batch-type substrate processing apparatus. Therefore, the single-substrate type substrate processing apparatus has mainstreamed in recent years. In the single-substrate type substrate processing apparatus processing substrates one by one, however, the processing must be performed in a shorter time as compared with the batch-type substrate processing apparatus in consideration of productivity.

In order to reduce the processing time in the single-substrate type substrate processing apparatus, ozone water and dilute hydrofluoric acid are employed as cleaning solutions, for example, for removing particles and metal contaminants from the surface of a substrate through steps including processing of about 15 seconds with the ozone water and processing of about 20 seconds with the dilute hydrofluoric acid.

Also in this attempt, however, the particles and the metal contaminants are removed through the etching force of hydrofluoric acid, leasing to another problem that the quantity of etching on the surface of the substrate is disadvantageously increased (the etching thickness reaches 2.0 nm, for example).

SUMMARY OF THE INVENTION

The present invention is directed to a substrate processing method.

According to the present invention, the substrate processing method includes a first step of injecting droplets formed by mixing an alkaline solution and gas with each other to a surface of a substrate and a second step of injecting droplets formed by mixing an acid solution and gas with each other to the surface of the substrate after the first step.

In the first and second steps, particles adhering to the surface of the substrate can be physically removed due to kinetic energy resulting from collision of the droplets. In the first step, particles once liberated are prevented from experiencing re-adhesion due to repulsion of zeta potentials. Further, metal contaminants adhering to the surface of the substrate can be altered to hydroxides in the first step, to be rapidly dissolved and removed in the subsequent second step.

In addition, the quantity of etching on the surface of the substrate can be suppressed dissimilarly to a case of removing particles and metal contaminants mainly by etching.

According to another aspect of the present invention, the substrate processing method includes a first step of supplying an alkaline solution subjected to megasonic vibrations to a surface of a substrate and a second step of supplying an acid solution to the surface of the sub state after the first step.

According to another aspect of the present invention, the substrate processing method includes a first step of supplying an alkaline solution imparted with megasonic vibrations to a surface of a substrate and a second step of supplying an acid solution to the surface of the substrate after the first step.

In the first step, particles adhering to the surface of the substrate can be liberated from this surface due to the megasonic vibrations imparted to the droplets. In the first step, further, the particles once liberated are prevented from re-adhesion due to repulsion of zeta potentials. On the other hand, metal contaminants adhering to the surface of the substrate can be altered to hydroxides in the first step, to be rapidly dissolved and removed in the subsequent second step. The quantity of etching on the surface of the substrate can be suppressed dissimilarly to the case of removing particles and metal contaminants mainly by etching.

According to still another aspect of the present invention, the substrate processing method includes a first step of supplying an alkaline solution to a surface of a substrate, a second step of supplying an acid solution to the surface of the substrate after the first step and a third step of supplying the alkaline solution to the surface of the substrate after the second step, while at least either supply of the acid solution in the second step or supply of the alkaline solution in the third step is injection of droplets formed by mixing the solution with gas.

Etching on the surface of the substrate with an acid processing solution and physical action of injection of droplets are so combined with each other that particles adhering to the surface of the substrate can be removed from this surface in a short time. On the other hand, metal contaminants adhering to the surface of the substrate can be altered to hydroxides in the first step, to be rapidly dissolved and removed in the subsequent second step. Further, the quantity of etching on the surface of the substrate can be suppressed dissimilarly to the case of removing the particles and the metal contaminants mainly by etching.

Preferably, only supply of the alkaline solution in the first step and the third step is injection of droplets formed by mixing the alkaline solution with gas.

Particles adhering to the surface of the substrate can be further efficiently removed by removing most of the particles present on the surface of the substrate in the first step and thereafter combining etching on the surface of the substrate in the second step and physical action of injection of droplets in the third step with each other.

According to a further aspect of the present invention, the substrate processing method includes a first step of supplying an alkaline solution to a surface of a substrate, a second step of supplying an acid solution to the surface of the substrate after the first step and a third step of supplying the alkaline solution to the surface of the substrate after the second step, while at least either supply of the acid solution in the second step or supply of the alkaline solution in the third step is supply of the solution imparted with megasonic vibrations.

Etching on the surface of the substrate with an acid processing solution and physical action of megasonic vibrations are so combined with each other that particles adhering to the surface of the substrate can be removed from this surface in a short time. On the other hand, metal contaminants adhering to the surface of the substrate can be altered to hydroxides in the first step, to be rapidly dissolved and removed in the subsequent second step. Further, the quantity of etching on the surface of the substrate can be suppressed dissimilarly to the case of removing the particles and the metal contaminants mainly by etching.

Preferably, only supply of the alkaline solution in the first step and the third step is supply of the alkaline solution imparted with megasonic vibrations.

Particles adhering to the surface of the substrate can be further efficiently removed by removing most of the particles present on the surface of the substrate in the first step and thereafter combining etching on the surface of the substrate in the second step and physical action of megasonic vibrations in the third step with each other.

The present invention is also directed to a substrate processing apparatus.

Accordingly, an object of the present invention is to reduce the processing time for a substrate while suppressing the quantity of etching on the surface of the substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 12A and 12B are a perspective view of a nozzle 268 and a longitudinal sectional view of the nozzle 268 including a pipe 237a;

FIGS. 24 and 25 are block diagrams showing a principal part of the substrate processing apparatus according to the third embodiment on end surfaces respectively;

DESCRIPTION OF THE PREFERRED EMBODIMENTS

Preferred embodiments of the present invention are now described with reference to the drawings.

<1. First Embodiment>

Figure 1:
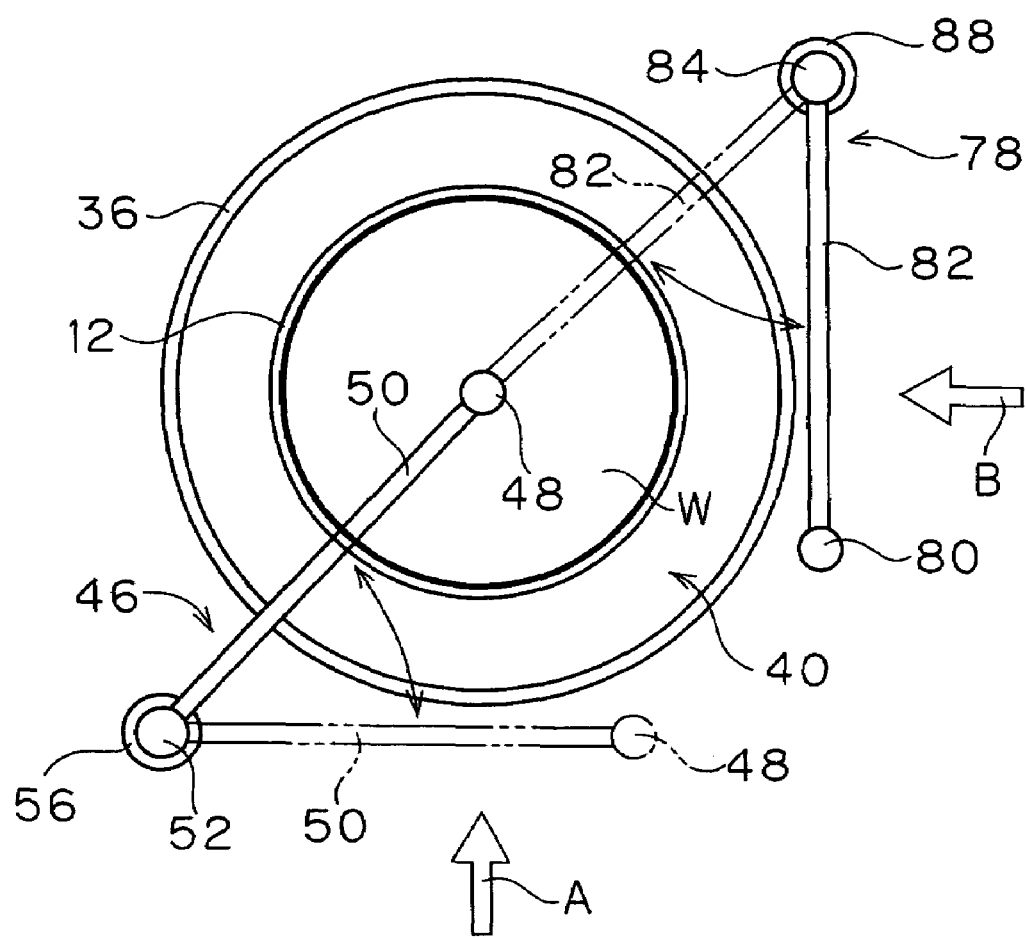
FIG. 1 is a plan view showing the structure of a substrate processing apparatus according to a first embodiment of the present invention.
Figure 2:
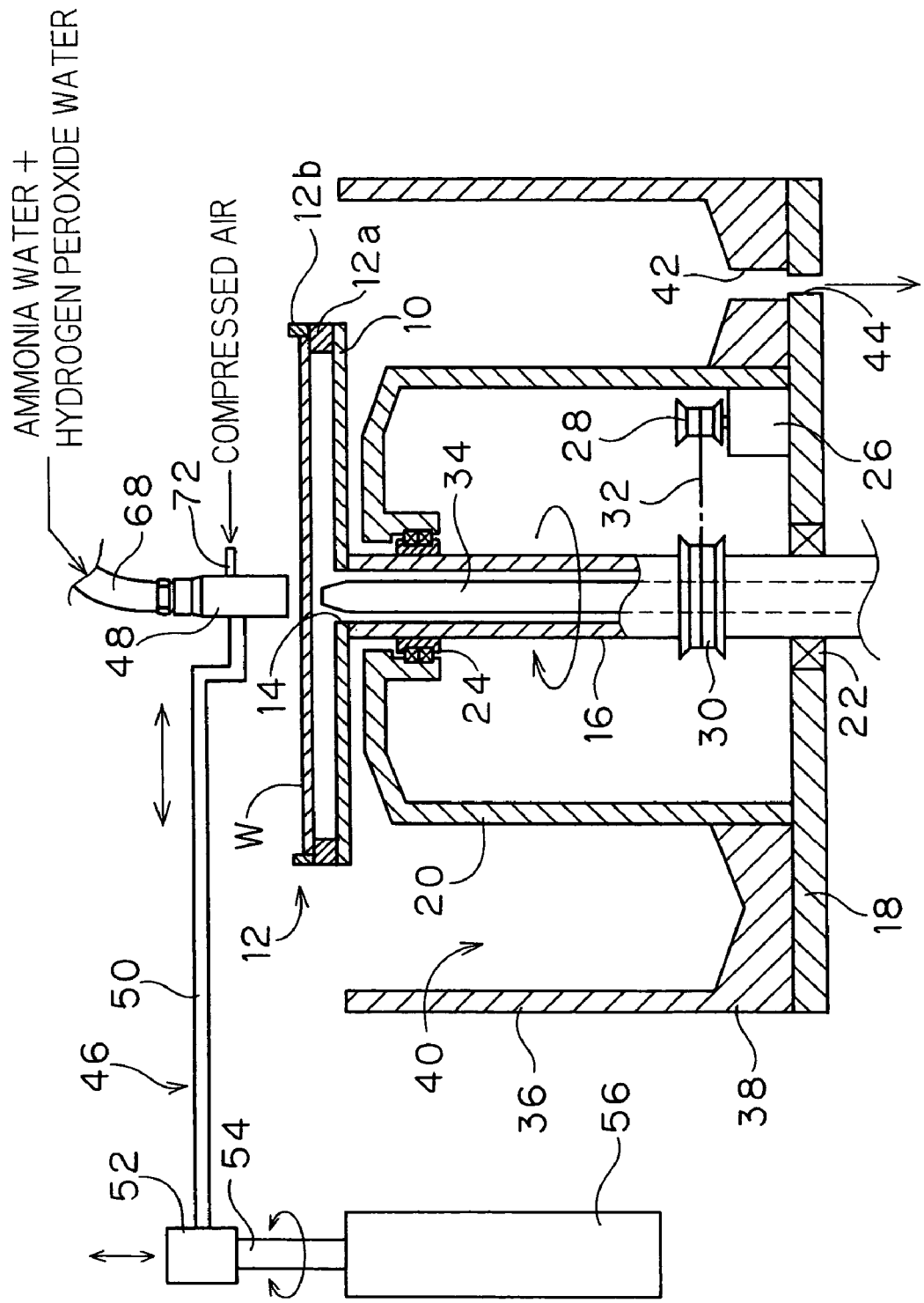
FIGS. 2 and 3 are block diagrams showing a principal part of the substrate processing apparatus according to the first embodiment on end surfaces respectively.
Figure 3:
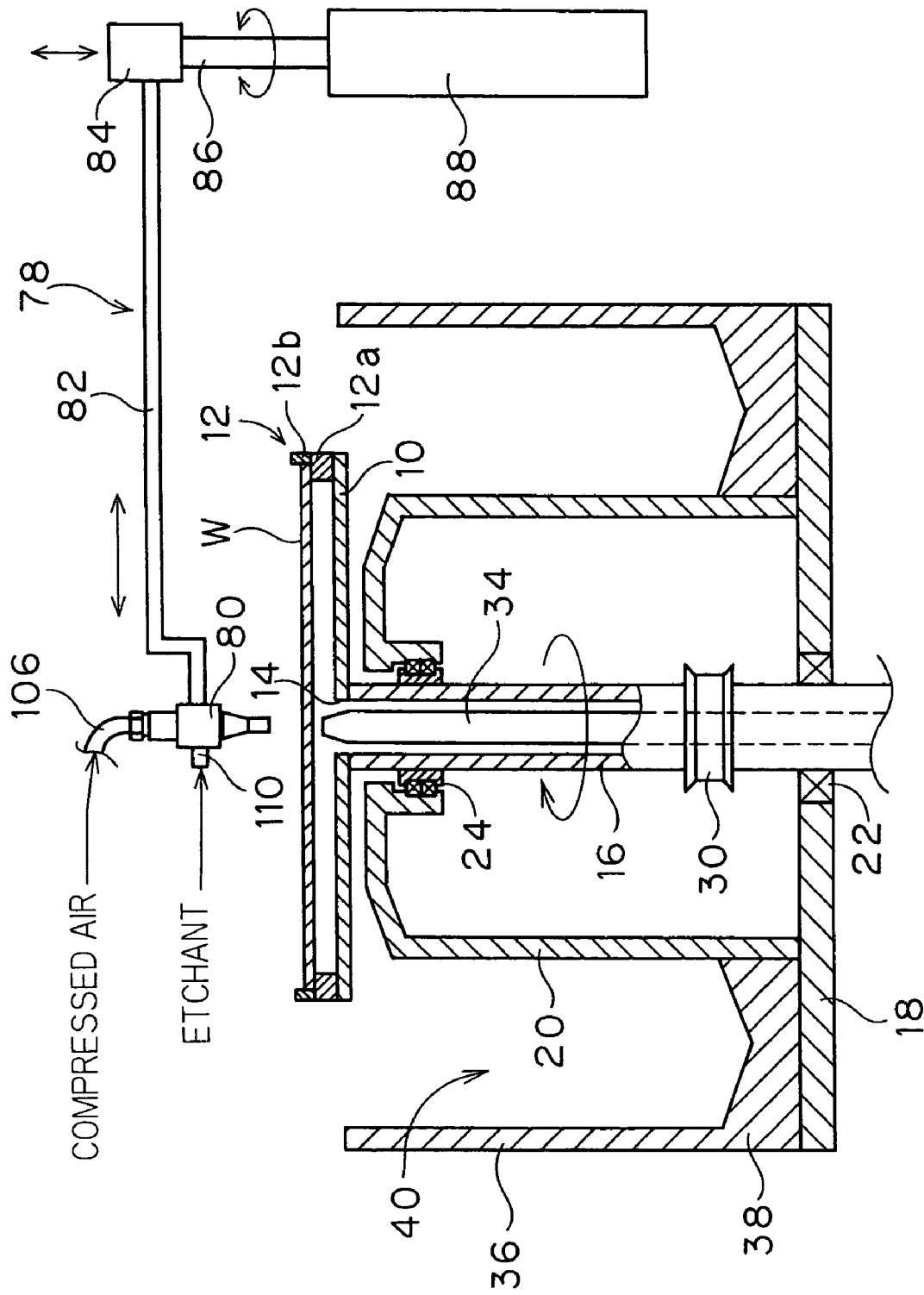

FIGS. 1 to 3 illustrate an exemplary structure of a substrate processing apparatus according to a first embodiment of the present invention. FIG. 1 is a plan view of the apparatus. FIG. 2 is a schematic block diagram showing a principal part of the apparatus as viewed along arrow A in FIG. 1 in an end surface. FIG. 3 is a schematic block diagram showing the principal part of the apparatus along arrow B in FIG. 1 in another end surface. FIG. 2 omits illustration of a supply mechanism for an etchant, while FIG. 3 omits illustration of supply mechanisms for ammonia water and hydrogen peroxide water.

This substrate processing apparatus comprises a discoidal spin base 10 horizontally supporting a substrate W such as a semiconductor wafer. A plurality of, e.g., six chuck pins 12 for grasping the peripheral edge of the substrate W are circumferentially arranged on the upper peripheral edge of the spin base 10 at regular intervals. Each of the chuck pins 12 comprises a support part 12a coming into contact with the lower peripheral edge of the substrate W for supporting the substrate W and a fixing part 12b pressing the outer peripheral end surface of the substrate W supported on the support part 12a for fixing the substrate W. The fixing part 12b of each chuck pin 12 is switchable between the state pressing the outer peripheral end surface of the substrate W for fixing the substrate W and a state separating from the outer peripheral end surface of the substrate W for releasing the substrate W, although no detailed structure thereof is illustrated.

A through-hole 14 is formed in the central portion of the spin base 10. A cylindrical rotary spindle 16 is suspended from the lower surface of the spin base 10 to communicate with the through-hole 14. A lidded cylindrical casing 20 fixed onto a base plate 18 is arranged around the rotary spindle 16. The rotary spindle 16 is supported by the base plate 18 and the casing 20 to be vertically rotatable through bearings 22 and 24 respectively. A motor 26 fixed onto the base plate 18 is arranged in the casing 20. A driving pulley 28 is fixed to the rotary shaft of the motor 28 while a driven pulley 30 is engaged with the rotary spindle 16, and a belt 32 is extended along the pulleys 28 and 30. This mechanism rotates rotary spindle 16 for horizontally rotating the substrate W held on the spin base 10 fixed to the upper end of the rotary spindle 16. A nozzle 34 channel-connected to a supply source for a cleaning solution is inserted into the hollow portion of the rotary spindle 16. The substrate processing apparatus can discharge the cleaning solution from an upper outlet of this nozzle 34 toward the central portion of the lower surface of the substrate W held on the spin base 10.

Around the casing 20, a cylindrical wall part 36 arranged to enclose the same and a bottom wall part 38 integrally formed with the wall part 36 and concatenated to the lower end of the casing 20 are fixed onto the base plate 18. The cylindrical portion of the casing 20, the wall part 36 and the bottom wall part 38 constitute a recovery tank 40. The bottom wall part 38 forming the bottom of the recovery tank 40, having a V-shaped longitudinal section, is formed with a discharge hole 42. The base plate 18 is formed with a discharge port 44 communicating with the hole 42, while a recovery pipe (not shown) channel-connected to a recovery tank (not shown) for the cleaning solution is communicatively connected to the discharge port 44.

As shown in FIG. 2, a supply mechanism 46 for the cleaning solution consisting of a mixed solution of ammonia water, hydrogen peroxide water and deionized water is arranged on a side portion of the wall part 36. The cleaning solution supply mechanism 46 comprises a bi-fluid nozzle 48 having a discharge port arranged above the substrate W held on the spin base 10 to be opposed to its surface. The bi-fluid nozzle 48 is fixed to the forward end of an arm 50, which is horizontally held by an arm holding part 52 in a cantilever manner. The arm holding part 52 is fixed to the upper end of a vertically arranged rotary spindle 54. The rotary spindle 54 is coupled to a nozzle moving mechanism 56, to be rotated and vertically reciprocated by this nozzle moving mechanism 56. The nozzle moving mechanism 56 is so driven that the bi-fluid nozzle 48 can be swung in a horizontal plane, reciprocated between the central portion and the peripheral portion of the substrate W and approached to separated from the surface of the substrate W. The arm 50 holding the bi-fluid nozzle 48 can be retracted to an external position for the wall part 36, as shown by two-dot chain lines in FIG. 1. The nozzle moving mechanism 56 is not restricted to the illustrated one but can alternatively be implemented by another mechanism.

Figure 4:
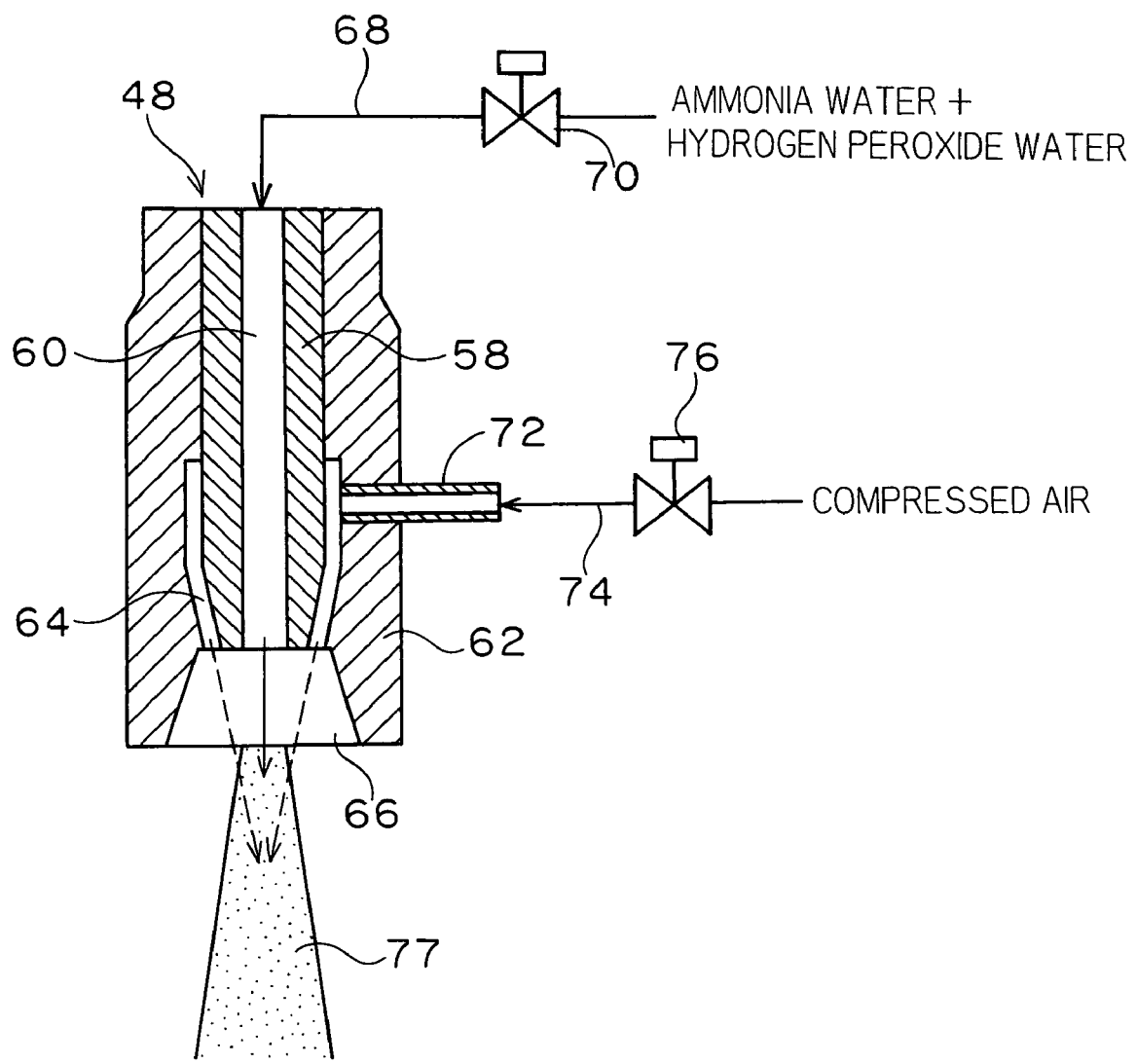
FIG. 4 is a longitudinal sectional view showing an exemplary structure of a by-fluid nozzle 48.

FIG. 4 is a longitudinal sectional view of the bi-fluid nozzle 48. As shown in FIG. 4, the bi-fluid nozzle 48 is constituted of a tubular liquid supply nozzle part 58 having a through-hole 60 in its axial portion and a cylindrical gas supply nozzle part 62 integrally formed to enclose the outer periphery of the nozzle part 58 with a concave stepped inner peripheral surface provided on its lower half and an annular hole 64 formed between this stepped surface and the outer peripheral surface of the lower half of the liquid supply nozzle part 58. A discharge port of the liquid supply nozzle part 58 and an annular discharge port of the gas supply nozzle part 62 are concentrically arranged. The annular hole 64 of the gas supply nozzle part 62 is tapered around the discharge port so that the annular discharge port is directed to a point on an extension line of the through-hole 60 of the liquid supply nozzle part 58. Further, the lower end of the gas supply nozzle part 62 annularly extends downward beyond the lower end of the liquid supply nozzle part 58 to define a largely externally opening injection port 66 facing the discharge port of the liquid supply nozzle part 58 and the annular discharge port of the gas supply nozzle part 62 respectively.

The through-hole 60 of the liquid supply nozzle part 58 is communicatively connected with a cleaning solution supply pipe 68 channel-connected to the supply source (not shown) for the cleaning solution consisting of the mixed solution of ammonia water, hydrogen peroxide water and deionized water. An on-off control valve 70 is inserted in the pipe 68. An air introduction tube 72 is arranged on the gas supply nozzle part 62 to communicate with the annular hole 64, so that an air supply pipe 74 channel-connected to a compressed air source (not shown) is communicatively connected to the air introduction tube 72. Another on-off control valve 76 is inserted in the pipe 74.

When the on-off control valve 68 is opened to supply the cleaning solution (the mixed solution of ammonia water, hydrogen peroxide water and deionized water) from the supply source therefor to the liquid supply nozzle part 58 through the pipe 68 in the bi-fluid nozzle 48 having the aforementioned structure, the liquid supply nozzle part 58 straightly discharges the cleaning solution downward from the discharge port provided on its lower end. When the on-off control valve 76 is opened to feed compressed air from the compressed air source to the air introduction tube 72 through the pipe 74, on the other hand, the gas supply nozzle part 62 discharges the compressed air from the annular discharge port through the annular hole 64. The compressed air discharged from the annular discharge port of the gas supply nozzle part 62 progresses to converge on the point on the extension line of the through-hole 60 of the liquid supply nozzle part 58, thereby colliding with the cleaning solution rectilinearly progressing from the discharge port provided on the lower end of the liquid supply nozzle part 58. Thus, the cleaning solution and the compressed air are mixed with each other to form droplets 77, which in turn are injected from the injection port 66 while slightly spreading in a conical form, to be injected onto the surface of the substrate W.

As shown in FIG. 3, a supply mechanism 78 for an etchant such as hydrofluoric acid is arranged on another side portion of the wall part 36. The etchant supply mechanism 78 comprises a bi-fluid nozzle 80 having a discharge port arranged above the substrate W held on the spin base 10 to be opposed to its surface. The bi-fluid nozzle 80 is fixed to the forward end of an arm 82, which in turn is horizontally held by an arm holding part 84 in a cantilever manner. The arm holding part 84 is fixed to the upper end of a vertically arranged rotary spindle 86. The rotary spindle 86 is coupled to a nozzle moving mechanism 88, to be rotated and vertically reciprocated by this nozzle moving mechanism. The nozzle moving mechanism 88 is so driven that the bi-fluid nozzle 80 can be swung in a horizontal plane, reciprocated between the central portion and the peripheral portion of the substrate W and approached to/separated from the surface of the substrate W. The arm 82 holding the bi-fluid nozzle 80 can be rotated from a position shown by two-dot chain lines in FIG. 1 to a position shown by solid lines, to be retracted to an external position for the wall part 36. The nozzle moving mechanism 88 is not restricted to the illustrated one but can alternatively be implemented by another mechanism.

Figure 5:
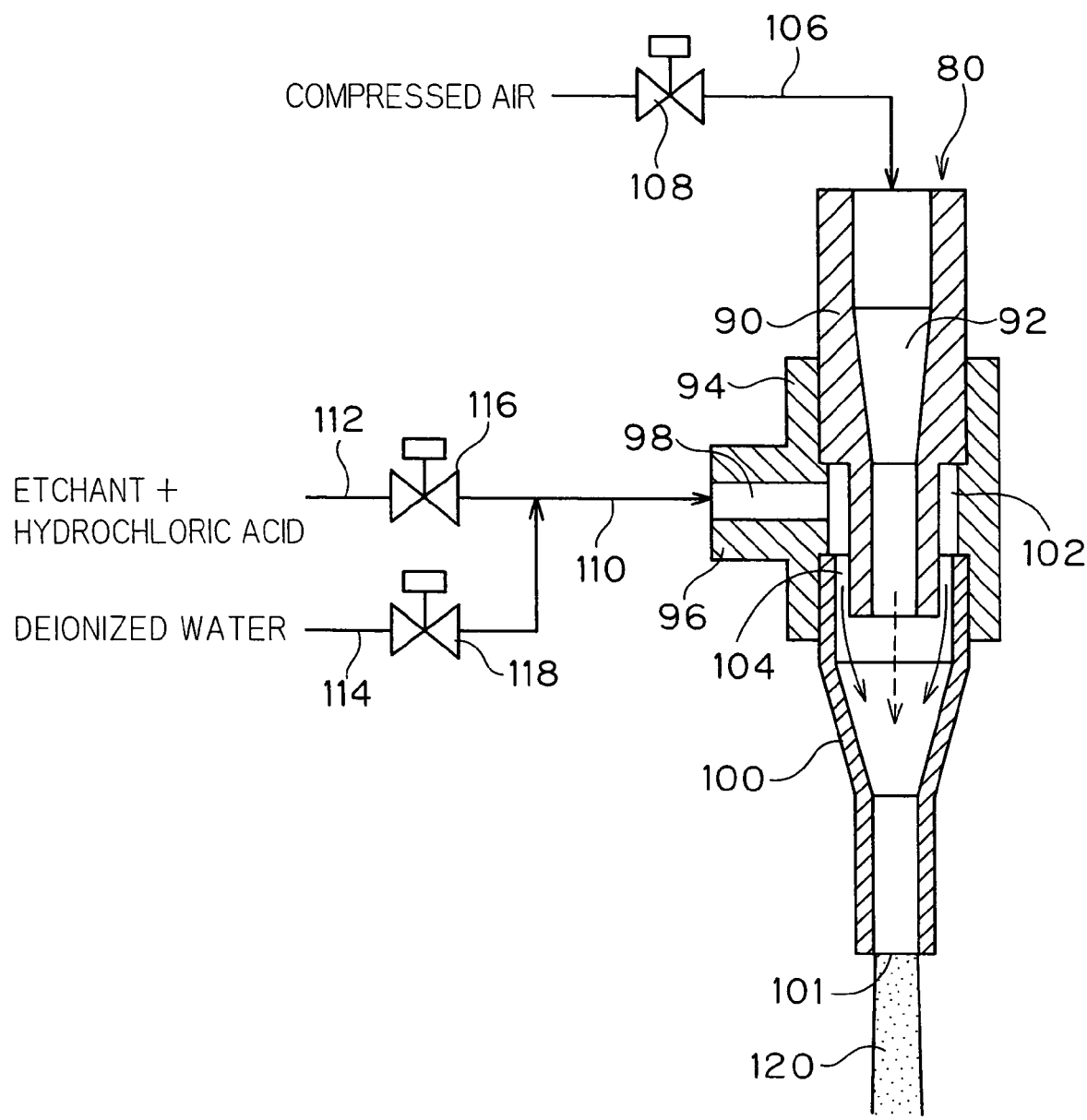
FIG. 5 is a longitudinal sectional view showing an exemplary structure of another by-fluid nozzle 80.

FIG. 5 is a longitudinal sectional view of the bi-fluid nozzle 80. As shown in FIG. 5, the bi-fluid nozzle 80 comprises an air introduction tube 90, a liquid introduction cylinder 94 and a drop forming tube 100. The air introduction tube 90 has a downwardly narrowed through-hole 92 in its axial potion. The liquid introduction cylinder 94 is a cylindrical member integrally fixed to enclose the outer periphery of the air introduction tube 90. A liquid introduction tube part 96 having a through-hole 98 in its axial portion is integrally formed on the liquid introduction cylinder 94. The droplet forming tube 100 is provided with an upper portion having a large diameter, a lower portion in the form of a straight pipe having a small diameter and a tapered intermediate portion. The upper end of the droplet forming tube 100 is engaged into and fixed to the lower portion of the liquid introduction cylinder 94, so that the lower portion of the air introduction tube 90 is inserted therein with a gap. The lower portion of the air introduction tube 90 is formed to have a small outer diameter, and an annular clearance is defined between the lower outer peripheral surface of the air introduction tube 90 and the inner peripheral surface of the liquid introduction tube 94 to form an annular passage 102 communicating with the through-hole 98 of the liquid introduction tube part 96. Further, a clearance defined between the lower outer peripheral surface of the air introduction tube 90 and the upper inner peripheral surface of the droplet forming tube 100 forms an annular discharge passage 104 channel-connected with the annular passage 102 and opening in the droplet forming tube 100. The lower end of the droplet forming tube 100 defines an injection port 101.

An air supply pipe 106 channel-connected to the compressed air source (not shown) is communicatively connected to the through-hole 92 of the air introduction tube 90. An on-off control valve 108 is inserted in the pipe 106. A liquid supply pipe 110 is communicatively connected to the through-hole 98 of the liquid introduction tube part 96 integrally formed on the liquid introduction cylinder 94, while an etchant supply pipe 112 channel-connected to a supply source (not shown) for the etchant containing hydrochloric acid and a deionized water supply pipe 114 channel-connected to a deionized water supply source (not shown) are communicatively connected to the pipe 110 respectively. On-off control valves 116 and 118 are inserted in the pipes 112 and 114 respectively.

When the on-off control valve 116 is opened (the on-off control valve 118 is closed at this time) for supplying the etchant such as hydrofluoric acid (etchant) containing hydrochloric acid, for example, from the etchant supply source to the liquid introduction tube part 96 of the liquid introduction cylinder 94 through the pipes 112 and 110 respectively in the bi-fluid nozzle 80 having the aforementioned structure, the etchant is obliquely downwardly discharged from an opening provided on the lower end of the discharge passage 104 toward the inner axial portion of the droplet forming tube 100 through the passage 102 and the discharge passage 104. When the on-off control valve 108 is opened for feeding compressed air from the compressed air source to the air introduction tube 90 through the pipe 106, on the other hand, the compressed air is straightly downwardly discharged into the droplet forming tube 100 from the discharge port provided on the lower end of the air introduction tube 90. This compressed air collides against the etchant in the droplet forming tube 100. Thus, the etchant and the compressed air are mixed with each other to form droplets 120. The droplets 120 formed in the droplet forming tube 100 are imparted with rectilinearity while passing through a small-diametrically formed straight tube portion of the droplet forming tube 100, to be straightly downwardly injected toward the surface of the substrate W from the injection port 101 provided on the lower end of the droplet forming tube 100.

The bi-fluid nozzle 48 of the supply mechanism 46 for the cleaning solution, formed by an external-mix bi-fluid nozzle as shown in FIG. 4, may alternatively be formed by an internal-mix bi-fluid nozzle as shown in FIG. 5. Further, the bi-fluid nozzle 80 of the etchant supply mechanism 78, formed by an internal-mix bi-fluid nozzle as shown in FIG. 5, may alternatively be formed by an external-mix bi-fluid nozzle shown in FIG. 4.

An exemplary method of cleaning the semiconductor substrate W with the substrate processing apparatus having the aforementioned structure is now described.

The motor 26 is driven to rotate the substrate W held on the spin base 10 in a horizontal plane. The nozzle moving mechanism 56 is driven to approach the bi-fluid nozzle 48 to the surface of the substrate W and swing the same in a horizontal plane. The bi-fluid nozzle 48 is reciprocated between the central portion and the peripheral portion of the substrate W along the surface of the substrate W held on the spin base 10, for injecting the droplets 77 of the cleaning solution (the mixed solution of ammonia water, hydrogen peroxide water and deionized water) from the bi-fluid nozzle 48 to the surface of the substrate W. The mixing ratios of ammonia water (29% solution), hydrogen peroxide water (30% solution) and deionized water are set to 1:1:50 to 100, for example. The concentrations of ammonia water (29% solution) and hydrogen peroxide water (30% solution), exhibiting cleaning effects regardless of the concentrations as compared with the aforementioned ratios, are set in the ranges of 0.04 to 1 with respect to the concentration 5 of deionized water respectively. The processing may be performed at the ordinary temperature with no temperature control. The cleaning solution of deionized water etc. is also injected from the discharge port provided on the upper end of the nozzle 34 toward the central portion of the lower surface of the substrate W held on the spin base 10 at the same time. The deionized water etc. is also thereafter discharged toward the central portion of the lower surface of the substrate W if necessary.

The droplets 77 of the cleaning solution are injected toward the surface of the substrate W, for physically removing particles adhering to the surface of the substrate W due to the kinetic energy of the droplets 77 colliding against this surface. The particles separated from the surface of the substrate W are chemically prevented from re-adhesion by intergranular electrostatic repulsion caused by zeta potentials due to the employment of the alkaline cleaning solution. Thus, the particles are effectively removed from the surface of the substrate W in a short time. The cleaning solution is injected to the surface of the substrate W in the state of the droplets 77, so that no excess impact force is applied to the substrate W. Also when the substrate W is a semiconductor wafer having a pattern formed on its surface, therefore, the pattern is not damaged.

Then, the bi-fluid nozzle 48 is separated from the surface of the substrate W and retracted to the external position for the cylindrical wall part 36 as shown by the two-dot chain lines in FIG. 1, and the nozzle moving mechanism 78 is thereafter driven for moving the bi-fluid nozzle 80 from the retracted position shown by solid lines in FIG. 1 to the position located above the substrate W shown by two-dot chain lines. Thereafter the bi-fluid nozzle 80 is approached to the surface of the substrate W and swung in the horizontal plane. The bi-fluid nozzle 80 is reciprocated between the central portion and the peripheral portion of the substrate W along the surface of the substrate W held on the rotated spin base 10, for discharging deionized water from the bi-fluid nozzle 80 to the surface of the substrate W. This rinsing with deionized water may be performed for about 10 seconds, for example. At this time, compressed air may be fed to the air introduction tube 90 of the bi-fluid nozzle 80 for injecting droplets of deionized water from the bi-fluid nozzle 80 to the surface of the substrate W, or feeding of compressed air to the air introduction tube 90 of the bi-fluid nozzle 80 may be stopped for discharging deionized water from the bi-fluid nozzle 80 to the surface of the substrate W. Alternatively, a discharge nozzle dedicated to deionized water may be set independently of the bi-fluid nozzle 80, for discharging deionized water from this discharge nozzle to the surface of the substrate W.

When intermediate rinsing with deionized water is terminated, the bi-fluid nozzle 80 is reciprocated between the central portion and the peripheral portion of the substrate W along the surface of the substrate W held on the rotated spin base 10 for injecting the droplets of the etchant (the mixed solution of hydrofluoric acid, hydrochloric acid and deionized water) from the bi-fluid nozzle 80 to the surface of the substrate W. The mixing ratios (volume ratios) of hydrofluoric acid HF (50% solution), hydrochloric acid HCl (35% solution) and deionized water are set to 1:40:200, for example. The ratio of hydrofluoric acid HF (50% solution) to hydrochloric acid HCl (35% solution) and deionized water is preferably set in the range of 1:100 to 1000, most preferably 1:200. The ratio of hydrochloric acid HCl (35% solution) to deionized water is preferably set in the range of 1:3 to 25, most preferably 1:5. The processing may be performed at the ordinary temperature with no temperature control.

The droplets of the etchant are injected toward the surface of the substrate W, for removing metal contaminants adhering to the surface of the substrate W and particles remaining thereon due to the kinetic energy of the droplets colliding against this surface. Thus, the usages of chemical solutions can be reduced. Further, the metal contaminants containing noble metals are chemically dissolved and removed from the surface of the substrate W. Most of the particles have been removed by the cleaning solution, and hence the quantity of etching may not be increased for removing the particles.

The alkaline cleaning solution is previously supplied to the surface of the substrate W, thereby altering metal contaminants other than the noble metals adhering to the surface of the substrate W mainly to hydroxides and capturing the same on a layer provided on the surface of the substrate W (a layer of a natural oxide film formed on the outermost surface if the substrate W is a silicon wafer). The acid etchant is supplied thereto for rapidly eluting the metal contaminants as cations. Thus, the metal contaminants can be removed without excessively etching the substrate W.

The metal contaminants can be sufficiently removed due to this processing with a small quantity of etching of the substrate W. Particularly in a cleaning step of a future semiconductor device manufacturing process, it is necessary to apply minimum etching damage to a substrate. Therefore, etching conditions must be properly decided by adjusting the processing time with the concentrations of the chemical solutions or the like, in order to terminate a series of cleaning processing with a quantity of etching of within 5 Å, preferably not more than 2 Å.

When the cleaning with the etchant is terminated, the bi-fluid nozzle 80 is reciprocated between the central portion and the peripheral portion of the substrate W along the surface of the substrate W held on the rotated spin base 10 for re-discharging deionized water from the bi-fluid nozzle 80 to the surface of the substrate W and finally rinsing the substrate W. Thereafter the substrate W is spin-dried by high-speed rotation.

The intermediate rinsing with deionized water may be omitted for cleaning the substrate W by injecting the droplets 77 of the cleaning solution from the bi-fluid nozzle 48 and thereafter cleaning the substrate W by injecting the droplets of the etchant from the bi-fluid nozzle 80. Alternatively, cleaning by injection of the droplets 77 of the cleaning solution and cleaning by injection of the droplets of the etchant may be repeated a plurality of times as cleaning by injecting the droplets 77 of the cleaning solution→(intermediate rinsing with deionized water→) cleaning by injecting the droplets of the etchant→(intermediate rinsing with deionized water→) cleaning by injecting the droplets 77 of the cleaning solution→(intermediate rinsing with deionized water→) cleaning by injecting the droplets of the etchant ... →final rinsing with deionized water →spin drying.

While removability for particles and metal contaminants can be most increased by combining injection of droplets of ammonia water (alkaline solution) containing hydrogen peroxide water (oxidant) and injection of droplets of hydrofluoric acid (etchant) containing hydrochloric acid as in the aforementioned substrate processing method, the present invention is not restricted to this combination of injection of droplets of chemical solutions. For example, only ammonia water containing no hydrogen peroxide water may be solely used as the cleaning solution. In this case, the ratio of ammonia water (29%) to deionized water of 5 is preferably set in the range of 0.02 to 0.6.

When processed solely with ammonia water (alkaline solution), the surface of the substrate W is disadvantageously roughened. In this case, therefore, a slightly dilute aqueous solution is preferably employed. If roughening of the surface of the substrate W is further disadvantageous, e.g., when the substrate W is a semiconductor wafer having a bear silicon surface not covered with a natural oxide film but exposed before cleaning, it is desirable not to solely use ammonia water (alkaline solution) as a cleaning solution but to add an oxidant such as hydrogen peroxide or a surface active agent.

Ammonia water may be replaced with another alkaline solution such as an aqueous solution of amines such as a TMAH aqueous solution, for example. Further, a solution prepared by adding a TMAH aqueous solution to ammonia water can also be used as the alkaline solution. While it is impossible to increase the pH value of single ammonia water beyond 12 also when its concentration is increased, the pH value of an alkaline solution prepared by adding a TMAH aqueous solution to ammonia water can be increased beyond 12. As described later, removability for metal contaminants can be further improved in particular by setting the pH value of the alkaline solution preferably to at least 11, more preferably to at least 12. The pH value of the alkaline solution may be adjusted by using organic or inorganic alkali other than TMAH.

Further, hydrofluoric acid (etchant) containing hydrochloric acid may be replaced with only hydrofluoric acid (etchant) or only hydrochloric acid. When solely employed, the ratio of hydrochloric acid HCl (35% solution) to deionized water is preferably set in the range of 1:3 to 15. If the concentration of hydrochloric acid is below this range, removability for metal contaminants may be reduced or the processing time must be increased. The etchant may be prepared from a substance other than hydrofluoric acid. Further, hydrochloric acid may be replaced with another acid solution of citric acid, oxalic acid or the like, for example.

When the substrate W is a silicon wafer, for example, injection of droplets of an alkaline solution containing an oxidant and injection of droplets of hydrochloric acid or an etchant having an extremely low concentration may be combined with each other in order to remove particles and metal contaminants from the surface of the substrate W while most suppressing etching on the surface of the silicon wafer or an underlayer of a silicon oxide film.

Figure 6:
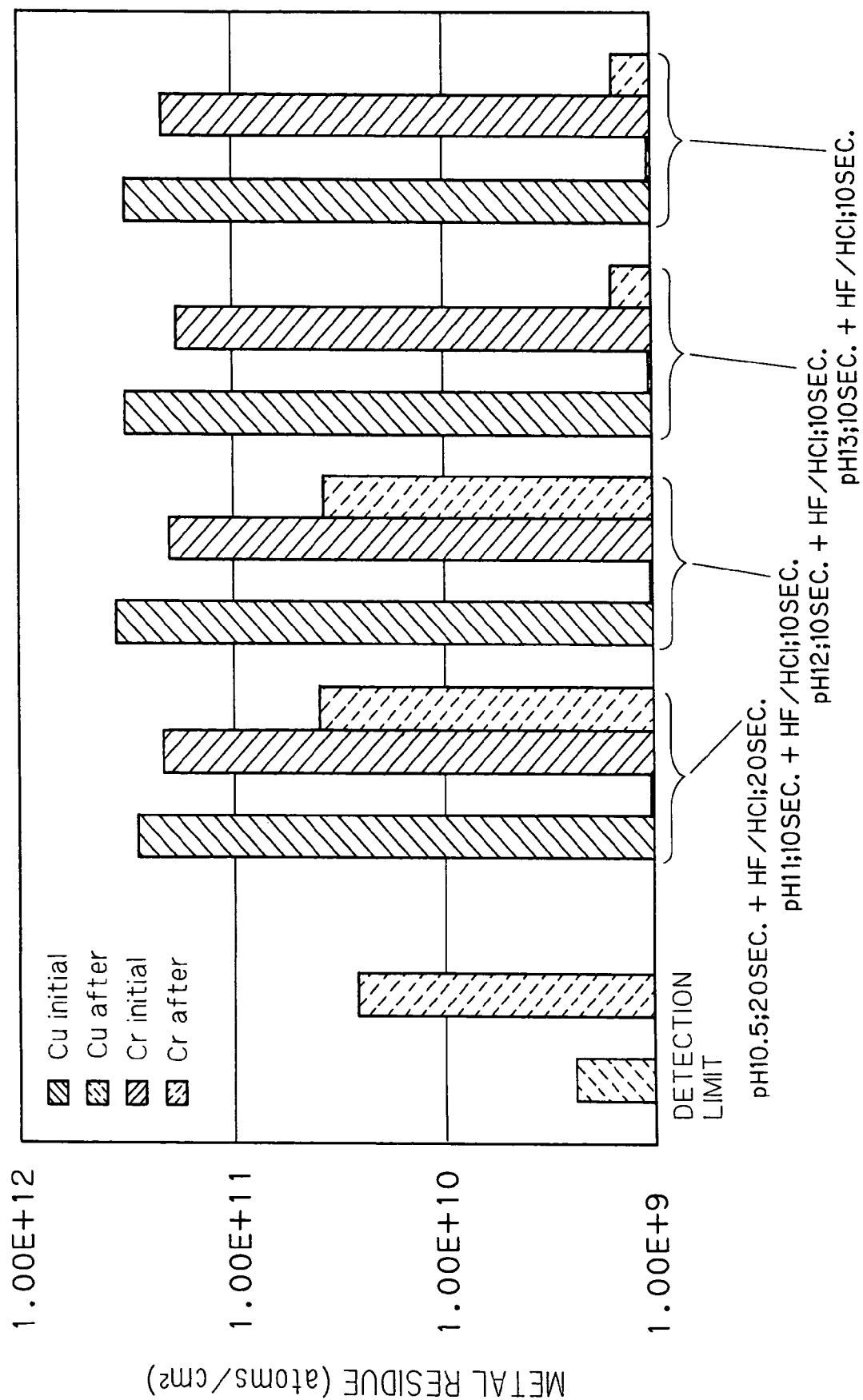
FIGS. 6 and 7 illustrate results of removability for metal contaminants evaluated in relation to a substrate processing method according to the first embodiment.

FIG. 6 illustrates results of an experiment for comparing removability for metal contaminants in cleaning processing performed by injecting droplets of cleaning solutions ($NH_4OH+H_2O_2$+deionized water) and subsequent cleaning processing by injecting droplets of etchants (HF+HCl) with various pH values of the cleaning solutions. Referring to FIG.

6, the vertical axis shows the residues (atoms/cm$^2$) of metal contaminants. The used cleaning solutions contained NH$_4$OH (29% aqueous solution), H$_2$O$_2$ (30% aqueous solution) and deionized water in composition ratios of 1:1:100, and the etchants contained HF (50% aqueous solution), HCl (35% aqueous solution) and deionized water in composition ratios of 1:40:200. The bi-fluid nozzles 48 and 80 had discharge flow rates of 100 cc/min., injection times of 20 or 10 seconds for droplets of the cleaning solutions and injection times of 20 or 10 seconds for droplets of the etchants. No TMAH aqueous solution was added to the cleaning solution of pH 10.5 and a TMAH aqueous solution (25% solution) was added to the cleaning solution (NH$_4$OH:H$_2$O$_2$:deionized water) in the ratio (volume ratio) of 1:(1:1:100) in the cleaning solution of pH 11, while a TMAH aqueous solution was added to the cleaning solution (NH$_4$OH:H$_2$O$_2$:deionized water) in the ratio of 3:(1:1:100) in the cleaning solution of pH 12 and a TMAH aqueous solution was added to the cleaning solution (NH$_4$OH:H$_2$O$_2$:deionized water) in the ratio (volume ratio) of 7:(1:1:100) in the cleaning solution of pH 13, for preparing the respective cleaning solutions. A total reflection X-ray fluorescence analyzer was employed for detection.

As understood from the results shown in FIG. 6, it was possible to remove copper (Cu) to not more than the detection limit in any processing. While it was possible to remove chromium (Cr) with the cleaning solution of pH 10.5, the residue was not reduced below the detection limit also when the droplets of the cleaning solution and those of the etchant were injected for 20 seconds respectively. In the processing with the cleaning solution of pH 11, the residue was not reduced below the detection limit when the droplets of the cleaning solution and those of the etchant were injected for 10 seconds. In the processing with the cleaning solution of at least pH 12, on the other hand, it was possible to remove chromium below the detection limit by simply injecting the droplets of the cleaning solution and those of the etchant for 10 seconds respectively.

Figure 7:
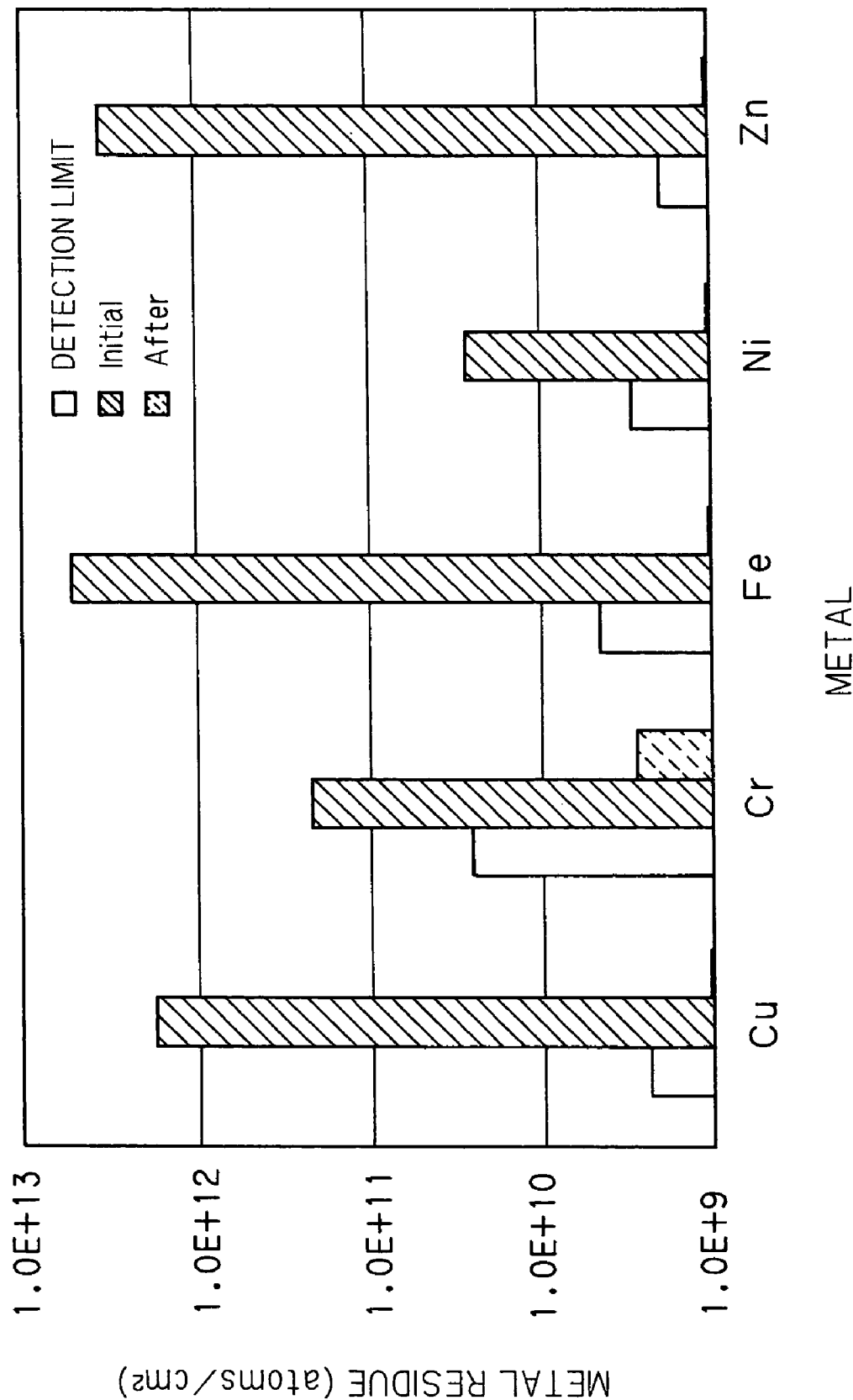

FIG. 7 illustrates results of evaluation of removability for metal contaminants other than Cu and Cr. Cleaning solutions and etchants had compositions identical to those in the experiment shown in FIG. 6, and the cleaning solutions had pH 12. The bi-fluid nozzles 48 and 80 exhibited discharge flow rates of 100 cc/min. and injection times of 10 seconds for droplets of the cleaning solutions and the etchants. It was possible to remove all metal contaminants below the detection limit of the total reflection X-ray fluorescence analyzer.

This substrate processing method exhibiting excellent results in a wide conditional range in view of removability for particles is also capable of removing metal contaminants, while there is an optimum conditional range in view of removability for metal contaminants as hereinabove described.

An exemplary method of cleaning the substrate W with a substrate processing apparatus (refer to FIG. 3) comprising no supply mechanism 46 for the cleaning solution dissimilarly to the apparatus shown in FIG. 1 is now described.

As hereinabove described, the substrate W held on the spin base 10 is rotated in a horizontal plane and the bi-fluid nozzle 80 is swung in a horizontal plane in a state approached to the surface of the substrate W. The bi-fluid nozzle 80 is reciprocated between the central portion and the peripheral portion of the substrate W along the surface of the substrate W held on the rotated spin base 10 for injecting the droplets of the etchant (the mixed solution of hydrofluoric acid, hydrochloric acid and deionized water) to the surface of the substrate W. The ratios (volume ratios) of hydrofluoric acid HF (50% solution), hydrochloric acid HCl (35% solution) and deionized water are set to 1:25 to 40:200, for example. The ratio of hydrofluoric acid HF to hydrochloric acid HCl and deionized water is preferably set in the range of 1:50 to 500. The ratio of hydrochloric acid HCl to deionized water is preferably set in the range of 1:5 to 75. The processing may be performed at the ordinary temperature with no temperature control. The cleaning solution of deionized water etc. is also injected from the discharge port provided on the upper end of the nozzle 34 toward the central portion of the lower surface of the substrate W held on the spin base 10 at the same time. The deionized water etc. is also thereafter discharged toward the central portion of the lower surface of the substrate W if necessary.

When cleaning with the etchant is terminated, the bi-fluid nozzle 80 is reciprocated between the central portion and the peripheral portion of the substrate W along the surface of the substrate W held on the rotated spin base 10 for discharging deionized water from the bi-fluid nozzle 80 to the surface of the substrate W. At this time, feeding of compressed air to the air introduction tube 90 of the bi-fluid nozzle 80 is stopped. Alternatively, a discharge nozzle dedicated to deionized water may be set independently of the bi-fluid nozzle 80, for discharging deionized water from this discharge nozzle to the surface of the substrate W. When rinsing is terminated, the substrate W is spin-dried by high-speed rotation.

This substrate processing method is preferable when the substrate W is a semiconductor wafer already formed with a natural oxide film on its surface, for example. The oxide film formed on the surface of the substrate W is selectively etched with the etchant so that metal contaminants adhering to the surface of the substrate W are removed from this surface along with the oxide film while the layer disappears from the surface of the substrate W, whereby it follows that particles are also completely removed (lifted off). In this method, however, etching must not be performed to expose a bear silicon surface when the surface of the substrate W is cleaned, for example.

The etchant may be prepared from only that containing no hydrochloric acid. Further, the etchant may be prepared from a substance other than hydrofluoric acid. In addition, hydrochloric acid may be replaced with another acid solution of citric acid, oxalic acid or the like, for example.

Figure 8:
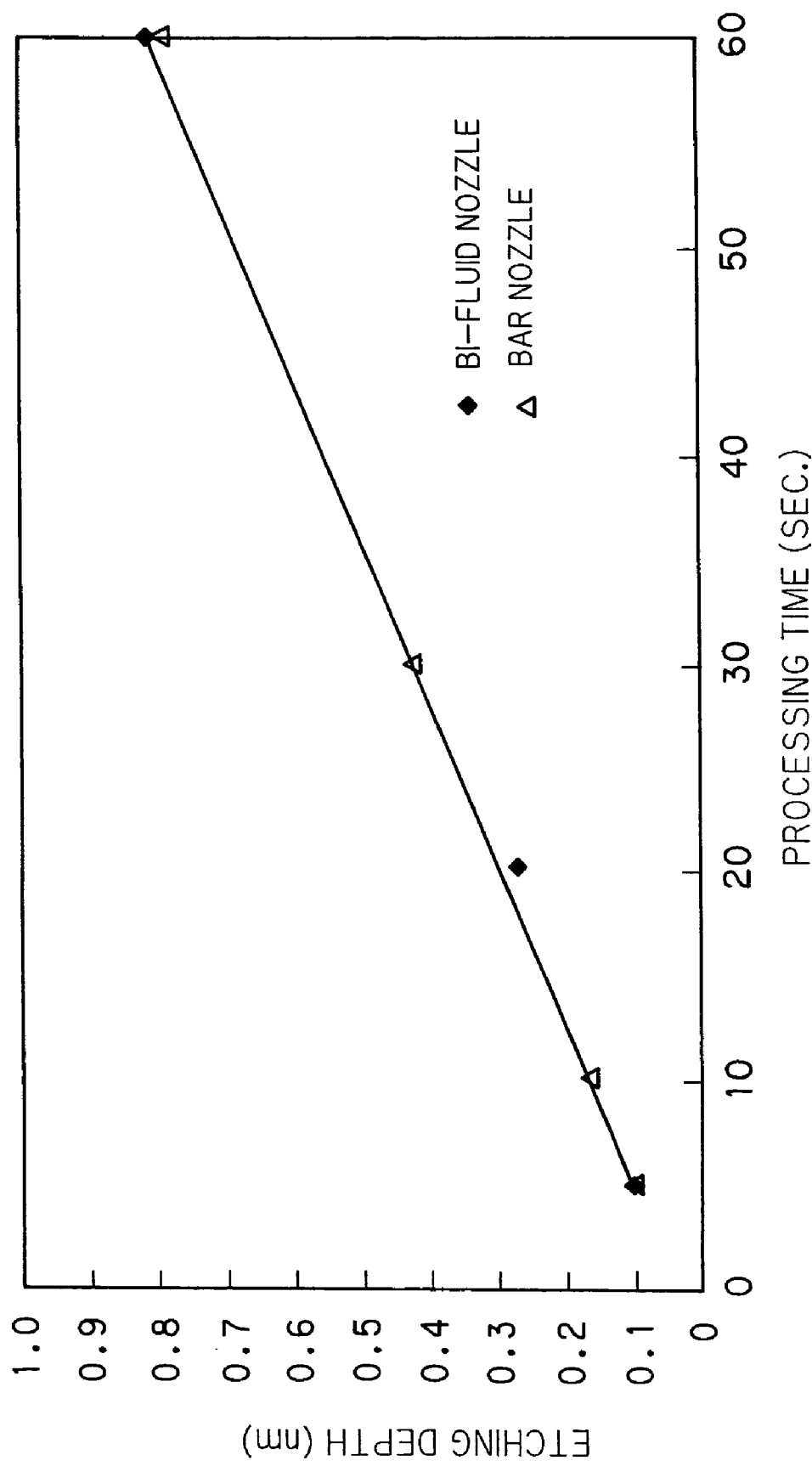
FIG. 8 illustrates results of etching properties evaluated in relation to the substrate processing method according to the first embodiment.

FIG. 8 illustrates comparative results of etching properties in a case of processing the substrate W by injecting the droplets of the etchant (the mixed solution of hydrofluoric acid, hydrochloric acid and deionized water) from the bi-fluid nozzle 80 to the surface of the substrate W and a case of processing the substrate W by injecting an etchant from a conventional bar nozzle to the surface of the substrate W. Referring to FIG. 8, the horizontal axis shows the processing time, and the vertical axis shows the etching depth (nm). The substrate W (silicon wafer) employed for this experiment had a diameter of 8 inches with a thermal oxide film formed on its surface. Each of the used etchants contained hydrofluoric acid HF (50% aqueous solution), hydrochloric acid HCl (35% aqueous solution) and deionized water in composition ratios of 1:41:207. The bi-fluid nozzle 80 and the bar nozzle had etchant discharge flow rates of 100 cc/min. and 1500 cc/min. respectively. As understood from the results shown in FIG. 8, it was possible to attain etching properties equivalent to those in the case of using the conventional bar nozzle with a quantity of the etchant of about 1/15 of that in the case of using the conventional bar nozzle by using the bi-fluid nozzle 80. Under these conditions, excellent results were obtained when the discharge flow rate for the etchant from the bi-fluid nozzle 80 was in the range of 50 cc/min. to 130 cc/min.

Figure 9:
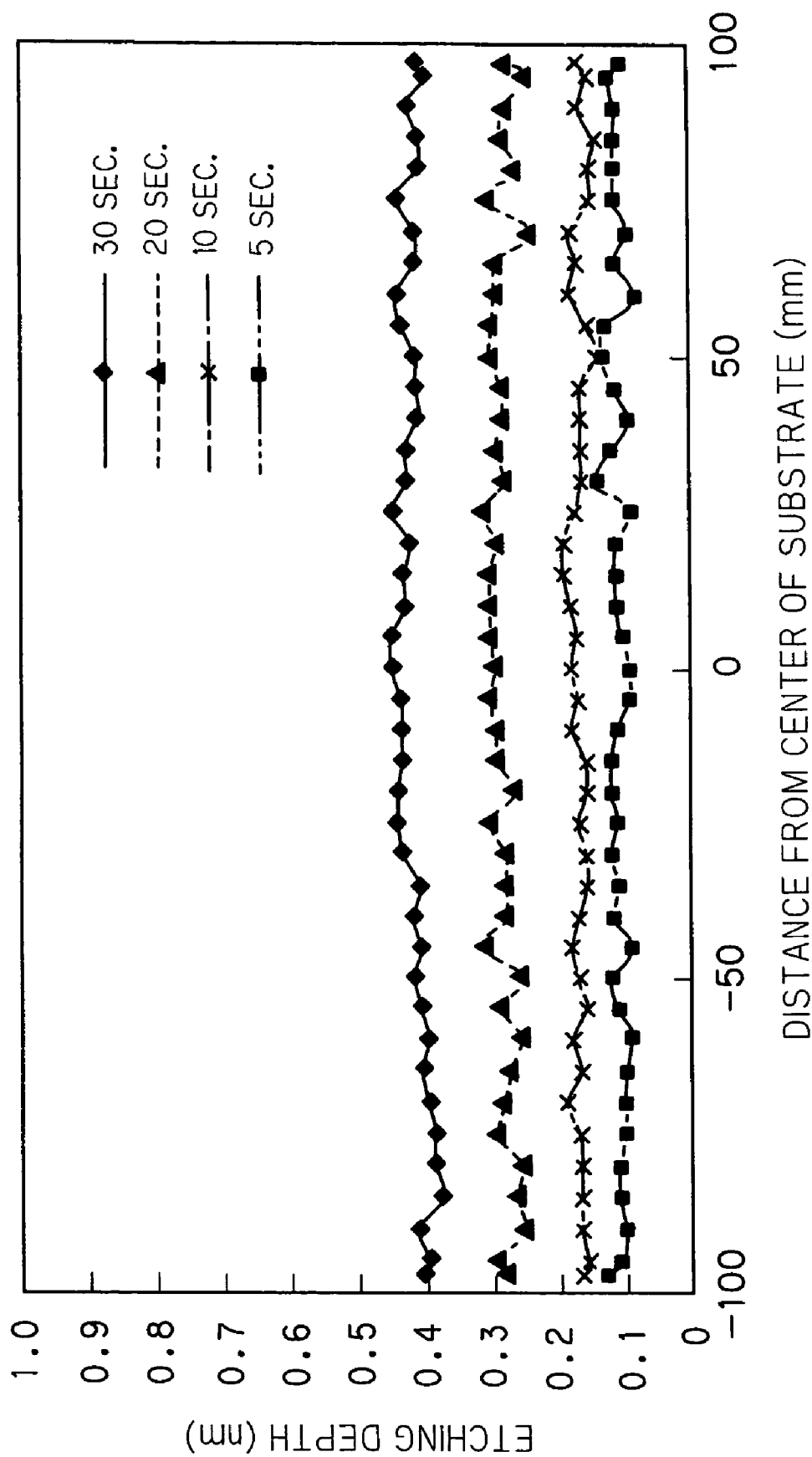
FIG. 9 illustrates results of in-plane uniformity of substrate cleaning evaluated in relation to the substrate processing method according to the first embodiment.

FIG. 9 illustrates results of evaluation of in-plane uniformity of etching in cases of processing substrates W by injecting droplets of etchants (mixed solutions of hydrofluoric acid, hydrochloric acid and deionized water) from bi-fluid nozzles 80 to the surfaces of the substrates W. Referring to FIG. 9, the horizontal axis shows the distances from the centers of the substrates W, and the vertical axis shows etching depths (nm). The substrates W (circular silicon wafers) employed for this experiment had diameters of 8 inches with thermal oxide films formed on the surfaces thereof. The etchants contained hydrofluoric acid HF (50% aqueous solution), hydrochloric acid HCl (35% aqueous solution) and deionized water in composition ratios of 1:40:200. The bi-fluid nozzles 80 had etchant discharge flow rates of 100 cc/min. As understood from the results shown in FIG. 9, etching uniformity in the planes of the substrates W were not influenced also when the bi-fluid nozzles 80 were used but it was possible to attain excellent in-plane uniformity of etching also when the quantities of etching were small.

<2. Second Embodiment>

Figure 10:
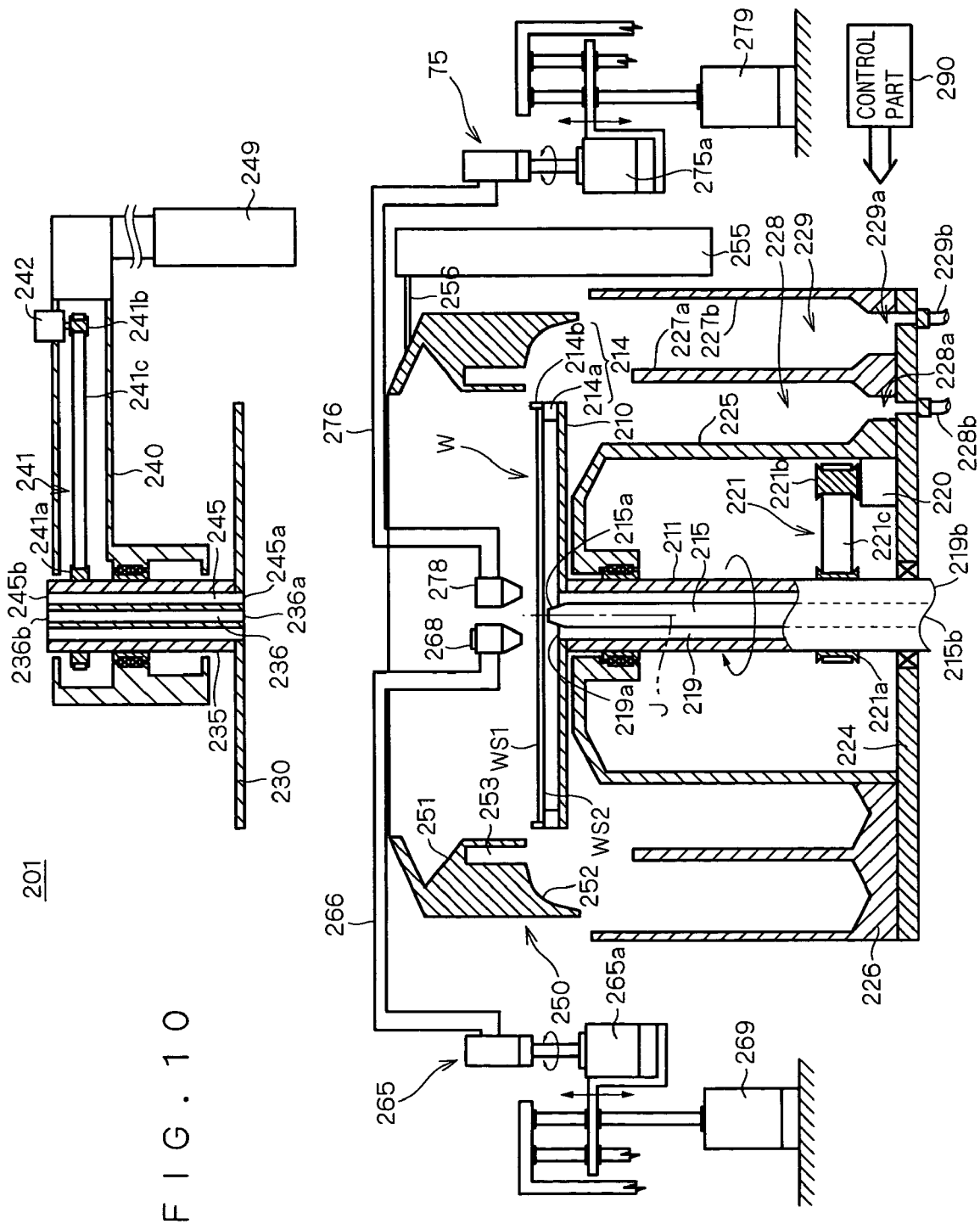
FIG. 10 is a longitudinal sectional view showing the structure of a substrate processing apparatus 201 according to a second embodiment of the present invention.

A second embodiment of the present invention is now described with reference to FIGS. 10 to 22. FIG. 10 is a longitudinal sectional view showing the structure of a substrate processing apparatus 201 according to this embodiment. This substrate processing apparatus 201 is a single-substrate type apparatus cleaning a substrate W which is a semiconductor wafer (more specifically, a silicon wafer). The substrate processing apparatus 201 mainly comprises a spin base 210 holding and rotating the substrate W, an alkaline solution nozzle 268 supplying an alkaline solution imparted with megasonic vibrations to the substrate W held on the spin base 210, an acid solution nozzle 278 supplying an acid solution to the substrate W held on the spin base 210, a deionized water nozzle 236 supplying deionized water to the substrate W held on the spin base 210, a receiving member 226 constituting a discharge tank or the like disposing or recovering used processing solutions (the alkaline solution, the acid solution, deionized water etc.), a splash guard 250 for receiving the processing solutions drained from the substrate W held and rotated on the spin base 210 and a control part 290 controlling operations of the overall apparatus 201.

Figure 11:
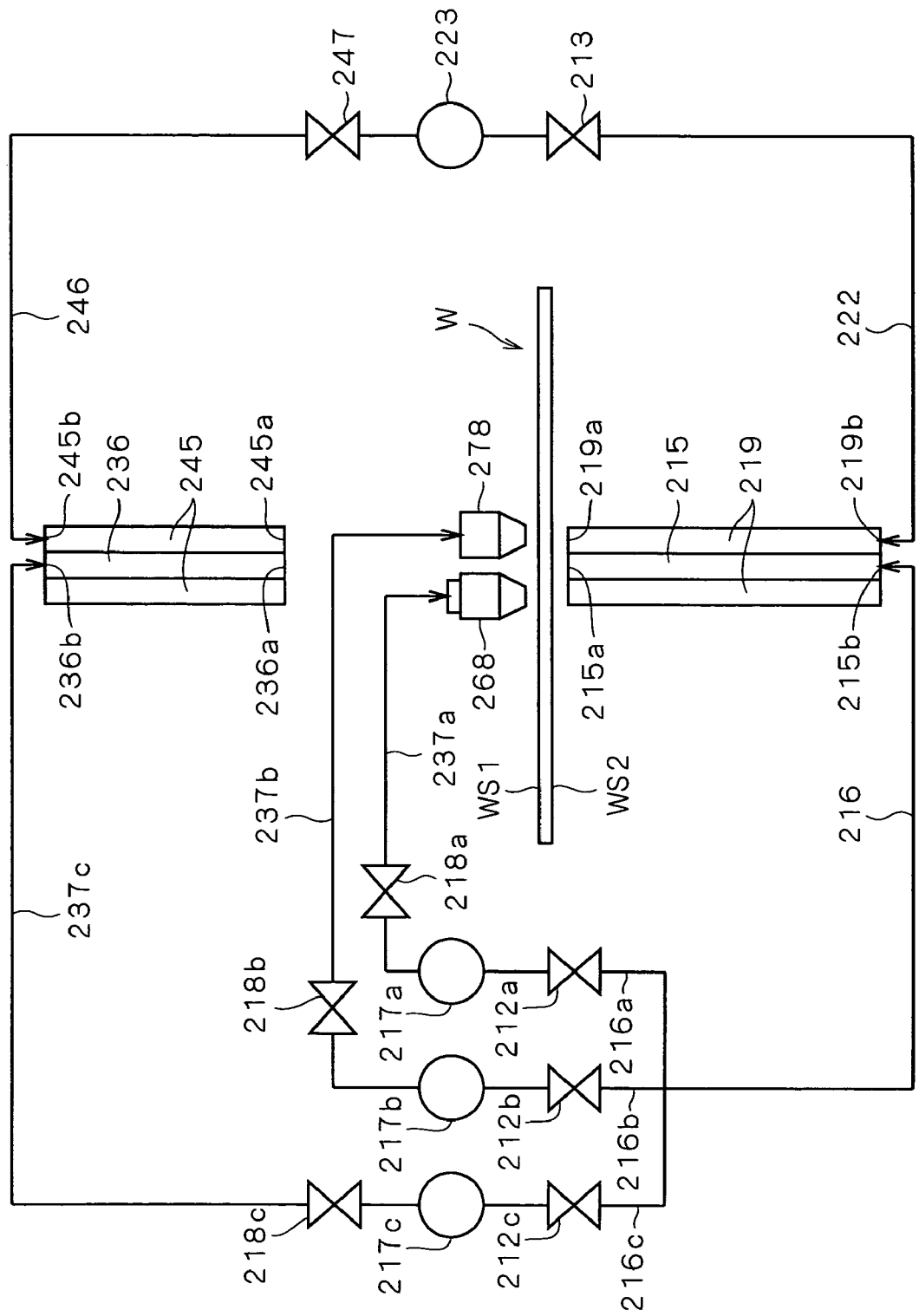
FIG. 11 illustrates the structures of pipes etc. appendant to the substrate processing apparatus 201.

FIG. 11 is a model diagram showing the structures of pipes etc. appendant to the substrate processing apparatus 201. The structure of the substrate processing apparatus 201 is now described with reference to FIGS. 10 and 11.

The structure around the spin base 210 is described first.

The spin base 210 is a discoidal member having an opening in its central portion, and a plurality of chuck pins 214 for grasping the peripheral edge of the circular substrate W are uprightly provided on its upper surface. At least three (e.g., six) chuck pins 214 may be provided for reliably holding the circular substrate W, to be arranged at equiangular intervals (e.g., 60° intervals) along the peripheral edge of the spin base 210. Each of the chuck pins 214 comprises a substrate support part 214a supporting the peripheral edge of the substrate W from below and a substrate holding part 214b pressing the outer peripheral end surface of the substrate W supported by the substrate support part 214a for holding the substrate W. Each chuck pin 214 is switchable between a pressing state where the substrate holding part 214b presses the outer peripheral end surface of the substrate W and a releasing state where the former is separated from the latter. The plurality of chuck pins 214 can be switched between the pressing states and the releasing states by any of various known mechanisms.

The plurality of chuck pins 214 are brought into the releasing states in order to transfer the substrate W to the spin base 210, and brought into the pressing states in order to process the substrate W. In the pressing states, the plurality of chuck pins 214 can grasp the peripheral edge of the substrate W for substantially horizontally holding the substrate W at a prescribed interval from the spin base 210. The chuck pins 214 hold the substrate W while directing the front surface (formed with an electronic circuit pattern) WS1 and the back surface WS2 thereof upward and downward respectively.

A rotary shaft 211 is suspended from the lower surface of the central portion of the spin base 210. The rotary shaft 211 is a hollow cylindrical member having an inner hollow portion receiving a nozzle 215 supplying the processing solutions to the back surface WS2. An electric motor 220 is interlocked/coupled to a portion around the lower end of the rotary shaft 211 through a belt driving mechanism 221. In other words, a belt 221c is extended between a driven pulley 221a fixed to the outer periphery of the rotary shaft 211 and a driving pulley 221b coupled to the axis of rotation of the electric motor 220. The electric motor 220 is so driven that its driving force can be transmitted to the rotary shaft 211 through the belt driving mechanism 221 for rotating the substrate W held on the chuck pin 214 along a vertical rotation axis J in a horizontal plane along with the rotary shaft 211 and the spin base 210.

A lidded cylindrical casing 225 provided on a base member 224 stores the rotary shaft 211, the belt driving mechanism 221, the electric motor 220 etc.

The nozzle 215 passes through the rotary shaft 211, so that its forward end portion 215a is located immediately under the central portion of the substrate W held on the spin base 210. A base end portion 215b of the nozzle 215 is communicatively connected to a processing solution pipe 216 shown in FIG. 11. The base end portion of the pipe 216 is branched into three branch pipes 216a, 216b and 216c communicatively connected with supply sources 217a, 217b and 217c for an alkaline processing solution, an acid processing solution and deionized water respectively. The branch pipes 216a, 216b and 216c are provided with valves 212a, 212b and 212c, which in turn are so on-off controlled that the alkaline solution (dilute ammonia water in this case), the acid solution (dilute hydrochloric acid in this case) or deionized water can be selectively switched, discharged and supplied from the forward end portion 215a of the nozzle 215 to a portion around the central portion of the back surface WS2 of the substrate W held on the spin base 210. In other words, dilute ammonia water, dilute hydrochloric acid or deionized water can be supplied from the nozzle 215 by closing the valves 212b and 212c and opening the valve 212a, closing the valves 212a an 212c and opening the valve 212b or closing the valves 212a and 212b and opening the valve 212c.

A clearance defined between the inner wall of the hollow portion of the rotary shaft 211 and the outer wall of the nozzle 215 forms a gas supply passage 219. This gas supply passage 219 has a forward end portion 219a in the form of an annular opening, which is directed to the central portion of the back surface WS2 of the substrate W held on the spin base 210. A base end portion 219b of the gas supply passage 219 is communicatively connected to a gas pipe 222. The gas pipe 222 is communicatively connected to an inert gas supply source 223, while a valve 213 is provided on an intermediate portion of the path of the gas pipe 222. Inert gas (nitrogen gas in this case) can be supplied from the forward end portion 219a of the gas supply passage 219 to the central portion of the back surface WS2 of the substrate W held on the spin base 210 by opening the valve 213.

The structure around the alkaline solution nozzle 268 is now described.

The alkaline solution nozzle 268 is arranged above the substrate W held on the spin base 210, to be capable of supplying dilute ammonia water to the front surface WS1 of the substrate W. The nozzle 268 is coupled to a nozzle moving mechanism 265 through a convexly bent link member 266. The nozzle moving mechanism 265, comprising an electric motor 265a having a vertical rotation axis, can rotate the link member 266 and the nozzle 268 connected thereto about the rotation axis. Thus, the nozzle 268 can be moved between an oppositional position opposed to the front surface WS1 of the substrate W held on the spin base 210 and a retracted position retracted sideward from the oppositional position to the outside of the splash guard 250 due to rotary motion. Also on the oppositional position, the nozzle 268 can be opposed to respective portions from the central portion up to the peripheral edge of the front surface WS1 of the substrate W held on the spin base 210. Further, the nozzle moving mechanism 265 is connected to a nozzle hoisting mechanism 269, which can vertically move the nozzle 268 along with the nozzle moving mechanism 265. Thus, the nozzle 268 can be moved between the retracted position and the oppositional position while avoiding the splash guard 250.

Figure 12A:
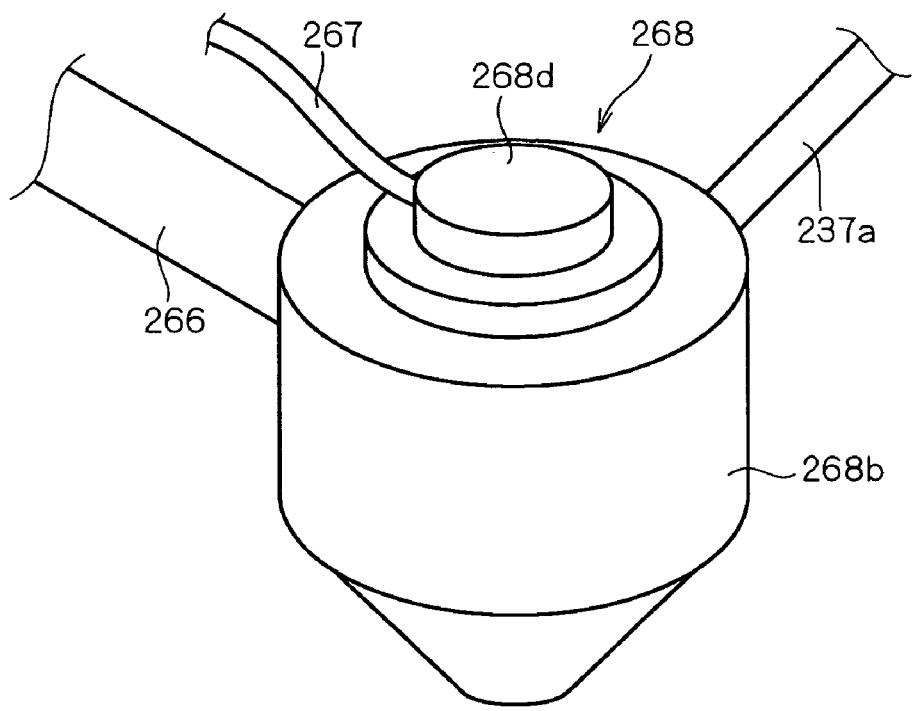
Figure 12B:
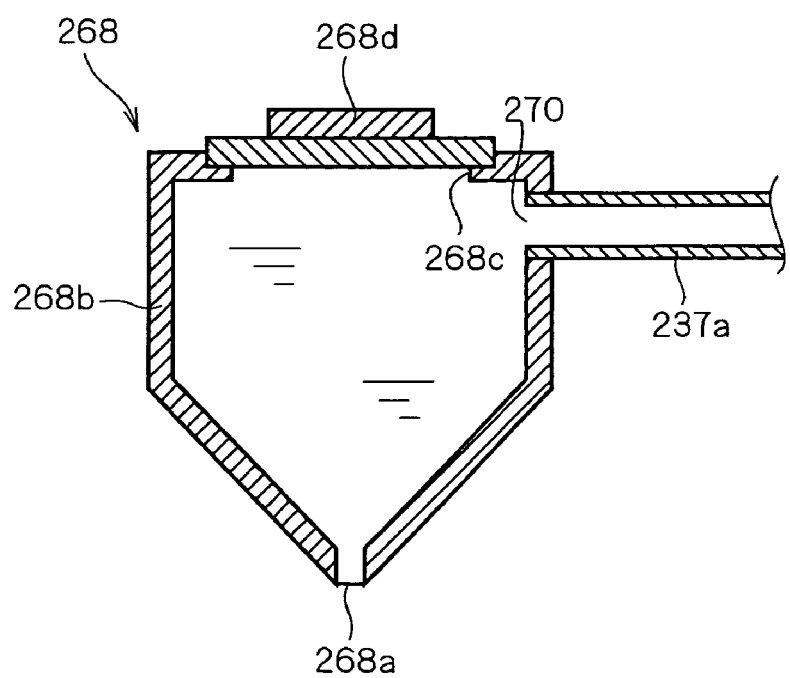

FIG. 12A is a perspective view of the alkaline solution nozzle 268, and FIG. 12B is a longitudinal sectional view of the nozzle 268 including a pipe 237a. As shown in FIGS. 12A and 12B, the nozzle 268 comprises a lidded cylindrical discharge part 268b having a V-shaped sectional shape on its lower half portion and including a discharge port 268a formed on its lower end surface and a megasonic vibrator 268d fixed to an end of a through-hole 268c formed on the upper wall surface of the discharge part 268b. The discharge part 268b is made of a material such as fluororesin having chemical resistance. A thin plate of quartz or high-purity SiC (silicon carbide) is bonded to the surface of the megasonic vibrator 268d. The megasonic vibrator 268d is electrically connected with a cable 267, which in turn is electrically connected to a high-frequency oscillator (not shown). The megasonic vibrator 268d can emit megasonic waves toward dilute ammonia water filling up the discharge part 268b for imparting megasonic vibrations to the dilute ammonia water discharged from the discharge pot 268a. The discharge part 268b is formed on its side wall surface with a liquid inlet 270, which is communicatively connected with a pipe 237a. As shown in FIG. 11, the pipe 237a is communicatively connected to the alkaline solution supply source 217a through a valve 218a. In other words, the valve 218a is so opened that dilute ammonia water can be supplied into the discharge part 268b of the nozzle 268 for discharging the dilute ammonia water imparted with megasonic vibrations by the megasonic vibrator 268d from the discharge port 268a toward the front surface WS1 of the substrate W.

The structure around the acid solution nozzle 278 is described.

The acid solution nozzle 278 is arranged above the substrate W held on the spin base 210, to be capable of supplying dilute hydrochloric acid to the front surface WS1 of the substrate W. The nozzle 278 is coupled to a nozzle moving mechanism 275 through a convexly bent link member 276. The nozzle moving mechanism 275, comprising an electric motor 275a having a vertical rotation axis, can rotate the link member 276 and the nozzle 278 connected thereto about this rotation axis. Thus, the nozzle 278 can be moved between an oppositional position opposed to the front surface WS1 of the substrate W held on the spin base 210 and a retracted position retracted sideward from the oppositional position to the outside of the splash guard 250. Also on the oppositional position, the nozzle 278 can be opposed to respective portions from the central portion up to the peripheral edge of the front surface WS1 of the substrate W held on the spin base 210. Further, the nozzle moving mechanism 275 is connected to a nozzle hoisting mechanism 279, which can vertically move the nozzle 278 along with the nozzle moving mechanism 275. Thus, the nozzle 278 can be moved between the retracted position and the oppositional position while avoiding the splash guard 250.

The nozzle 278 is communicatively connected with a pipe 237b. As shown in FIG. 11, the pipe 237b is communicatively connected to the acid solution supply source 217b through a valve 218b. In other words, the valve 218b is so opened that dilute hydrochloric acid can be discharged from the nozzle 278 toward the front surface WS1 of the substrate W.

The structure around the deionized water nozzle 236 is described.

A discoidal atmosphere blocking plate 230, an annular rotary shaft 235 vertically fixed onto the central portion of the upper surface of the atmosphere blocking plate 230 and the deionized water nozzle 236 inserted in the rotary shaft 235 are arranged above the substrate W held on the spin base 210 to be integrally vertically movable.

An opening substantially equal to the inner diameter of the rotary shaft 235 is provided in the central portion of the atmosphere blocking plate 230, while the nozzle 236 is inserted into the inner hollow portion of the rotary shaft 235. The nozzle 236 passes through the rotary shaft 235 so that its forward end portion 236a is located immediately above the central portion of the substrate W held on the spin base 210. A base end portion 236b of the nozzle 236 is communicatively connected to a deionized water pipe 237c, which is connected to the deionized water supply source 217c through a valve 218c as shown in FIG. 11. The valve 218c is so opened that deionized water can be supplied from the forward end portion 236a of the nozzle 236 toward the central portion of the front surface WS1 of the substrate W held on the chuck pin 210.

A clearance between the inner walls of the hollow portion of the rotary shaft 235 and the opening in the center of the atmosphere blocking plate 230 and the outer wall of the nozzle 236 forms a gas supply passage 245. This gas supply passage 245 has a forward end portion 245a in the form of an annular opening, which is directed to the central portion of the front surface WS1 of the substrate W held on the spin base 210. The base end portion 245b of the gas supply passage 245 is communicatively connected to a gas pipe 246. As shown in FIG. 11, the pipe 246 is communicatively connected to the inert gas supply source 223, and a valve 247 is provided on an intermediate portion of the path of the pipe 246. Nitrogen gas can be supplied from the forward end portion 245a of the gas supply passage 245 toward the central portion of the front surface WS1 of the substrate W held on the chuck pin 210 by opening the valve 247.

The rotary shaft 235 is rotatably supported by a support arm 240 through a bearing, and coupled to an electric motor 242 mounted on the support arm 240 through a belt driving mechanism 241. In other words, a belt 241c is extended between a driven pulley 241a fixed to the outer periphery of the rotary shaft 235 and a driving pulley 241b coupled to the rotation axis of the electric motor 242. The electric motor 242 is so driven that its driving force can be transmitted to the rotary shaft 235 through the belt driving mechanism 241 for rotating the rotary shaft 235 and the atmosphere blocking plate 230 about a vertical rotation axis J in a horizontal plane. The atmosphere blocking plate 230 is rotated substantially at the same rotational frequency as the substrate W. The support arm 240 stores the belt driving mechanism 241.

Further, the support arm 240 is connected to an arm hoisting mechanism 249, to be vertically movable. The hoisting mechanism 249 can be formed by a well-known mechanism such as a feed screw mechanism employing a ball screw, a mechanism employing an air cylinder or the like. The hoisting mechanism 249 can vertically move the rotary shaft 235 and the atmosphere blocking plate 230 coupled to the support arm 240 by vertically moving the support arm 240, thereby moving the atmosphere blocking plate 230 between a position approaching to the front surface WS1 of the substrate W held on the spin base 210 and a position separated and retracted upward from the substrate W. Referring to FIG. 10, the atmosphere blocking plate 230 is located on the retracted position.

The structure around the receiving member 226 is now described.

The receiving member 226 is fixedly mounted around the casing 225 provided on the base member 224. Cylindrical partition members 227a and 227b are uprightly provided on the receiving member 226. The casing 225 and the partition member 227a define side walls of a first discharge tank 228, while the partition walls 227a and 227b define side walls of a second discharge tank 229. The first discharge tank 228 is formed on its bottom with a V-groove, which is partially provided on its central portion with a discharge port 228a communicatively connected to a disposal drain 228b. Used deionized water and gas can be discharged from the discharge port 228a of the first discharge tank 228 into the disposal drain 228b, to be discarded according to prescribed procedures after gas-liquid separation. The second discharge tank 229 is also formed on its bottom with a V-groove, which is partially provided on its central portion with a discharge port 229a communicatively connected to a recovery drain 229b. Used chemical solutions can be discharged from the discharge port 229a of the second discharge tank 229 to a recovery drain 229b, to be temporarily recovered in a recovery tank (not shown) and thereafter supplied to the alkaline solution supply source 217a or the acid solution supply source 217b for recycling.

The structure around the splash guard 250 is described.

The cylindrical splash guard 250 is arranged to enclose the spin base 210 and the substrate W supported thereon. An inwardly opening groove-shaped first guide part 251 having a doglegged section is formed on the upper portion of the inner surface of the splash guard 250. An inwardly and downwardly opening second guide part 252 having a quarter-arcuate section is formed on the lower portion of the splash guard 250 while an annular groove 253 is formed in this second guide part 252. The splash guard 250 is coupled to a guard hoisting mechanism 255 through a link member 256, to be vertically movable. The hoisting mechanism 255 can be formed by a well-known mechanism such as a feed screw mechanism employing a ball screw or a mechanism employing an air cylinder.

When the hoisting mechanism 255 moves down the splash guard 250, the partition member 227a is freely engaged with the groove 253 while the first guide part 251 is positioned around the spin base 210 and the substrate W held thereon. This state is implemented for rinsing and spin drying described later, to be capable of receiving deionized water scattered from the rotated substrate W etc. by the first guide part 251, feeding the same into the first discharge tank 228 along its inclination and discharging the same from the discharge port 228a into the disposal drain 228b.

When the hoisting mechanism 225 moves up the splash guard 250, on the other hand, it follows that the partition member 227a is separated from the groove 253 and the second guide part 252 is positioned around the spin base 210 and the substrate W held on the same (the state shown in FIG. 10). This state is implemented for cleaning with the alkaline solution or the acid solution, to be capable of receiving the alkaline solution or the acid solution scattered from the rotated substrate W by the second guide part 252, feeding the same into the second discharge tank 229 along its curved surface and discharging the same from the discharge port 229 into the recovery drain 229b.

The substrate processing apparatus 201 also comprises the control part 290 in addition to the aforementioned structure, to be capable of controlling operations of the electric motors 220 and 242, the arm hoisting mechanism 249, the guard hoisting mechanism 255, the nozzle moving mechanisms 265 and 275, the nozzle hoisting mechanisms 269 and 279, the valves 212a, 212b, 212c, 213, 218a, 218b, 218c and 247 etc.

Figure 13:
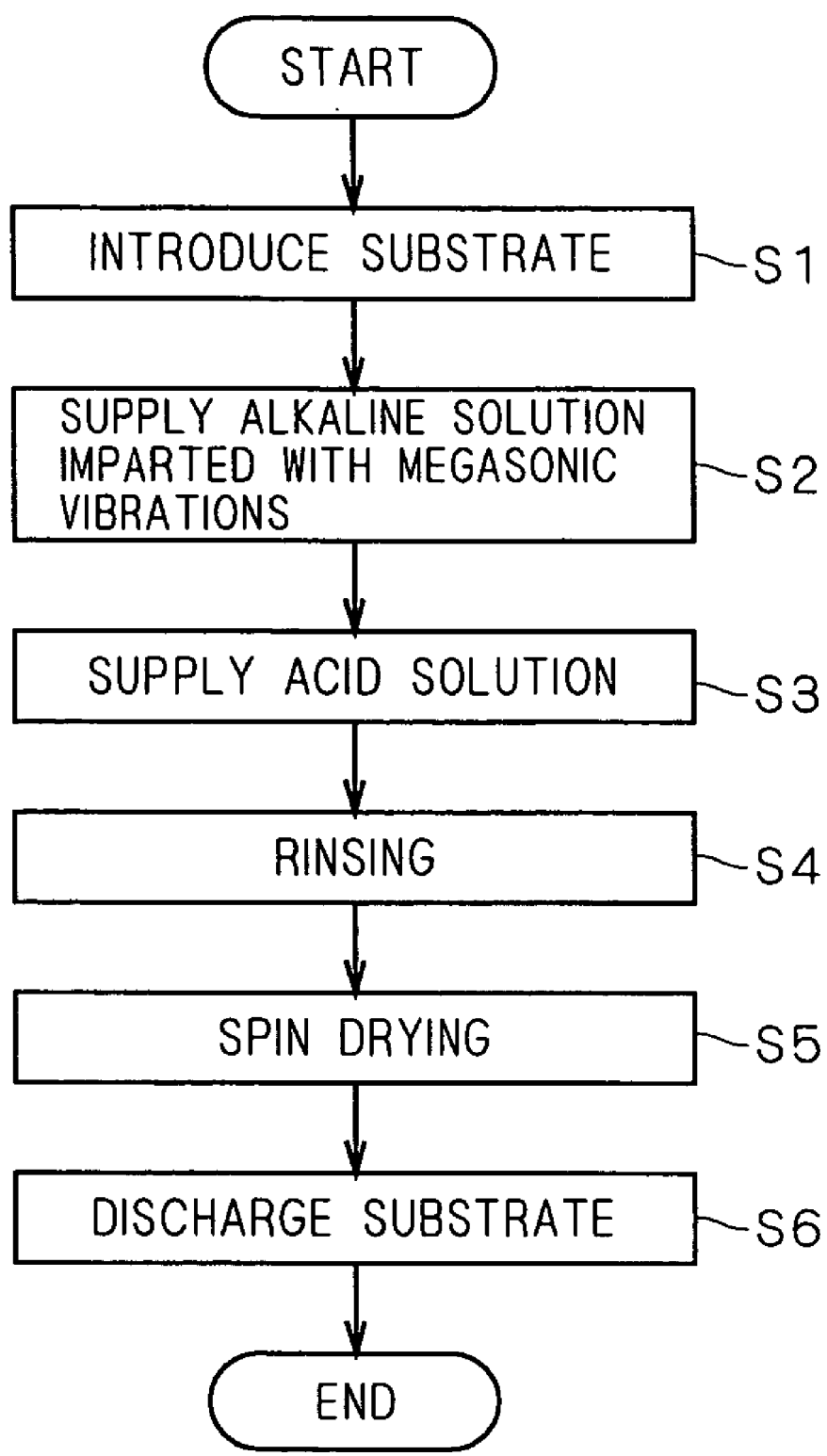
FIG. 13 is a flow chart illustrating substrate processing operations according to the second embodiment.

A procedure for cleaning the substrate W with the substrate processing apparatus 201 is now described. FIG. 13 is a flow chart showing substrate processing operations in the substrate processing apparatus 201. As shown in FIG. 13, this substrate processing apparatus 201 cleans the substrate W in order of introduction of the substrate W (step S1), supply of the alkaline solution imparted with megasonic vibrations (step S2), supply of the acid solution (step S3), rising (step S4), spin drying (step S5) and discharge of the substrate W (step S6).

At the step S1, the substrate processing apparatus 201 vertically moves the splash guard 250 with the hoisting mechanism 255, so that the upper end of the splash guard 250 is flush with or slightly lower than the spin base 210. The substrate processing apparatus 201 further moves the alkaline solution nozzle 268, the acid solution nozzle 278 and the atmosphere blocking plate 230 to the retracted positions. In this state, the substrate processing apparatus 201 introduces the uncleaned substrate W onto the spin base 210 with a transport robot (not shown), and switches the plurality of chuck pins 214 from the releasing states to the pressing states thereby grasping the peripheral edge of the substrate W. Thus, the substrate processing apparatus 201 horizontally holds the substrate W.

Figure 14A:
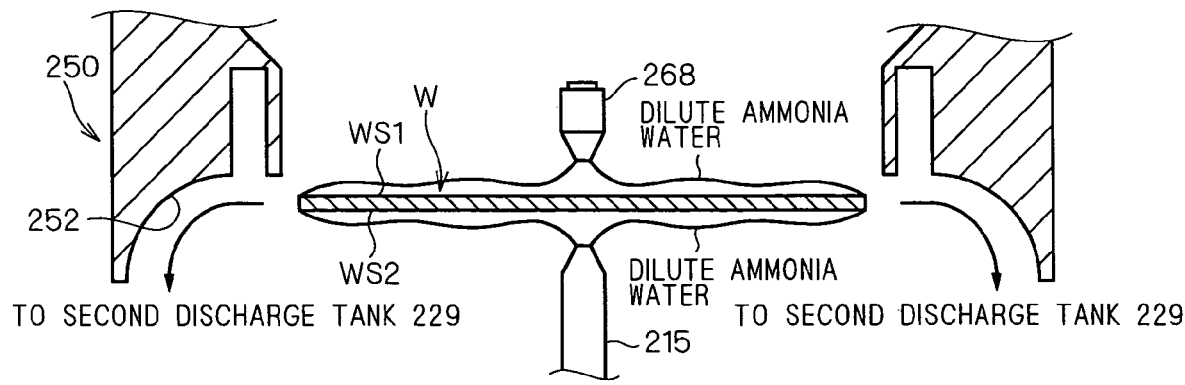
FIGS. 14A, 14B and 14C are operating state diagrams schematically showing supply of dilute ammonia water, dilute hydrochloric acid and deionized water only about a portion around a substrate W.

At the step S2, the substrate processing apparatus 201 moves up the splash guard 250 with the hoisting mechanism 255 and makes position control so that the second guide part 252 encloses the spin base 210 and the substrate W held thereon. The substrate processing apparatus 201 also drives the nozzle moving mechanism 265 and the nozzle hoisting mechanism 269 for moving the alkaline solution nozzle 268 to the oppositional position for the substrate W. The substrate processing apparatus 201 drives the electric motor 220 and the belt driving mechanism 221, thereby starting rotating the substrate W along with the spin base 210. In this state, the substrate processing apparatus 201 discharges dilute ammonia water imparted with megasonic vibrations and dilute ammonia water from the nozzles 268 and 215 toward the front and back surfaces WS1 and WS2 of the substrate W respectively. FIG. 14A is an operating state diagram schematically showing supply of dilute ammonia water at the step S2 as to only a portion around the substrate W.

Figure 15:
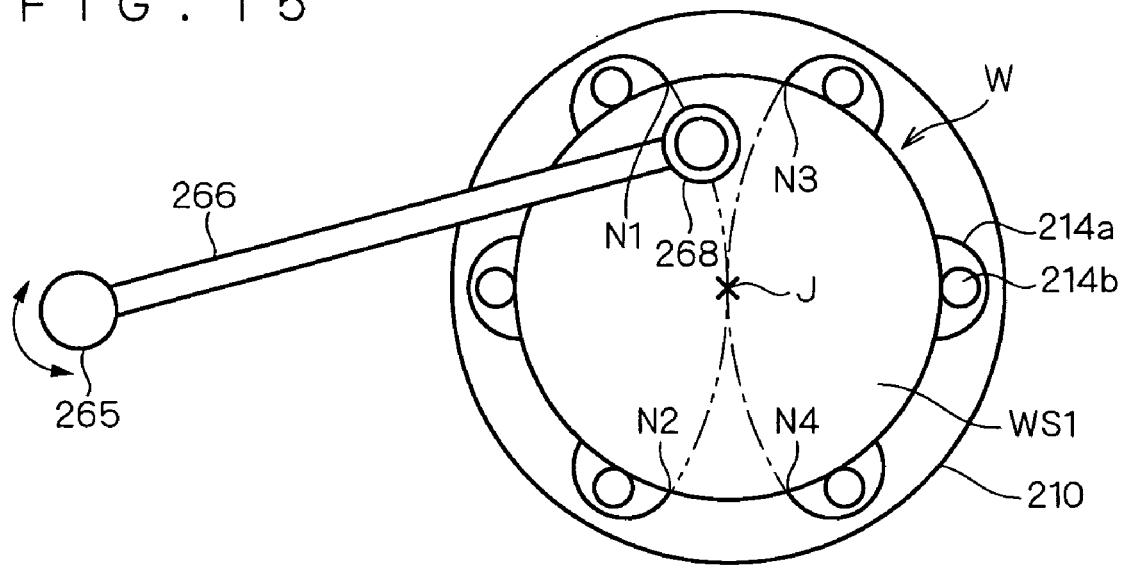
FIG. 15 is a schematic plan view for illustrating movement of the nozzle 268 with respect to the substrate W held on a spin base 210.

FIG. 15 is a schematic plan view for illustrating movement of the nozzle 268 with respect to the substrate W held on the spin base 210. The nozzle 268 reciprocates/scans between peripheral edge portions N1 and N2 of the substrate W on an arcuate locus (two-dot chain line in FIG. 15) passing through the rotation axis J of the substrate W about the rotation axis of the nozzle moving mechanism 265. The substrate processing apparatus 201 can uniformly process the overall front surface WS1 of the substrate W by discharging dilute ammonia water toward the front surface WS1 of the rotated substrate W while performing such arcuate scanning thereby supplying dilute ammonia water to the overall front surface WS1 of the substrate W. Referring to FIG. 15, the one-dot chain line shows the locus of motion of the acid solution nozzle 278.

It follows that dilute ammonia water discharged from the nozzle 215 to a portion around the center of the back surface WS2 of the substrate W is diffused outward due to centrifugal force following rotation, to be supplied to the overall back surface WS2 of the substrate W as shown in FIG. 14A.

Dilute ammonia water discharged from the nozzle 268 is imparted with megasonic vibrations, for prompting liberation of particles adhering to the surface of the substrate W due to the impact of the megasonic vibrations. While the nozzle 215 has no function of imparting megasonic vibrations, the megasonic vibrations of dilute ammonia water supplied to the front surface WS1 of the substrate W propagate through the substrate W along its thickness to reach the back surface WS2, thereby also prompting liberation of particles adhering to the back surface WS2 of the substrate W. On the other hand, potentials (zeta potentials) of the surfaces of main particles such as PSL (polystyrene latex), $Si_3N_4$, $SiO_2$ and Si are charged to minus (−) states in the alkaline aqueous solution while zeta potentials on the surface of the substrate (silicon wafer) W are also charged to minus (−) states when in contact with the alkaline aqueous solution. In this case, the zeta potentials on the surface of the substrate W and those of the particles have the same polarity, leading to repulsion between the substrate W and the particles. Therefore, it follows that particles once liberated from the surface of the substrate W due to the megasonic vibrations of dilute ammonia water are prevented from re-adhesion due to the repulsion of the zeta potentials, to be efficiently removed.

At the step S2, the substrate processing apparatus 201 supplies dilute ammonia water thereby altering metal contaminants such as Fe and Cu adhering to the surface of the substrate W to hydroxides. Thus, the substrate processing apparatus 201 can readily dissolve the metal contaminants in the step S3 described later.

Dilute ammonia water supplied to the surface of the substrate W is drained sideward from the substrate W due to centrifugal force resulting from the rotation as shown by arrow in FIG. 14A, to be received by the second guide part 252 of the splash guard 250. This dilute ammonia water flows into the second discharge tank 229, to be discharged from the discharge port 229a into the recovery drain 229b. The dilute ammonia water discharged into the recovery drain 229b is recovered in a recovery tank (not shown), to be thereafter re-supplied to the alkaline solution supply source 217a for recycling.

After supplying the dilute ammonia water, the substrate processing apparatus 201 stops supplying the same from the nozzles 268 and 215.

Figure 14B:
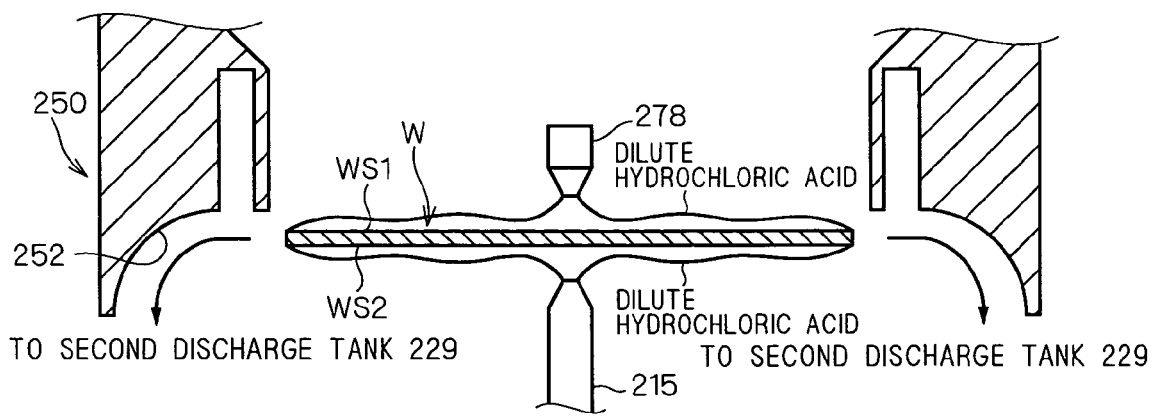

At the step S3, the substrate processing apparatus 201 drives the nozzle moving mechanisms 265 and 275, the nozzle hoisting mechanisms 269 and 279, the hoisting mechanism 255 etc. thereby moving the alkaline solution nozzle 268 and the acid solution nozzle 278 to the retracted position and the oppositional position respectively. The substrate processing apparatus 201 discharges dilute hydrochloric acid from the nozzles 278 and 215 toward the front and back surfaces WS1 and WS2 of the rotated substrate W respectively. FIG. 14B is an operating state diagram schematically showing supply of dilute hydrochloric acid at the step S3 as to only a portion around the substrate W.

The nozzle 278 reciprocates/scans between peripheral edge portions N3 and N4 of the substrate W on an arcuate locus (one-dot chain line in FIG. 15) passing through the rotation axis J of the substrate W about the rotation axis of the nozzle moving mechanism 275. The substrate processing apparatus 201 can uniformly process the overall front surface WS1 of the substrate W by discharging dilute hydrochloric acid toward the front surface WS1 of the rotated substrate W while performing such arcuate scanning thereby supplying dilute hydrochloric acid to the overall front surface WS1 of the substrate W.

It follows that dilute hydrochloric acid discharged from the nozzle 215 to a portion around the center of the back surface WS2 of the substrate W is diffused outward due to centrifugal force following rotation, to be supplied to the overall back surface WS2 of the substrate W as shown in FIG. 14B.

It follows that the metal contaminants adhering to the surface of the substrate W are dissolved (ionized) and removed by the dilute hydrochloric acid supplied to the surface of the substrate W. The substrate processing apparatus 201 has previously altered the metal contaminants adhering to the surface of the substrate W to hydroxides at the step S2. Therefore, the substrate processing apparatus 201 can further rapidly perform dissolution with the dilute hydrochloric acid at the step S3.

Dilute hydrochloric acid supplied to the surface of the substrate W at the step S3 is drained sideward from the substrate W due to centrifugal force resulting from the rotation as shown by arrow in FIG. 14B, to be received by the second guide part 252 of the splash guard 250. This dilute hydrochloric flows into the second discharge tank 229, to be discharged from the discharge port 229a into the recovery drain 229b. The dilute hydrochloric acid discharged into the recovery drain 229b is recovered in a recovery tank (not shown), to be thereafter re-supplied to the acid solution supply source 217a for recycling.

After supplying the dilute hydrochloric acid for a prescribed time, the substrate processing apparatus 201 stops supplying the same from the nozzles 278 and 215.

Figure 14C:
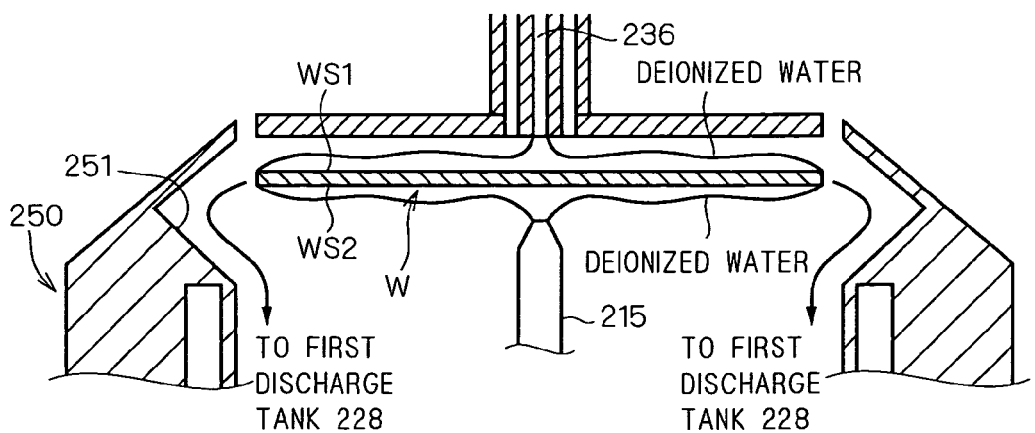

At the step S4, the substrate processing apparatus 201 drives the nozzle moving mechanism 275, the nozzle hoisting mechanism 279 and the hoisting mechanism 255 thereby moving the acid solution nozzle 278 to the retracted position. Thereafter the substrate processing apparatus 201 moves the splash guard 250 with the hoisting mechanism 255 and performs position control so that the first guide part 251 encloses the spin base 210 and the substrate W held thereon. The substrate processing apparatus 201 further drives the hoisting mechanism 249, for moving down the atmosphere blocking plate 230 to a position approaching to the front surface WS1 of the substrate W held on the spin base 210. The substrate processing apparatus 201 drives the electric motor 242 and the belt driving mechanism 241 for rotating the atmosphere blocking plate 230 along with the rotary shaft 235 and discharging nitrogen gas from the gas supply passage 245 toward the front surface WS1 of the substrate W. On the other hand, the substrate processing apparatus 201 discharges nitrogen gas from the gas supply passage 219 toward the back surface WS2 of the substrate W. Thus, the substrate processing apparatus 201 provides low oxygen partial pressures into the space between the atmosphere blocking plate 230 and the substrate W as well as that between the spin base 210 and the substrate W respectively. In this state, the substrate processing apparatus 201 discharges deionized water from the nozzles 236 and 215 toward the front and back surfaces WS1 and WS2 of the rotated substrate W respectively for performing rinsing of washing out dilute hydrochloric acid etc. remaining on the surface of the substrate W. FIG. 14C is an operating state diagram schematically showing supply of deionized water at the step S4 as to only a portion around the substrate W.

Deionized water supplied to the surface of the substrate W at the step S4 is drained sideward from the substrate W due to centrifugal force resulting from the rotation as shown by arrows in FIG. 14C, and received by the first guide part 251 of the splash guard 250. This deionized water flows into the first discharge tank 228, to be discharged from the discharge port 228a into the recovery drain 228b.

After supplying deionized water for a prescribed time, the substrate processing apparatus 201 stops supplying the same from the nozzles 236 and 215.

At the step S5, the substrate processing apparatus 201 continues supplying nitrogen gas from the gas supply passages 245 and 219 and rotating the substrate W after terminating supply of deionized water at the step S4, for drying (spin-drying) the substrate W by draining moisture adhering to the surface thereof.

The substrate processing apparatus 201 can attain an effect of drying efficiency for the front and back surfaces WS1 and WS2 of the substrate W by performing spin drying while discharging nitrogen gas from the gas supply passages 245 and 219. Further, the substrate processing apparatus 201 provides low oxygen partial pressures into the space between the atmosphere blocking plate 230 and the substrate W as well as that between the spin base 210 and the substrate W respectively thereby attaining an effect of inhibiting the front and back surfaces WS1 and WS2 of the substrate W from formation of watermarks.

When completely drying the surface of the substrate W, the substrate processing apparatus 201 stops supplying nitrogen gas from the gas supply passages 245 and 219. The substrate processing apparatus 201 also stops the electric motor 220 thereby stopping rotating the substrate W.

At the step S6, the substrate processing apparatus 201 drives the hoisting mechanism 249 for moving up and retracting the atmosphere blocking plate 230 to a position remarkably separated from the front surface WS1 of the substrate W held on the spin base 210. The substrate processing apparatus 201 also drives the hoisting mechanism 255, so that the upper end of the splash guard 250 is flush with or slightly lower than the spin base 210. In this state, the substrate processing apparatus 201 brings the plurality of chuck pins 214 grasping the peripheral edge of the substrate W from the pressing states into the releasing states and discharges the substrate W from the spin base 210 outward from the apparatus 201 with the transport robot (not shown), for terminating the processing for cleaning the single substrate W.

The substrate processing apparatus 201 can perform the aforementioned series of processing with dilute ammonia water and dilute hydrochloric acid under the ordinary temperature (20 to 30° C.). When keeping the room temperature at the ordinary temperature, the substrate processing apparatus 201 can readily process the substrate W with dilute ammonia water and dilute hydrochloric acid usable without adjusting the liquid temperatures in particular. In other words, the substrate processing apparatus 201 requires neither time nor equipment for temperature control before and after processing, whereby the processing time as well as the cost can be reduced. Further, the substrate processing apparatus 201 can remarkably reduce the quantity for etching the substrate W with the alkaline solution and the acid solution by performing processing at the ordinary temperature as compared with a case of performing processing at a high temperature (about 65° C.).

The alkaline solution, prepared from dilute ammonia water in the aforementioned example, may alternatively be prepared from a mixed solution (SC1) of ammonia water, hydrogen peroxide water and deionized water or an alkaline solution obtained by adding a surface active agent to dilute ammonia water. When the substrate processing apparatus 201 employs such an alkaline solution containing hydrogen peroxide water or a surface active agent, it is possible to attain effects of protecting the surface of the processed substrate W and inhibiting surface roughness from deterioration. The volume ratio of deionized water and ammonia water (28 to 30 wt. %: the same shall apply hereinafter) is preferably set to 5:0.02 to 0.6 in order to protect the surface of the substrate W when dilute ammonia water is employed, while the volume ratios of deionized water, ammonia water and hydrogen peroxide water (30 wt. %: the same shall apply hereinafter) are preferably set to 5:0.03 to 1:0.03 to 1 in order to keep alkalinity when SC1 is employed.

A strong alkaline chemical solution may be added to dilute ammonia water or SC1 for increasing the pH value of the alkaline solution. While it is possible to attain the effect of altering metal contaminants such as Fe and Cu adhering to the surface of the substrate W to hydroxides and prompting subsequent dissolution with the acid solution by supplying the alkaline solution in the aforementioned embodiment, this effect can be further remarkably attained by supplying the alkaline solution having the increased pH value. In other words, it is possible to further effectively alter the metal contaminants adhering to the surface of the substrate W to hydroxides as the pH value of the supplied alkaline solution is increased, for further prompting subsequent dissolution with the acid solution. It is proved by the results of a third test described later that an effect of removing metal contaminants is improved due to employment an alkaline solution having a pH value increased to 12.

If the pH value is excessively increased, however, the alkaline solution may attain unignorable etching force with respect to the substrate W. In this case, it follows that etching on the surface of the substrate W with the alkaline solution improperly progresses against the object of the present invention. Therefore, it is preferable to use an alkaline solution having a pH value increased in a range not obtaining excessive etching force, and the range for preferable pH values is at least 11 and less than 13, for example.

In order to obtain a relatively high pH value for the alkaline solution such as dilute ammonia water or SC1, it is easier to add a strong alkaline chemical solution than to increase the pH value by adjusting only the concentration or the mixing ratio thereof. According to addition of the strong alkaline chemical solution, not only the pH value of the alkaline solution can be readily increased to at least 11 but also the quantity of the chemical solution may be small, and hence increase of the manufacturing cost and a burden on the environment are small as compared with the adjustment of the concentration and the mixing ratio.

The strong alkaline chemical solution added for increasing the pH value of the alkaline solution is preferably prepared from a TMAH (tetramethyl ammonium hydroxide) aqueous solution or a CHOLINE (trimethyl-2-hydroxyethyl ammonium hydroxide) aqueous solution, for example.

The acid solution, prepared from dilute hydrochloric acid in the aforementioned example, may alternatively be prepared from dilute hydrofluoric acid, dilute sulfuric acid or a mixed solution of dilute hydrochloric acid and dilute hydrofluoric acid. The volume ratio of hydrochloric acid (35 wt. %: the same shall apply hereinafter) and deionized water is preferably set to 1:3 to 15 when dilute hydrochloric acid is employed, while the volume ratio of hydrofluoric acid (50 wt. %: the same shall apply hereinafter) and dilute hydrochloric acid is preferably set to 1:50 to 500 when a mixed solution of dilute hydrochloric acid and dilute hydrofluoric acid is employed.

Figure 16:
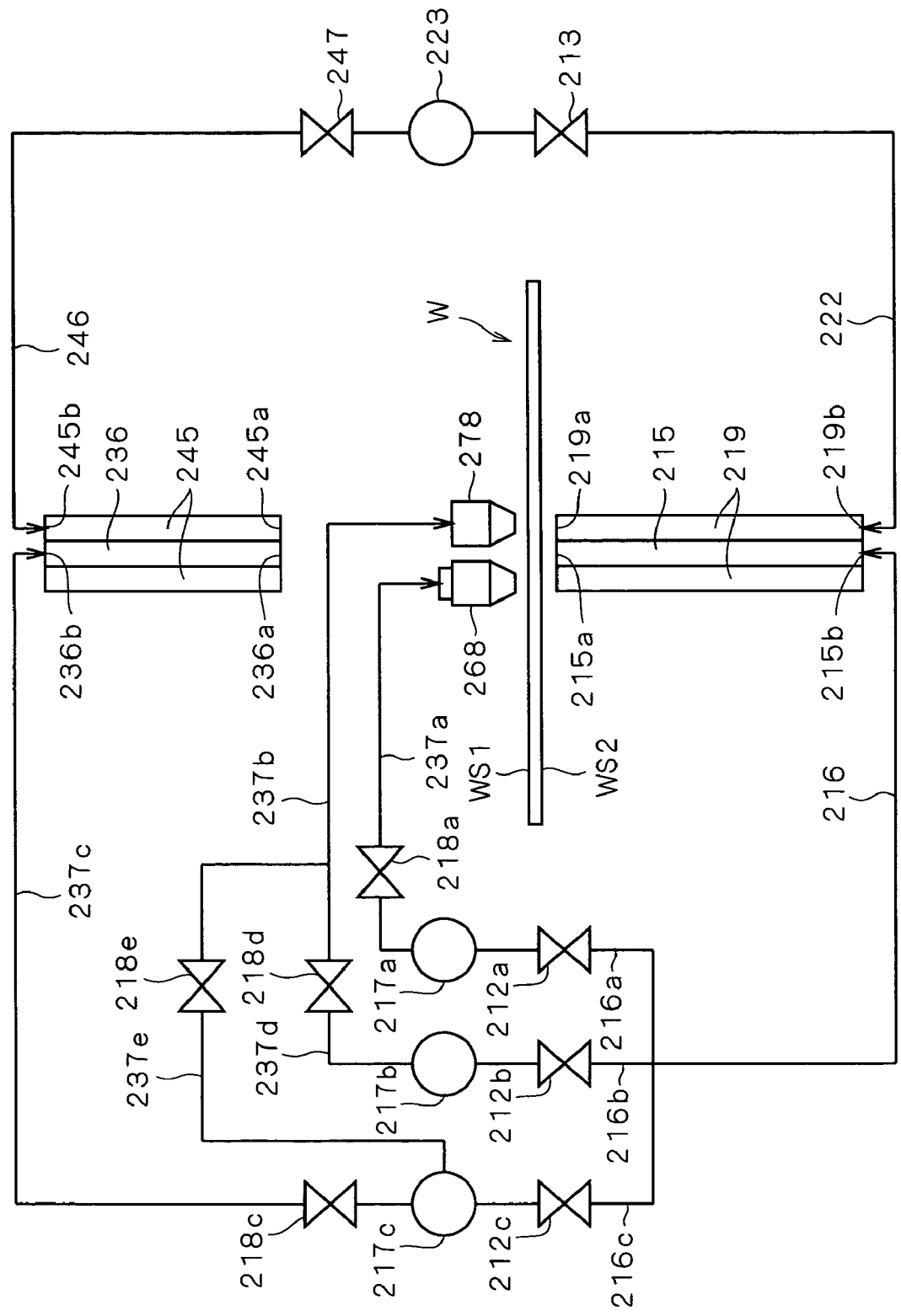
FIG. 16 illustrates the structures of pipes etc. according to a modification of the second embodiment.

A step of cleaning the surface of the substrate W with deionized water may be added between the steps S2 and S3. The nozzle 278, for example, can be utilized for discharging deionized water in this step. In this case, the pipe 237b communicatively connected to the nozzle 278 is branched into two branch pipes 237d and 237e, which in turn are connected to the supply sources 217b for the acid solution and the supply source 217c for deionized water through valves 218d and 218e respectively, as shown in FIG. 16. According to this structure, it is possible to switch the liquid discharged from the nozzle 278 between the acid solution and deionized water by opening/closing the valves 218d and 218e. As to the procedure, the substrate processing apparatus 201 drives the nozzle moving mechanisms 265 and 275, the nozzle hoisting mechanisms 269 and 279, the hoisting mechanism 255 etc. after the step S2 thereby moving the nozzles 268 and 278 to the retracted position and the oppositional position respectively while moving the splash guard 250 to the position where the first guide part 251 encloses the spin base 210 and the substrate W held thereon. Then, the substrate processing apparatus 201 discharges deionized water from the nozzles 278 and 215 toward the front and back surfaces WS1 and WS2 of the rotated substrate W respectively. After discharging deionized water for a prescribed time, the substrate processing apparatus 201 stops discharging the same from the nozzles 278 and 215. Thereafter the substrate processing apparatus 201 drives the hoisting mechanism 255 for moving the splash guard 250 to the position where the second guide part 252 encloses the spin base 210 and the substrate W held thereon, and advances to the step S3.

Various tests related to this embodiment are now described.

First, a first test is described. Alkaline solutions were supplied to substrates W (silicon wafers) for testing removal rates for Si grains and SiN grains (particles) present on front surfaces WS1 of the substrates W before and after supply of the alkaline solutions.

In a case C11, the aforementioned substrate processing apparatus 201 was employed for supplying an alkaline solution prepared from dilute ammonia water (containing ammonia water and deionized water in a volume ratio of 1:25) imparted with megasonic vibrations to the front surface WS1 of the substrate W for 20 seconds. Dilute ammonia water was under the room temperature.

In a case C12, the aforementioned substrate processing apparatus 201 was employed for supplying an alkaline solution prepared from SC1 (containing ammonia water, hydrogen peroxide water and deionized water in volume ratios of 1:1:50) imparted with megasonic vibrations to the front surface WS1 of the substrate W for 20 seconds. SC1 was under the room temperature.

In a case C13, a batch substrate processing apparatus was employed for dipping the substrate W in a processing tank storing an alkaline solution prepared from SC1 (containing ammonia water, hydrogen peroxide water and deionized water in volume ratios of 1:1:50) for 60 seconds. The temperature of SC1 was set to 60° C.

In a case C14, a batch substrate processing apparatus was employed for dipping the substrate W in a processing tank storing an alkaline solution prepared from SC1 (containing ammonia water, hydrogen peroxide water and deionized water in volume ratios of 1:1:50) for 600 seconds. The temperature of SC1 was set to 60° C.

Figure 17:
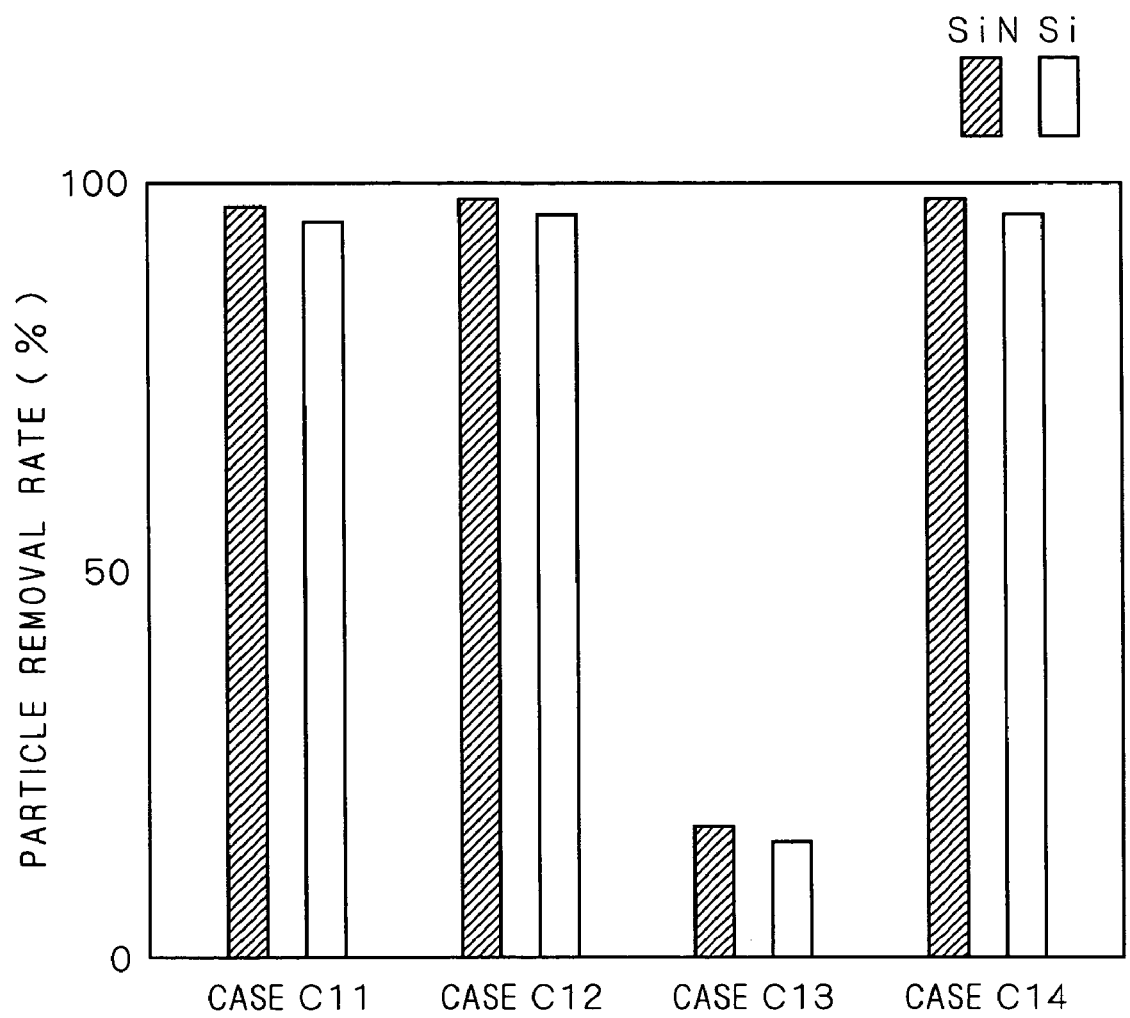
FIG. 17 is a graph showing results of a first test in the second embodiment.

FIG. 17 shows results of the first test. According to the inventive cases C11 and C12, it was possible to obtain high removal rates despite the processing times of ⅓ as compared with the case C13 and the ordinary processing temperatures. According to the inventive cases C11 and C12, further, it was possible to obtain equivalent removal rates in the processing times of only 1/30 as compared with the case C14 despite the ordinary processing temperatures.

A second test is now described. Effects of removing Fe and Cu (metal contaminants) present on front surfaces WS1 of substrates W (silicon wafers) were tested.

In a case C21, the aforementioned substrate processing apparatus 201 was employed for supplying an alkaline solution prepared from SC1 (containing ammonia water, hydrogen peroxide water and deionized water in volume ratios of 1:1:50) to the front surface WS1 of the substrate W for 20 seconds while supplying an acid solution prepared from dilute hydrochloric acid (containing hydrochloric acid and deionized water in a volume ratio of 1:5) to the front surface WS1 of the substrate W for 15 seconds.

In a case C22, the aforementioned substrate processing apparatus 201 was employed for supplying an alkaline solution prepared from SC1 (containing ammonia water, hydrogen peroxide water and deionized water in volume ratios of 1:1:50) to the front surface WS1 of the substrate W for 20 seconds while supplying an acid solution prepared from a mixed solution (containing hydrofluoric acid, hydrochloric acid and deionized water in volume ratios of 1:20:200) of dilute hydrofluoric acid and dilute hydrochloric acid) to the front surface WS1 of the substrate W for 15 seconds.

In a case C23, the aforementioned substrate processing apparatus 201 was employed for supplying an acid solution prepared from a mixed solution (containing hydrofluoric acid, hydrochloric acid and deionized water in volume ratios of 1:20:200) of dilute hydrofluoric acid and dilute hydrochloric acid to the front surface WS1 of the substrate W for 15 seconds while omitting supply of an alkaline solution.

Figure 18:
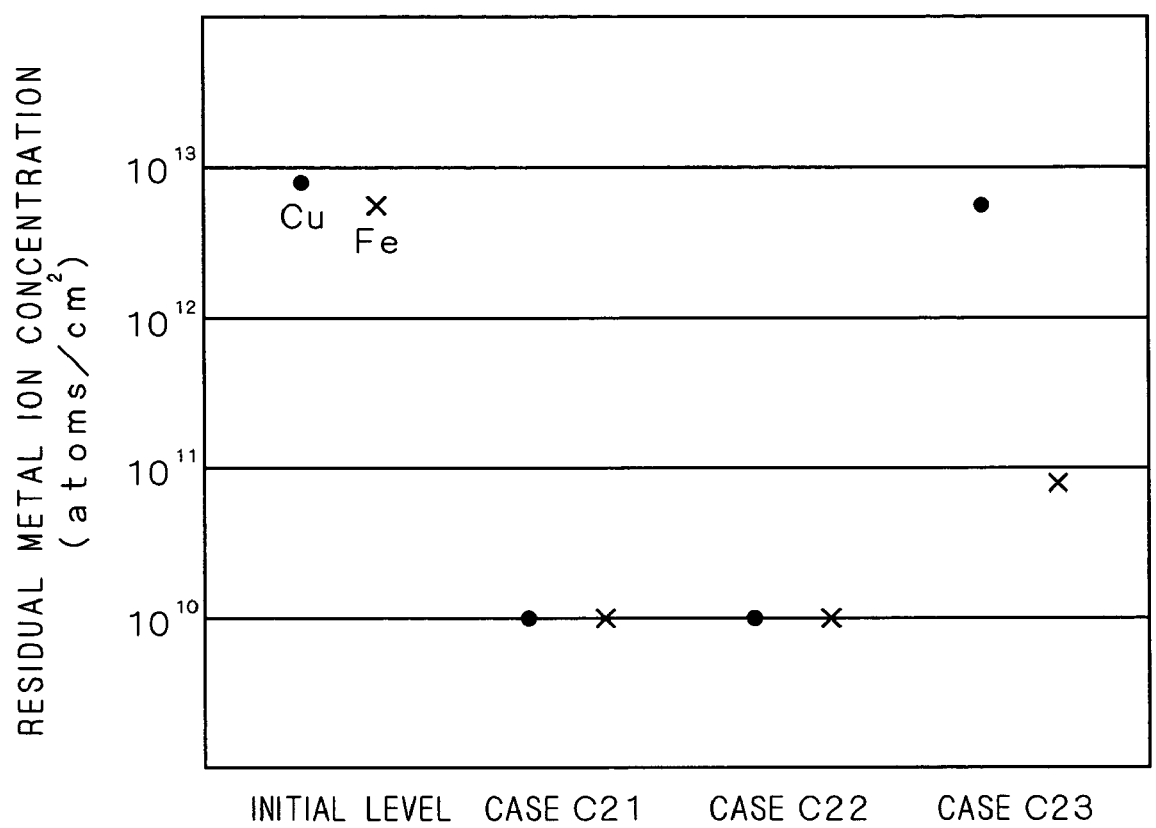
FIG. 18 is a graph showing results of a second test in the second embodiment.

FIG. 18 shows results of the second test. According to the inventive cases C21 and C22, it was possible to attain excellent effects of removal with low concentrations of metal contaminants remaining after the processing as compared with the case C23. In other words, it was possible to improve the effect of removing metal contaminants by supplying the alkaline solution and thereafter supplying the acid solution.

A third test is now described. Effects of removal of Fe, Cu and Ni (metal contaminants) present on the surfaces of substrates W (silicon wafers) were compared with each other as to alkaline solutions having different pH values. In the third test, the aforementioned substrate processing apparatus 201 was employed for all cases C31, C32, C41 and C42 for supplying alkaline solutions imparted with megasonic vibrations to the surfaces of the substrates W.

In the case C31, an alkaline solution prepared from SC1 (containing ammonia water, hydrogen peroxide water and deionized water in volume ratios of 1:1:100) having a pH value of 10.5 was supplied to the surface of the substrate W for 10 seconds. An acid solution prepared from a mixed solution (containing hydrofluoric acid, hydrochloric acid and deionized water in volume ratios of 1:40:200) of dilute hydrofluoric acid and dilute hydrochloric acid was supplied to the surface of the substrate W for 10 seconds.

In the case C32, an alkaline solution (containing TMAH, ammonia water, hydrogen peroxide water and deionized water in volume ratios of 3:1:1:100) prepared by adding TMAH (25 wt. %: the same shall apply hereinafter) to SCI for adjusting the pH value to 12 was supplied to the surface of the substrate W for 10 seconds. An acid solution prepared from a mixed solution (containing hydrofluoric acid, hydrochloric acid and deionized water in volume ratios of 1:40:200) of dilute hydrofluoric acid and dilute hydrochloric acid was supplied to the surface of the substrate W for 10 seconds.

In the case C41, an alkaline solution prepared from SC1 (containing ammonia water, hydrogen peroxide water and deionized water in volume ratios of 1:1:100) having a pH value of 10.5 was supplied to the surface of the substrate W for 10 seconds. An acid solution prepared from dilute hydrochloric acid (containing hydrochloric acid and deionized water in a volume ratio of 1:5) was supplied to the surface of the substrate W for 10 seconds.

In the case C42, an alkaline solution (containing TMAH, ammonia water, hydrogen peroxide water and deionized water in volume ratios of 3:1:1:100) prepared by adding TMAH to SC1 for adjusting the pH value to 12 was supplied to the surface of the substrate W for 10 seconds. An acid solution prepared from dilute hydrochloric acid (containing hydrochloric acid and deionized water in a volume ratio of 1:5) was supplied to the surface of the substrate W for 10 seconds.

Figure 19:
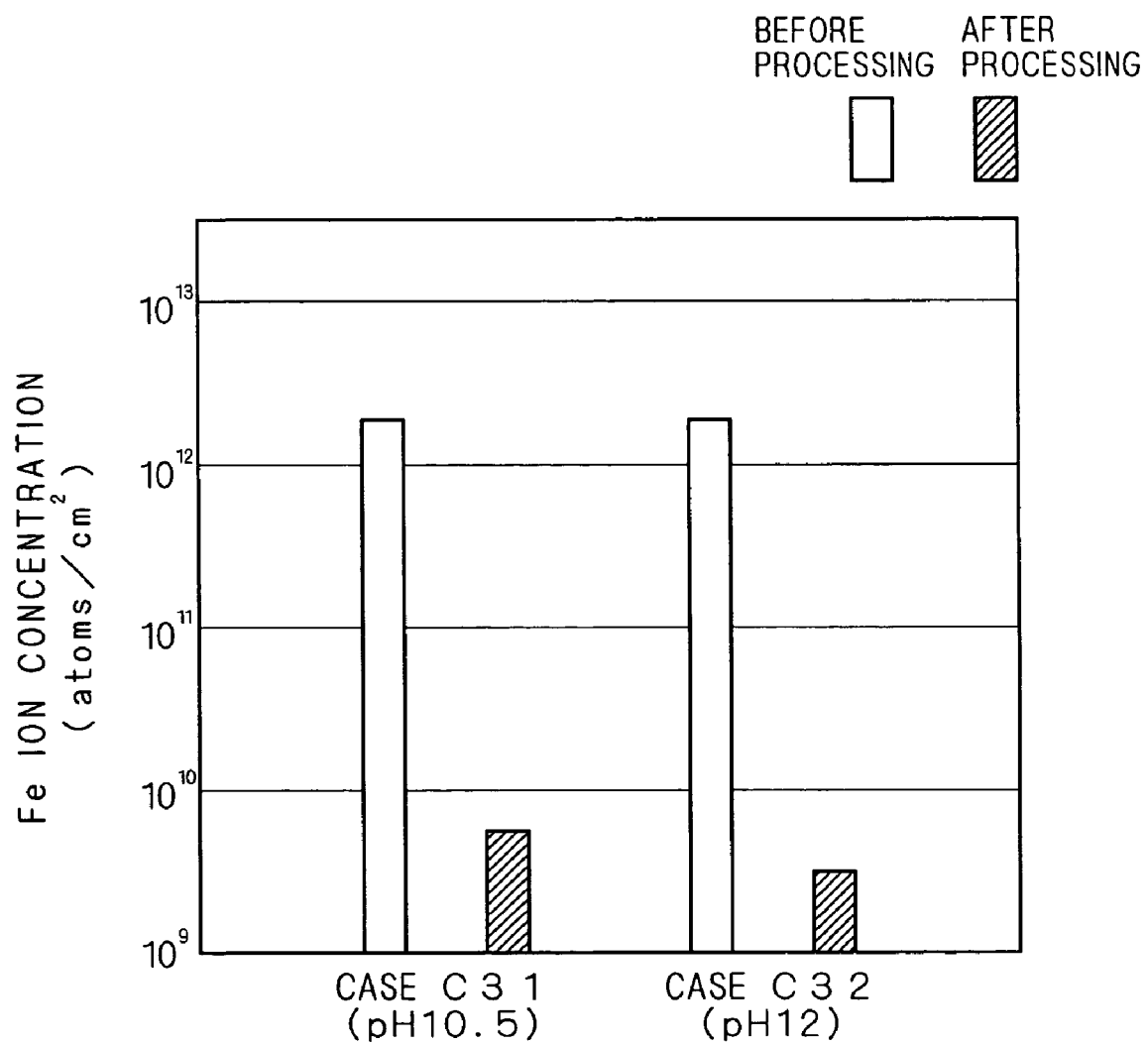
FIGS. 19, 20 and 21 are graphs showing results of a third test in the second embodiment.
Figure 20:
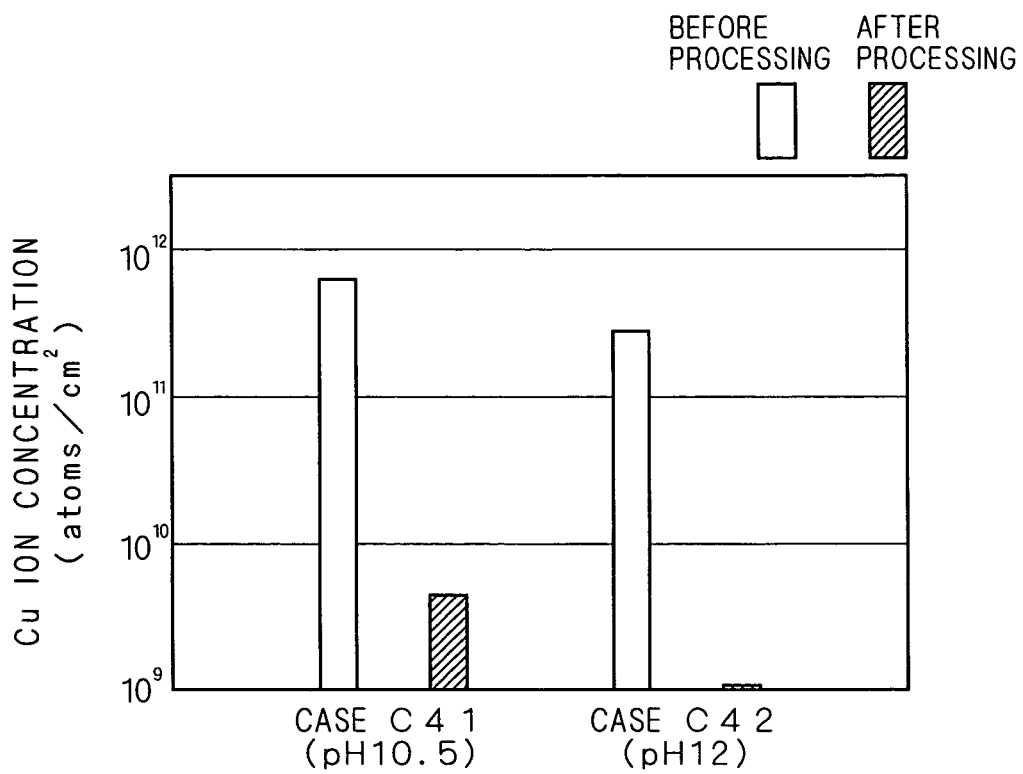
Figure 21:
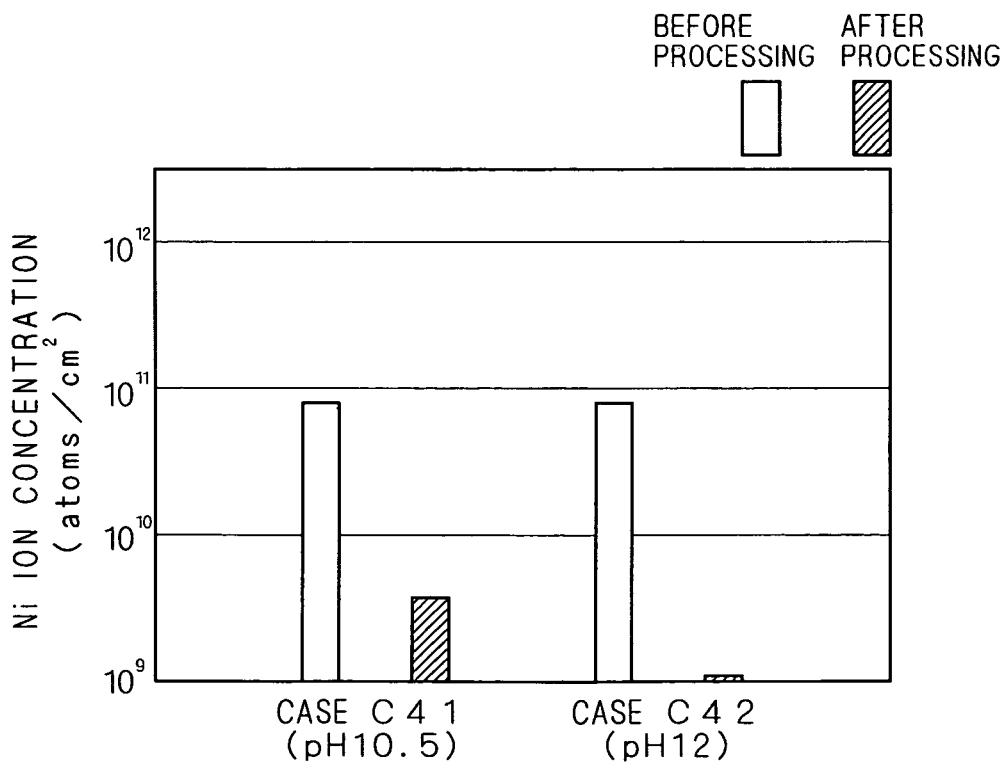

FIGS. 19 to 21 show results of the third test. More specifically, FIGS. 19, 20 and 21 show Fe ion concentrations before and after processing under the conditions of the cases C31 and C32, Cu ion concentrations before and after processing under the conditions of the cases C41 and C42 and Ni ion concentrations before and after processing under the conditions of the cases C41 and C42 respectively.

From any of the results shown in FIGS. 19 to 21, it has been confirmed possible to reduce the concentrations of metal contaminants remaining after processing in the cases C32 and C42 employing the alkaline solutions having the pH values increased to 12 as compared with the cases C31 and C41. In other words, it has been confirmed that the effect of removing contaminants is improved by using an alkaline solution having an increased pH value.

While it is preferable to minimize the ratio of hydrofluoric acid in the acid solution in order to suppress the quantity of etching on the surface of the substrate W, it has been confirmed according to the results shown in FIGS. 20 and 21 that a remarkably excellent effect of removing metal contaminants can be attained according to the case C42 with the acid solution prepared from dilute hydrochloric acid containing no hydrofluoric acid. In other words, it was possible to attain a remarkably excellent effect of removing metal contaminants by using an alkaline solution having an increased pH value without mixing hydrofluoric acid into the acid solution.

Finally, a fourth test is described. While the third test was made as to the effects of removing metal contaminants with reference to the alkaline solutions having the increased pH values, the fourth test was made as to removal rates for particles. In other words, removal rates for five principal types of particles PSL, SiN, $Al_2O_3$, Si and $SiO_2$ were tested.

In a case C51, the aforementioned substrate processing apparatus 201 was employed for supplying an alkaline solution (containing TMAH, ammonia water, hydrogen peroxide water and deionized water in volume ratios of 3:1:1:100) prepared by adding TMAH to SC1 for adjusting the pH value to 12 and imparted with megasonic vibrations to the surface of the substrate W for 30 seconds. An acid solution prepared from a mixed solution (containing hydrofluoric acid, hydrochloric acid and deionized water in volume ratios of 1:40:200) of dilute hydrofluoric acid and dilute hydrochloric acid was supplied to the surface of the substrate W for 10 seconds.

In a case C52, a conventionally used batch substrate processing apparatus was employed. In the case C52, the substrate W was dipped in a processing tank storing dilute hydrofluoric acid (containing hydrofluoric acid and deionized water in a volume ratio of 1:50) under the ordinary temperature for 510 seconds, then dipped in a processing tank storing SC1 (containing ammonia water, hydrogen peroxide water and deionized water in volume ratios of 1:1:50) at a temperature of 65° C. for 600 seconds, and thereafter dipped in a processing tank storing SC2 at a temperature of 65° C. for 600 seconds. In this case C52, SC2 was prepared from a mixed solution containing hydrochloric acid, hydrogen peroxide water and deionized water in volume ratios of 1:1:50.

Figure 22:
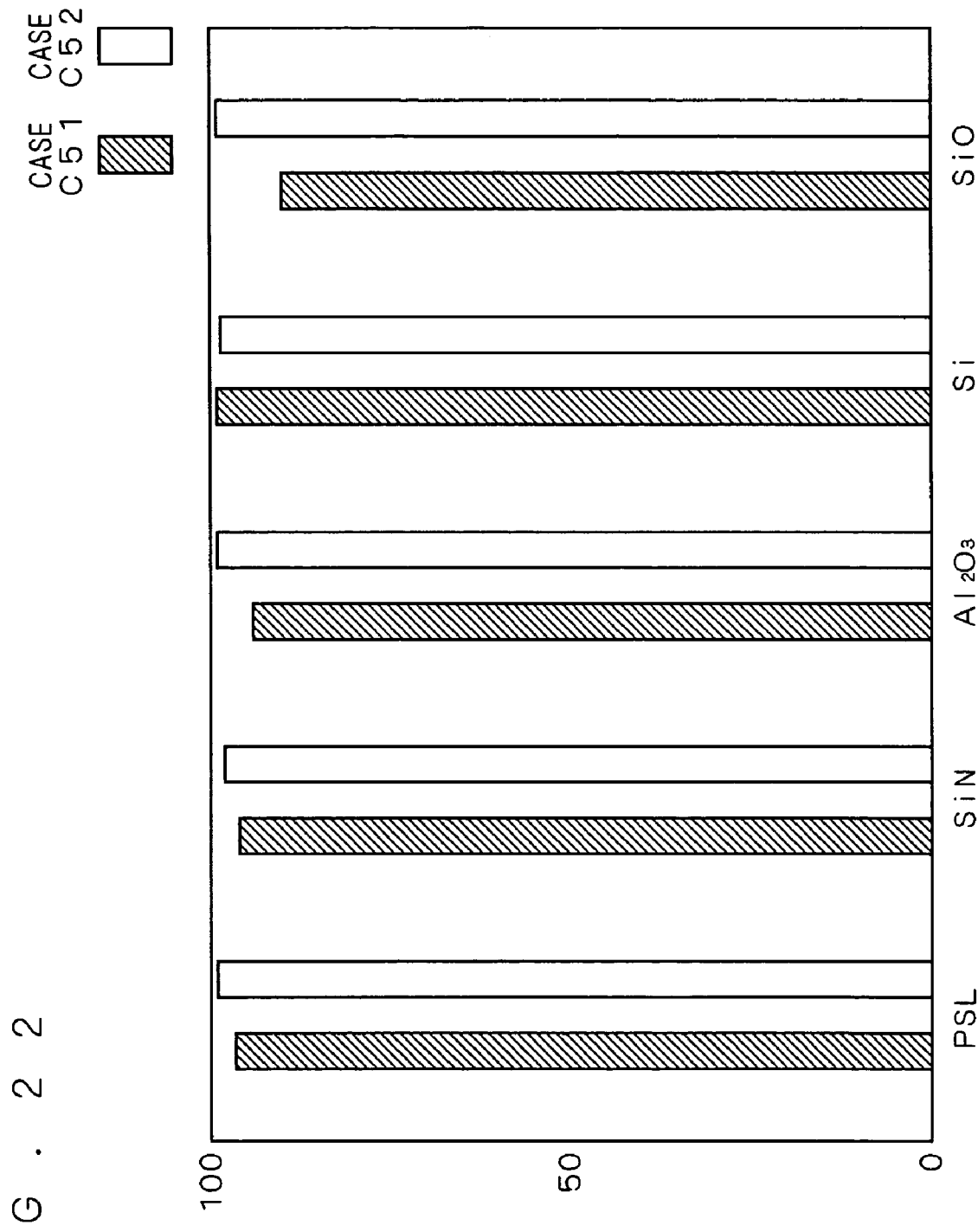
FIG. 22 is a graph showing results of a fourth test in the second embodiment.

FIG. 22 shows results of the fourth test. It has been confirmed that substantially equivalent removal rates were obtained in the inventive case C51 as to the principal particles PSL, SiN, $Al_2O_3$, Si and $SiO_2$ respectively despite the total processing time of not more than 1/50 as compared with the case C52 and the ordinary processing temperature. In other words, it has been confirmed that removal rates equivalent to those in the conventional batch substrate processing apparatus can be obtained without exerting bad influence on removal of particles in particular also when an alkaline solution having an increased pH value is employed.

<3. Third Embodiment>

A third embodiment of the present invention is now described with reference to FIGS. 23 to 29.

Figure 23:
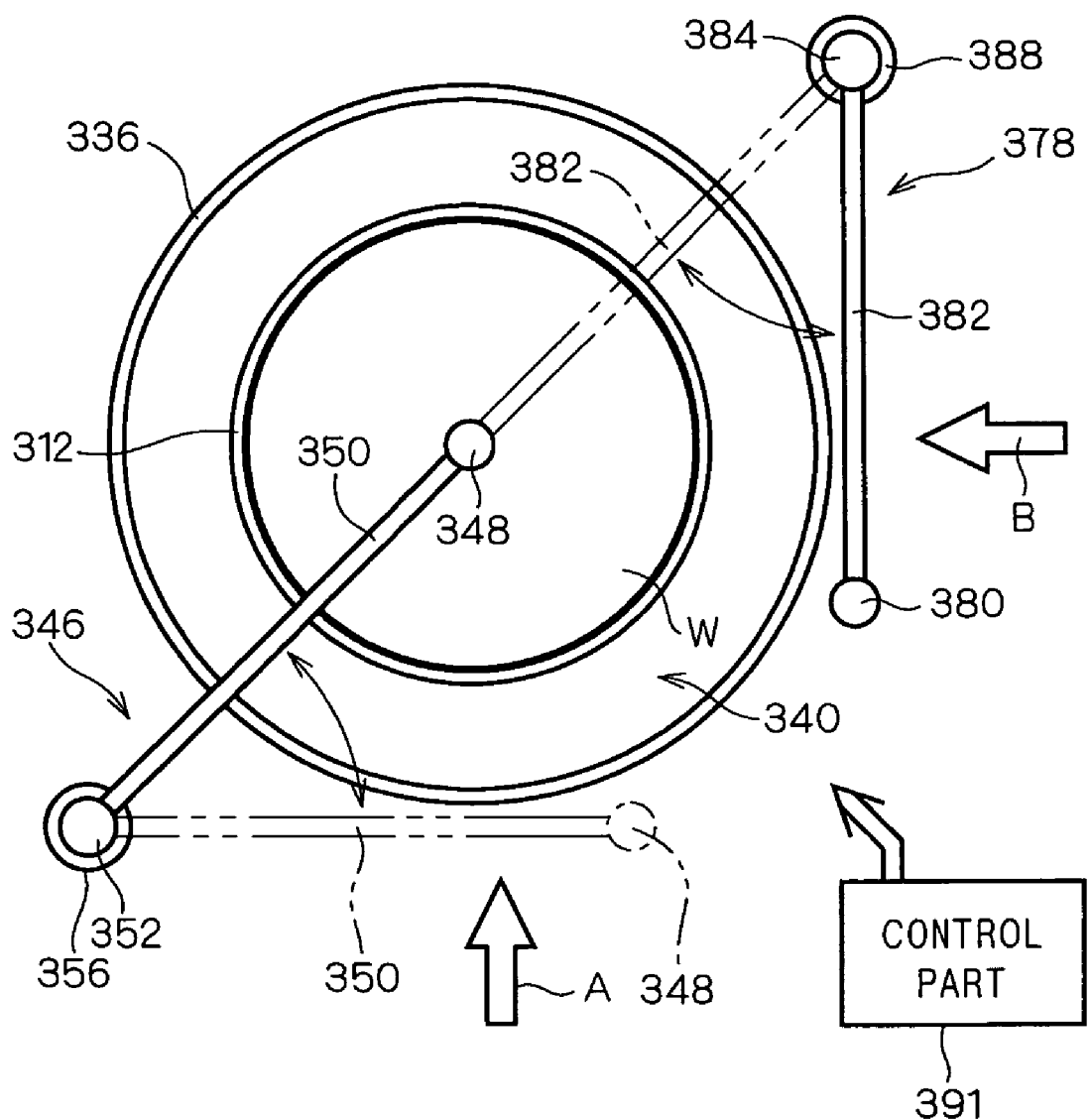
FIG. 23 is a plan view showing the structure of a substrate processing apparatus according to a third embodiment of the present invention.
Figure 24:
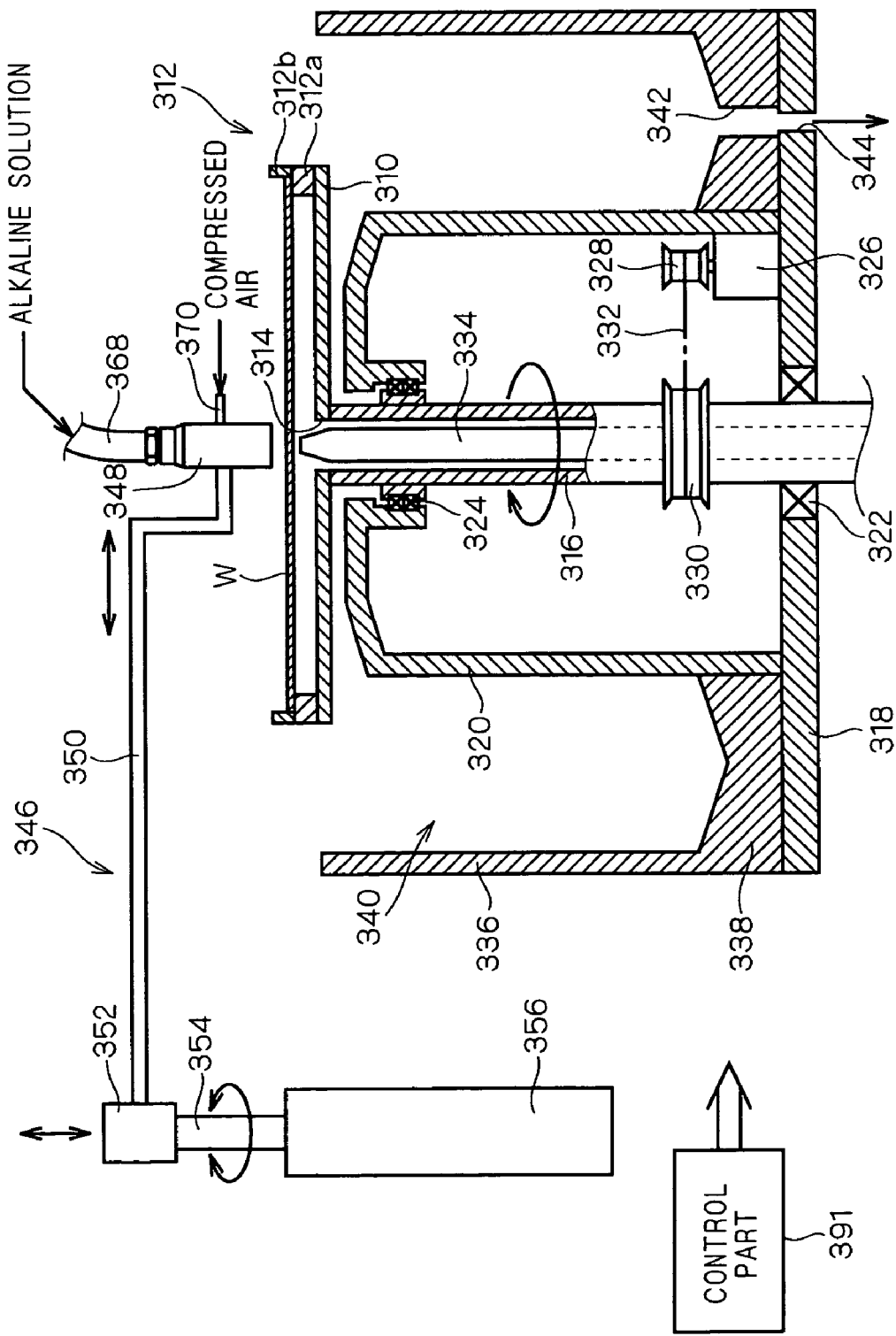

FIGS. 23 to 25 show an exemplary structure of a substrate processing apparatus according to this embodiment. FIG. 23 is a plan view of the apparatus. FIG. 24 is a schematic block diagram showing a principal part of the apparatus as viewed along arrow A in FIG. 23 in an end surface. FIG. 25 is a schematic block diagram showing the principal part of the apparatus as viewed along arrow B in FIG. 23 in another end surface. FIG. 24 omits illustration of an acid solution supply mechanism, while FIG. 25 omits illustration of an alkaline solution supply mechanism.

This substrate processing apparatus comprises a discoidal spin base 310 horizontally supporting a substrate W such as a semiconductor wafer. A plurality of, e.g., six chuck pins 312 for grasping the peripheral edge of the substrate W are circumferentially arranged on the upper peripheral edge of the spin base 310 at regular intervals. Each of the chuck pins 312 comprises a support part 312a coming into contact with the lower peripheral edge of the substrate W for supporting the substrate W and a fixing part 312b pressing the outer peripheral end surface of the substrate W supported on the support part 312a for fixing the substrate W. The fixing part 312b of each chuck pin 312 is switchable between a state pressing the outer peripheral end surface of the substrate W for fixing the substrate W and a state separating from the outer peripheral end surface of the substrate W for releasing the substrate W, although a detailed structure is not illustrated.

A through-hole 314 is formed in the central portion of the spin base 310. A cylindrical rotary spindle 316 is suspended from the lower surface of the spin base 310 to communicate with the through-hole 314. A lidded cylindrical casing 320 fixed onto a base plate 318 is arranged around the rotary spindle 316. The rotary spindle 316 is supported to the base plate 318 and the casing 320 to be vertically rotatable through bearings 322 and 324 respectively. A motor 326 fixed onto the base plate 318 is arranged in the casing 320. A driving pulley 328 is fixed to the rotary shaft of the motor 328 while a driven pulley 330 is engaged with the rotary spindle 316, and a belt 332 is extended along the pulleys 328 and 330. This mechanism rotates the rotary spindle 316 for horizontally rotating the substrate W held on the spin base 310 fixed to the upper end of the rotary spindle 316. A nozzle 334 channel-connected to the supply source for a cleaning solution is inserted into the hollow portion of the rotary spindle 316. The nozzle 334 can discharge the cleaning solution from its upper outlet toward the central portion of the lower surface of the substrate W held on the spin base 310.

Around the casing 320, a cylindrical wall part 336 arranged to enclose the same and a bottom wall part 338 integrally formed with the wall part 336 and concatenated to the lower end of the casing 320 are fixed onto the base plate 318. The cylindrical portion of the casing 320, the wall part 336 and the bottom wall part 338 constitute a recovery tank 340. The bottom wall part 338 forming the bottom of the recovery tank 340 having a V-shaped longitudinal section is formed with a discharge hole 342. The base plate 318 is formed with a discharge port 344 communicating with the hole 342, while a recovery pipe (not shown) channel-connected to a recovery tank (not shown) for the cleaning solution etc. is communicatively connected to the discharge port 344.

As shown in FIG. 24, a supply mechanism 346 for an alkaline solution consisting of a mixed solution of ammonia water, hydrogen peroxide water and deionized water is arranged on a side portion of the wall part 336. The alkaline solution supply mechanism 346 comprises a bi-fluid nozzle 348 having a discharge port arranged above the substrate W held on the spin base 310 to be opposed to its surface. The bi-fluid nozzle 348 is fixed to the forward end of an arm 350, which is horizontally held by an arm holding part 352 in a cantilever manner. The arm holding part 352 is fixed to the upper end of a vertically arranged rotary spindle 354. The rotary spindle 354 is coupled to a nozzle moving mechanism 356, to be rotated and vertically reciprocated by this nozzle moving mechanism 356. The nozzle moving mechanism 356 is so driven that the bi-fluid nozzle 348 can be swung in a horizontal plane, reciprocated between the central portion and the peripheral portion of the substrate W and approached to/separated from the surface of the substrate W. The arm 350 holding the bi-fluid nozzle 348 can be retracted to an external position for the wall part 336, as shown by two-dot chain lines in FIG. 23. The nozzle moving mechanism 356 is not restricted to the illustrated one but can alternatively be implemented by another mechanism.

Figure 26:
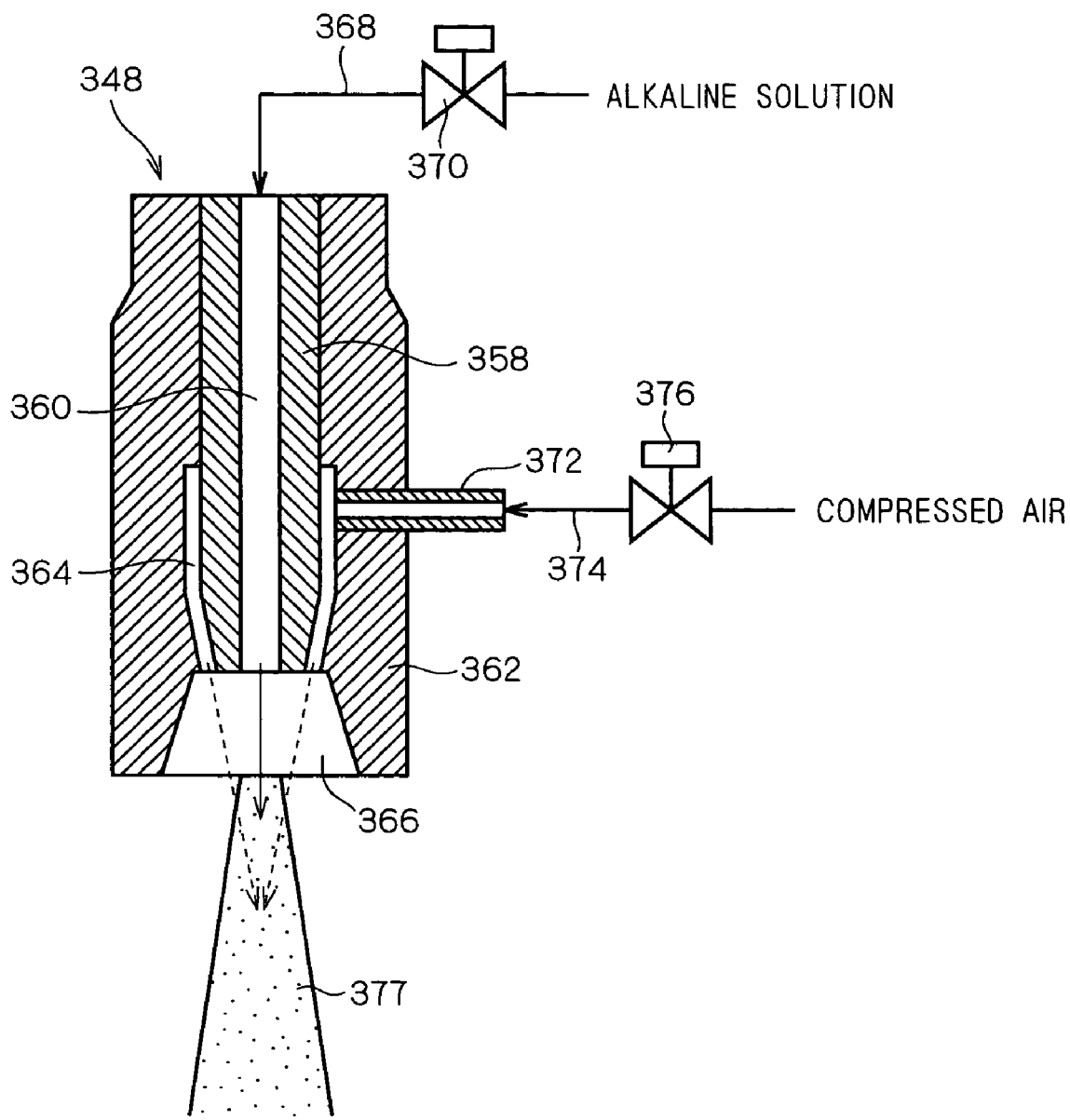
FIG. 26 is a longitudinal sectional view showing an exemplary structure of a bi-fluid nozzle 348.

FIG. 26 is a longitudinal sectional view of the bi-fluid nozzle 348. As shown in FIG. 26, the bi-fluid nozzle 348 is constituted of a tubular liquid supply nozzle part 358 having a through-hole 360 in its axial portion and a cylindrical gas supply nozzle part 362 integrally formed to enclose the outer periphery of the nozzle part 358 with a concave stepped inner peripheral surface provided on its lower half and an annular hole 364 formed between this stepped surface and the outer peripheral surface of the lower half of the liquid supply nozzle part 358. A discharge port of the liquid supply nozzle part 358 and an annular discharge port of the gas supply nozzle part 362 are concentrically arranged. The annular hole 364 of the gas supply nozzle part 362 is tapered around the discharge port to be directed to a point on an extension line of the through-hole 360 of the liquid supply nozzle part 358. Further, the lower end of the gas supply nozzle part 362 annularly extends downward beyond the lower end of the liquid supply nozzle part 358, to define a largely externally opening injection port 366 facing the discharge port of the liquid supply nozzle part 358 and the annular discharge port of the gas supply nozzle part 362.

The through-hole 360 of the liquid supply nozzle part 358 is communicatively connected with an alkaline solution supply pipe 368 channel-connected to a supply source (not shown) for the alkaline solution consisting of the mixed solution of ammonia water, hydrogen peroxide water and deionized water. An on-off control valve 370 is inserted in the pipe 368. An air introduction tube 372 is arranged on the gas supply nozzle part 362 to communicate with the annular hole 364, so that an air supply pipe 374 channel-connected to a compressed air source (not shown) is communicatively connected to the air introduction tube 372. Another on-off control valve 376 is inserted in the pipe 374.

When the on-off control valve 370 is opened to supply the alkaline solution (the mixed solution of ammonia water, hydrogen peroxide water and deionized water) from the supply source for the alkaline solution to the liquid supply nozzle part 358 through the pipe 368 in the bi-fluid nozzle 348 having the aforementioned structure, the liquid supply nozzle part 358 straightly discharges the alkaline solution downward from the discharge port provided on its lower end. When the on-off control valve 376 is opened to feed compressed air from the compressed air source to the air introduction tube 372 through the pipe 374, on the other hand, the gas supply nozzle part 362 discharges the compressed air from the annular discharge port through the annular hole 364. The compressed air discharged from the annular discharge port of the gas supply nozzle part 362 progresses to converge on the point on the extension line of the through-hole 360 of the liquid supply nozzle part 358, thereby colliding with the alkaline solution rectilinearly progressing downward from the discharge port provided on the lower end of the liquid supply nozzle part 358. Thus, the alkaline solution and the compressed air are mixed with each other to form droplets 377, which are injected from the injection port 366 while slightly spreading in a conical form, to be injected onto the surface of the substrate W.

As shown in FIG. 25, a supply mechanism 378 for an acid solution consisting of a mixed solution of hydrofluoric acid, hydrochloric acid and deionized water is arranged on another side portion of the wall part 336. The supply mechanism 378 for the acid solution comprises a nozzle 380 having a discharge port arranged above the substrate W held on the spin base 310 to be opposed to its surface. The nozzle 380 is fixed to the forward end of an arm 382, which in turn is horizontally held by an arm holding part 384 in a cantilever manner. The arm holding part 384 is fixed to the upper end of a vertically arranged rotary spindle 386. The rotary spindle 386 is coupled to a nozzle moving mechanism 388, to be rotated and vertically reciprocated by this nozzle moving mechanism 388. The nozzle moving mechanism 388 is so driven that the nozzle 380 can be swung in a horizontal plane, reciprocated between the central portion and the peripheral portion of the substrate W and approached to/separated from the surface of the substrate W. The arm 382 holding the nozzle 380 can be rotated from a position shown by two-dot chain lines in FIG. 23 to a position shown by solid lines, to be retracted to an external position for the wall part 336. The nozzle moving mechanism 388 is not restricted to the illustrated one but can alternatively be implemented by another mechanism.

The nozzle 380 is communicatively connected with a liquid supply pipe 410 for supplying the acid solution etc. This pipe 410 is channel-connected to a supply source (not shown) for the acid solution through an on-off control valve 415. The pipe 410 is also channel-connected to a deionized water supply source through an on-off control valve 417, so that the acid solution and deionized water can be selectively supplied to the surface of the substrate W by adjusting opening/closing of the on-off control valves 415 and 417.

This substrate processing apparatus further comprises a control part 391 in addition to the aforementioned structure, for controlling operations of the motor 326, the nozzle moving mechanisms 356 and 388, the on-off control valves 370, 376, 415 and 417 etc.

Figure 27:
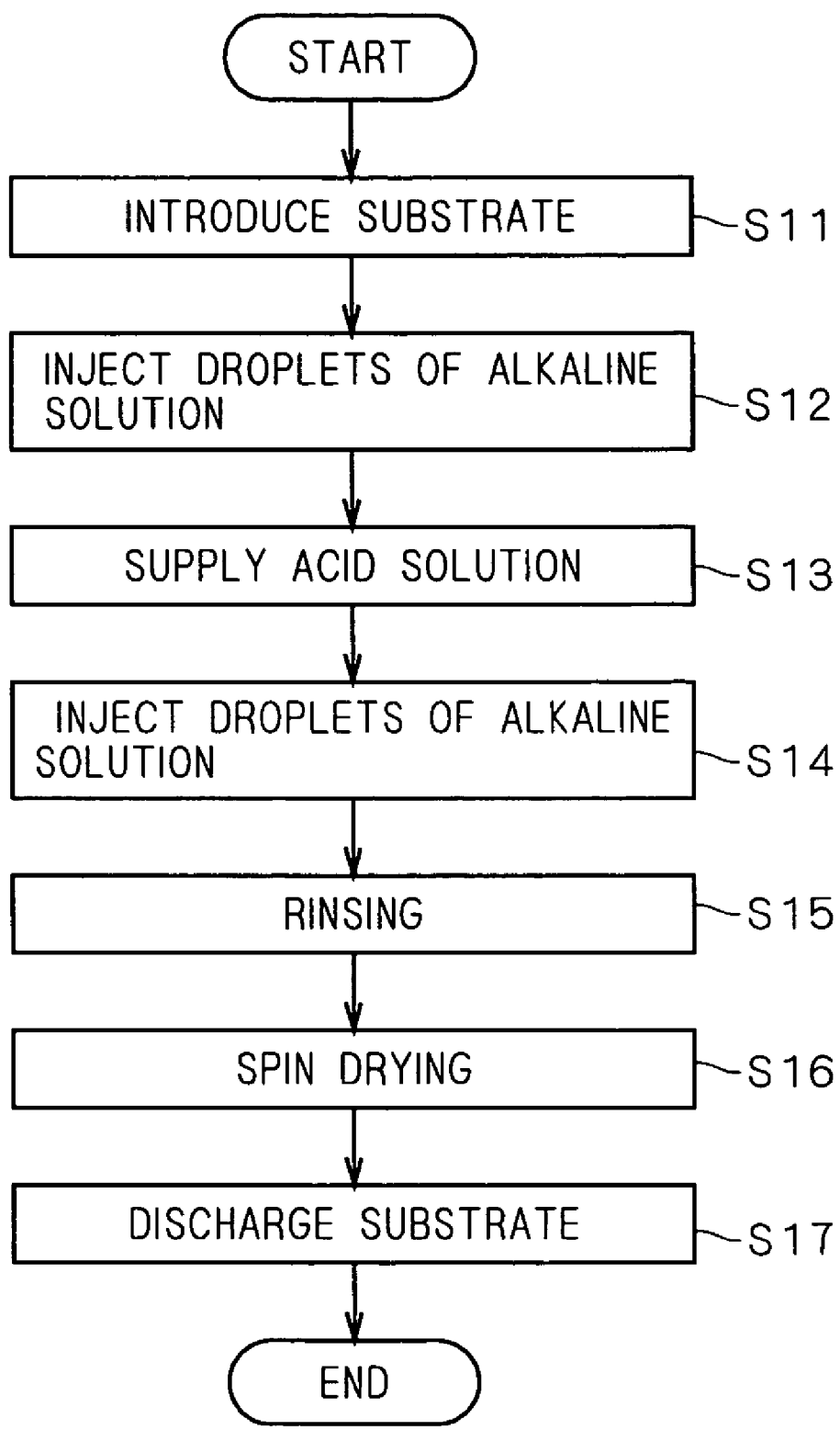
FIG. 27 is a flow chart illustrating substrate processing operations according to the third embodiment.

An exemplary method of cleaning the semiconductor substrate W with the substrate processing apparatus having the aforementioned structure is now described. FIG. 27 is a flow chart showing exemplary processing of cleaning the substrate W. As shown in FIG. 27, the substrate processing apparatus according to this embodiment cleans the substrate W in order of introduction of the substrate W (step S11), injection of droplets of the alkaline solution (step S12), supply of the acid solution (step S13), injection of droplets of the alkaline solution (step S14), rising (step S15), spin drying (step S16) and discharge of the substrate W (step S17). The aforementioned control part 391 controls the operations of the motor 326, the nozzle moving mechanisms 356 and 388, the on-off control valves 370, 376, 415 and 417 etc. for progressing this cleaning flow.

At the step S11, the substrate processing apparatus retracts the bi-fluid nozzle 348 and the nozzle 380 to external positions for the wall part 336 for introducing the uncleaned substrate W onto the spin base 310 with a transport robot (not shown) and pressing and fixing the outer peripheral end surface of the substrate W with the plurality of chuck pins 312.

At the step S12, the substrate processing apparatus drives the motor 326 for rotating the substrate W held on the spin base 310 in a horizontal plane. The substrate processing apparatus further drives the nozzle moving mechanism 356 for approaching the bi-fluid nozzle 348 to the surface of the substrate W and swinging the same in a horizontal plane. Then, the substrate processing apparatus reciprocates the bi-fluid nozzle 348 between the central portion and the peripheral portion of the substrate W along the surface of the substrate W held on the spin base 310, for injecting the droplets 377 of the alkaline solution (the mixed solution of ammonia water, hydrogen peroxide water and deionized water) from the bi-fluid nozzle 348. The alkaline solution may not be temperature-controlled but may be employed under the ordinary temperature. The substrate processing apparatus also discharges a cleaning solution such as deionized water from the discharge port provided on the upper end of the nozzle 334 toward the central portion of the lower surface of the substrate W held on the spin base 310. Deionized water or the like is also thereafter discharged toward the central portion of the lower surface of the substrate W if necessary.

At this step S12, the substrate processing apparatus injects the droplets 377 from the bi-fluid nozzle 348 to the surface of the substrate W and collides the former against the latter, thereby physically removing particles adhering to the surface of the substrate W due to kinetic energy of the droplets 377. Further, the substrate processing apparatus injects the alkaline solution to the surface of the substrate W in the state of the droplets 377 without applying excess impact force to the substrate W itself. Also when an electronic circuit pattern is formed on the surface of the substrate W, therefore, the pattern is not damaged.

Potentials (zeta potentials) of the surfaces of main particles such as PSL (polystyrene latex), $Si_3N_4$, $SiO_2$ and Si are charged to minus (−) states in the alkaline aqueous solution while zeta potentials on the surface of the substrate (silicon wafer) W are also charged to minus (−) states when in contact with the alkaline aqueous solution. In this case, the zeta potentials on the surface of the substrate W and those of the particles have the same polarity, leading to repulsion between the substrate W and the particles. Therefore, it follows that particles once liberated from the surface of the substrate W are prevented from re-adhesion due to the repulsion of the zeta potentials, to be efficiently removed.

At this step S12, the substrate processing apparatus alters metal contaminants such as Fe and Cu adhering to the surface of the substrate W to hydroxides by supplying the alkaline solution. Thus, the substrate processing apparatus can readily dissolve the metal contaminants in the subsequent step S13.

At the step S13, the substrate processing apparatus separates the bi-fluid nozzle 348 from the surface of the substrate W for retracting the same to the external position for the wall part 336 as shown by two-dot chain lines in FIG. 23, and thereafter drives the nozzle moving mechanism 388 for moving the nozzle 380 from the retracted position shown by solid lines in FIG. 23 to a position located above the substrate W shown by two-dot chain lines. Thereafter the substrate processing apparatus approaches the nozzle 380 to the surface of the substrate W and swings the same in a horizontal plane. The substrate processing apparatus reciprocates the nozzle 380 between the central portion and the peripheral portion of the substrate W along the surface of the substrate W held on the rotated spin base 310 for discharging the acid solution (the mixed solution of hydrofluoric acid, hydrochloric acid and deionized water) to the surface of the substrate W. The acid solution may not be temperature-controlled but may be employed under the ordinary temperature.

At this step S13, it follows that metal contaminants adhering to the substrate W are dissolved (ionized) by the acid solution supplied to the substrate W, to be removed. The substrate processing apparatus, previously altering the metal contaminants adhering to the surface of the substrate W to hydroxides at the step S12, can further rapidly dissolve the metal contaminants with the acid solution at the step S13. Thus, the substrate processing apparatus can remove the metal contaminants while suppressing the quantity of etching on the surface of the substrate W with the acid solution due to the rapid processing.

At the step S14, the substrate processing apparatus separates the nozzle 380 from the surface of the substrate W for retracting the same to the external position for the wall part 336 as shown by solid lines in FIG. 23, and thereafter drives the nozzle moving mechanism 356 for moving the bi-fluid nozzle 348 from the retracted position shown by two-dot chain lines in FIG. 23 to the position located above the substrate W shown by solid lines. Thereafter the substrate processing apparatus approaches the bi-fluid nozzle 348 to the surface of the substrate W and swings the same in the horizontal plane. The substrate processing apparatus reciprocates the bi-fluid nozzle 348 between the central portion and the peripheral portion of the substrate W along the surface of the substrate W held on the rotated spin base 310 for injecting the droplets 377 of the alkaline solution (the mixed solution of ammonia water, hydrogen peroxide water and deionized water) to the surface of the substrate W.

The substrate processing apparatus has already removed many particles at the step S12. However, hardly removable particles such as those present in a state embedded in the substrate W or those strongly adsorbed to the surface of the substrate W may not be removed at the step S12 but remain on the surface of the substrate W. When the substrate processing apparatus supplies the acid solution at the step S13, the surface of the substrate W is extremely slightly etched so that these particles float up to the surface of the substrate W to be readily removable. At the step S14, the substrate processing apparatus removes such particles by injecting the droplets 377 of the alkaline solution to the surface of the substrate W.

At the step S14, the substrate processing apparatus physically removes particles adhering to the surface of the substrate W due to the kinetic energy of the droplets 377 similarly to the step S12. It follows that particles once liberated from the surface of the substrate W are prevented from re-adhesion due to repulsion of zeta potentials in the alkaline solution, to be efficiently removed.

In order to float up and remove such particles from the surface of the substrate W only by etching with the acid solution, the quantity of etching on the surface of the substrate W must inevitably be increased. According to this embodiment, however, etching with the acid solution and the physical action resulting from injection of the droplets 377 are so combined with each other that the substrate processing apparatus can remove such particles while minimizing the quantity of etching on the surface of the substrate W.

At the step S15, the substrate processing apparatus separates the bi-fluid nozzle 348 from the surface of the substrate W for retracting the same to the external position for the wall part 336 as shown by two-dot chain lines in FIG. 23, and thereafter drives the nozzle moving mechanism 388 for moving the same from the retracted position shown by solid lines in FIG. 23 to the position located above the substrate W shown by two-dot chain lines. Thereafter the substrate processing apparatus approaches the nozzle 380 to the surface of the substrate W and swings the same in the horizontal plane. The substrate processing apparatus reciprocates the nozzle 380 between the central portion and the peripheral portion of the substrate W along the surface of the substrate W held on the rotated spin base 310 for discharging deionized water to the surface of the substrate W and rinsing the same. Alternatively, a discharge nozzle dedicated to deionized water may be set independently of the nozzle 380 for discharging deionized water from this discharge nozzle to the surface of the substrate W.

At the step S16, the substrate processing apparatus increase the rotational frequency of the motor 326 for rotating the substrate W at a high speed and draining moisture adhering to the surface of the substrate W thereby drying (spin-drying) the substrate W. After completely drying the surface of the substrate W, the substrate processing apparatus stops the motor 326 thereby stopping rotating the substrate W.

At the step S17, the substrate processing apparatus retracts both of the bi-fluid nozzle 348 and the nozzle 380 to the external positions for the wall part 336 for bringing the plurality of chuck pins 312 pressing and fixing the outer peripheral end surface of the substrate W into the releasing states, and discharges the substrate W from the spin base 310 by the transport robot (not shown) for terminating the processing of cleaning the single substrate W.

The substrate processing apparatus can perform the aforementioned series of processing with the alkaline solution and the acid solution under the ordinary temperature (20 to 30° C.). When keeping the room temperature at the ordinary temperature, the substrate processing apparatus can readily process the substrate W with the alkaline solution and the acid solution usable with no particular adjustment of the liquid temperatures. In other words, the substrate processing apparatus requires neither time nor equipment for temperature control before and after processing, whereby the processing time as well as the cost can be reduced. Further, the substrate processing apparatus can remarkably reduce the quantity for etching the substrate W with the alkaline solution and the acid solution by performing processing at the ordinary temperature as compared with a case of performing processing at a high temperature (about 65° C.).

The alkaline solution, prepared from the mixed solution (SC1) of ammonia water, hydrogen peroxide water and deionized water in the aforementioned processing for cleaning the substrate W, may alternatively be replaced with an alkaline solution prepared by adding ozone water or the like as an oxidant in place of hydrogen peroxide. Further alternatively, a surface active agent may be added to the alkaline solution. When the alkaline solution containing an oxidant or a surface active agent is used, it is possible to attain effects of protecting the surface of the processed substrate W and inhibiting surface roughness from deterioration. Further, the alkaline solution may be prepared solely from dilute ammonia water. When dilute ammonia water is solely employed, the volume ratio of deionized water and ammonia water (28 to 30 wt. %: the same shall apply hereinafter) is preferably set to 5:0.02 to 0.6 in order to protect the surface of the substrate W. When the mixed solution of ammonia water, hydrogen peroxide and deionized water is employed, the volume ratios of deionized water, ammonia water and hydrogen peroxide water (30 wt. %: the same shall apply hereinafter) are preferably set to 5:0.03 to 1:0.03 to 1 in order to keep alkalinity.

The acid solution, prepared from the mixed solution of hydrofluoric acid, hydrochloric acid and deionized water in the aforementioned processing for cleaning the substrate W, may alternatively be prepared from dilute hydrochloric acid, dilute hydrofluoric acid or dilute sulfuric acid. The volume ratio of hydrochloric acid (35 wt. %: the same shall apply hereinafter) and deionized water is preferably set to 1:3 to 15 when dilute hydrochloric acid is employed, while the volume ratio of hydrofluoric acid (50 wt. %: the same shall apply hereinafter) and dilute hydrochloric acid is preferably set to 1:50 to 500 in order to suppress etching force of hydrofluoric acid when a mixed solution of dilute hydrochloric acid, dilute hydrofluoric acid and ionized water is employed.

In the aforementioned processing for cleaning the substrate W, intermediate rinsing with deionized water may be performed between the steps S12 and S13 or the steps S13 and S14.

While the substrate processing apparatus successively carries out injection of the droplets 377 of the alkaline solution (step S12), supply of the acid solution (step S13) and injection of the droplets 377 of the alkaline solution (step S14) on the substrate W in the aforementioned cleaning flow, injection of the droplets 377 may be performed at least once or more simultaneously with or after slight etching on the surface of the substrate W with the acid solution in order to effectively remove particles including hardly removable ones. In order to effectively remove metal contaminants in a short time, on the other hand, the substrate processing apparatus may supply the acid solution to the substrate W after supplying the alkaline solution. From this viewpoint, it is possible to effectively remove particles and metal contaminants in a short time not only according to the aforementioned cleaning processing flow but also according to various cleaning flows shown in FIGS. 28A to 28D for attaining the object of the present invention. Each of FIGS. 28A to 28D omits steps (introduction and discharge of the substrate W, rinsing, spin drying etc.) other than supply of the alkaline solution and supply of the acid solution. FIGS. 28A to 28D also illustratively list up cleaning flows, and other various cleaning flows are also employable.

Figure 28A:
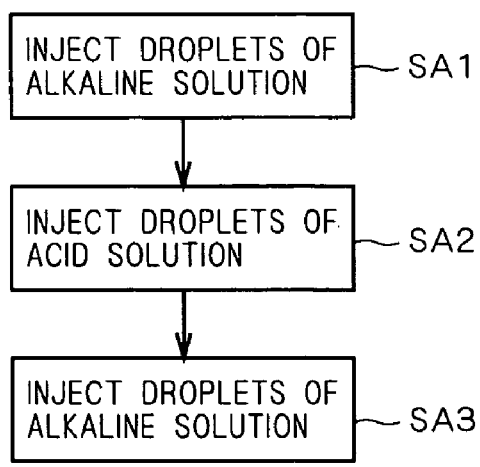
FIGS. 28A, 28B, 28C and 28D illustrate various cleaning flows according to the third embodiment.

According to the cleaning flow shown in FIG. 28A, the substrate processing apparatus successively carries out supply of the alkaline solution (step SA1), supply of the acid solution (step SA2) and supply of the alkaline solution (step SA3) while performing both of supply of the alkaline solution (steps SA1 and SA3) and supply of the acid solution (step SA2) by injecting droplets. In order to implement this cleaning flow, the substrate processing apparatus may employ bi-fluid nozzles for both of supply mechanisms for the alkaline solution and the acid solution.

Figure 28C:
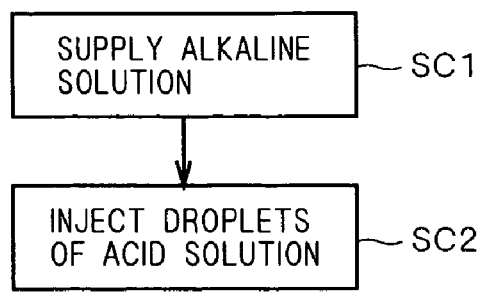
Figure 28B:
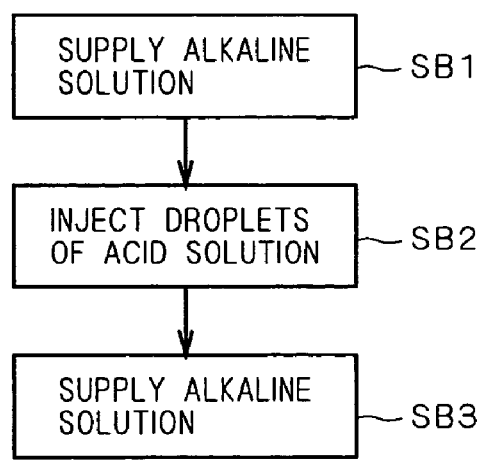

According to the cleaning flow shown in FIG. 28B, the substrate processing apparatus successively carries out supply of the alkaline solution (step SB1), supply of the acid solution (step SB2) and supply of the alkaline solution (step SB3) on the substrate W while supplying only the acid solution (step SB2) by injecting droplets. In order to implement this cleaning flow, the substrate processing apparatus may employ an ordinary nozzle for a supply mechanism for the alkaline solution while employing a bi-fluid nozzle for a supply mechanism for the acid solution.

According to the cleaning flow shown in FIG. 28C, the substrate processing apparatus successively carries out supply of the alkaline solution (step SC1) and supply of the acid solution (step SC2) on the substrate W while performing only supply of the acid solution (step SC2) by injecting droplets. In order to implement this cleaning flow, the substrate processing apparatus may employ an ordinary nozzle for a supply mechanism for the alkaline solution while employing a bi-fluid nozzle for a supply mechanism for the acid solution.

Figure 28D:
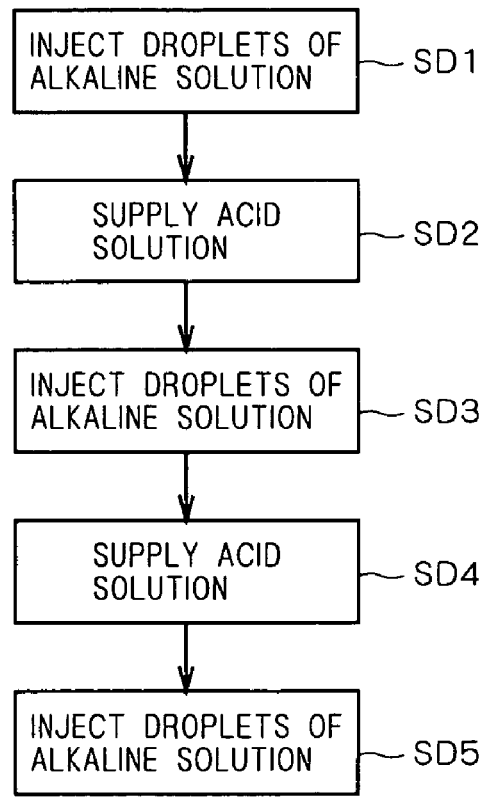

According to the cleaning flow shown in FIG. 28D, the substrate processing apparatus carries out supply of the alkaline solution (step SD1) to the substrate W and thereafter repeatedly carries out supply of the acid solution and subsequent supply of the alkaline solution twice (steps SD2 to SD5) while performing only supply of the alkaline solution (steps SD1, SD3 and SD5) by injecting droplets. In order to implement this cleaning flow, the substrate processing apparatus may employ a bi-fluid nozzle for a supply mechanism for the alkaline solution while employing an ordinary nozzle for a supply mechanism for the acid solution. Alternatively, the substrate processing apparatus may separately comprise an alkaline solution supply mechanism employing an ordinary nozzle for partially carrying out the steps SD1, SD3 and SD5 of supplying the alkaline solution through the ordinary nozzle. The substrate processing apparatus may further alternatively repeatedly carry out the steps SD2 to SD5 for the supply of the acid solution and the subsequent supply of the alkaline solution at least three times.

According to the mode of supplying only either the alkaline solution or the acid solution by injecting droplets, however, the substrate processing apparatus can further suppress droplets of the processing solution from floating in the peripheral atmosphere of the processed substrate W in a large quantity and reduce such a possibility that the droplets adhere to respective portions of the substrate processing apparatus and the processed substrate W as compared with the mode of supplying both of the alkaline solution and the acid solution by injecting droplets.

In relation to such steps of alternately supplying the alkaline solution and the acid solution, it is known that the substrate processing apparatus can terminate rinsing in a shorter time by finally supplying the alkaline solution and thereafter performing rinsing as compared with a case of finally supplying the acid solution and thereafter performing rinsing.

The bi-fluid nozzle 348, formed by an external-mix bi-fluid nozzle as shown in FIG. 26 in the aforementioned example, may alternatively be formed by an internal-mix bi-fluid nozzle such as the bi-fluid nozzle 80 according to the first embodiment. However, the external-mix bi-fluid nozzle has such an advantage that no liquid drops from the forward end thereof at an unnecessary time dissimilarly to the internal-mix bi-fluid nozzle. The external-mix bi-fluid nozzle also has such an advantage that flow pressures of gas and a liquid, not serving as resistance against each other, are easier to control as compared with those in the internal-mix bi-fluid nozzle.

While the substrate processing apparatus utilizes the impact resulting from injection of the droplets 377 in order to physically remove particles without damaging the substrate W in the aforementioned exemplary processing for cleaning the substrate W, the substrate processing apparatus may alternatively impart megasonic vibrations to the processing solutions for utilizing the impact of the megasonic vibrations. In this case, the substrate processing apparatus may employ a nozzle such as the nozzle 268 according to the second embodiment having a function of imparting megasonic vibrations to a liquid.

Figure 29:
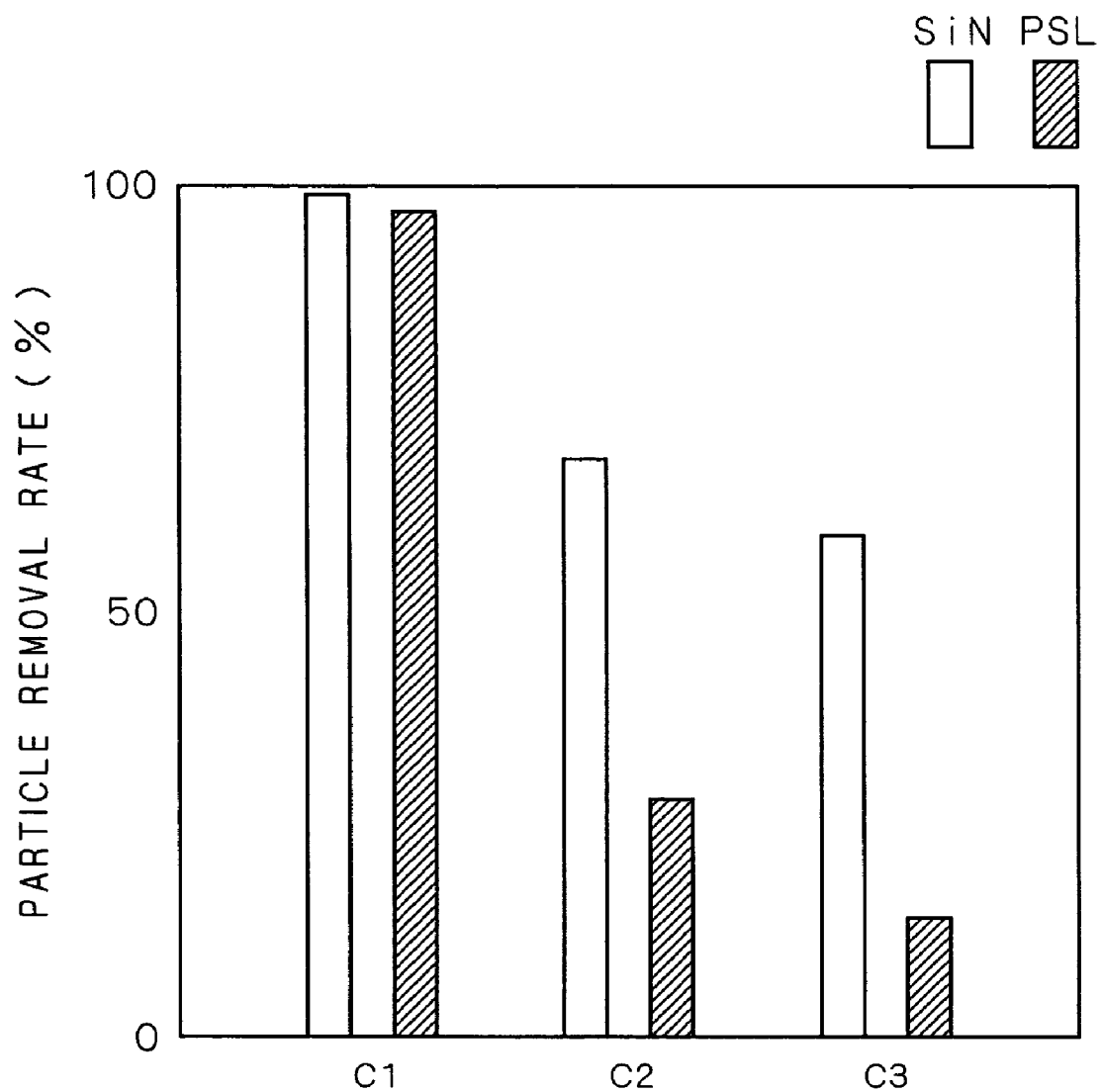
FIG. 29 illustrates results of particle removal rates evaluated in relation to a substrate processing method according to the third embodiment.

FIG. 29 is a graph showing results of a test as to removal rates for SiN and PSL (both are particles) in a case of cleaning the substrate W with the aforementioned substrate processing apparatus. The alkaline solution was prepared from a mixed solution containing ammonia water, hydrogen peroxide water and deionized water in volume ratios of 1:1:100, and the acid solution was prepared from a mixed solution of dilute hydrofluoric acid and dilute hydrochloric acid containing hydrofluoric acid, hydrochloric acid and deionized water in volume ratios of 1:40:200. In this test, the surface of the substrate W was intentionally rendered hydrophobic so that particles were hard to remove.

Under a processing condition C1, the substrate processing apparatus injected the alkaline solution to the surface of the substrate W in a state of droplets for 10 seconds, thereafter supplied the acid solution to the surface of the substrate W for 10 seconds and thereafter re-supplied the alkaline solution to the surface of the substrate W in the state of droplets for 10 seconds.

Under a processing condition C2, the substrate processing apparatus repeatedly performed processing of injecting the alkaline solution to the surface of the substrate W in a state of droplets for 10 seconds twice.

Under a processing condition C3, the substrate processing apparatus injected the alkaline solution to the surface of the substrate W in a state of droplets for 10 seconds and thereafter supplied the acid solution to the surface of the substrate W for 10 seconds.

According to the results shown in FIG. 29, the substrate processing apparatus attained a superior particle removal rate under the processing condition C1 as compared with the processing conditions C2 and C3. In other words, it has been confirmed possible to attain a high particle removal rate by injecting droplets of the alkaline solution after processing with the acid solution.

While the invention has been shown and described in detail, the foregoing description is in all aspects illustrative and not restrictive. It is therefore understood that numerous modifications and variations can be devised without departing from the scope of the invention.

What is claimed is:

1. A substrate processing method comprising;
   a first step of supplying an alkaline solution to a surface of a substrate;
   a second step of supplying an acid solution to the surface of said substrate after said first step; and
   a third step of supplying said alkaline solution to the surface of said substrate after said second step;
   rotating said substrate in a horizontal plane from said first step to said third step; and
   said supplying of said alkaline solution in said first step and said third step comprises injection and collision of droplets formed in an external-mix bi-fluid nozzle by mixing said alkaline solution with gas from said bi-fluid nozzle to the surface of the rotated substrate, wherein, said alkaline solution is a mixed solution containing ammonia water, hydrogen peroxide water, and deionized water,
said acid solution supplied in said second step is an acid solution having an etching effect, said acid solution is a mixed solution containing hydrochloric acid, hydrofluoric acid, and deionized water, and
said alkaline solution and said acid solution are both solutions at ordinary temperature,
and farther comprising a rinsing step of performing rinsing by discharging deionized water to the surface of said substrate after said third step.

2. The substrate processing method according to claim 1, wherein said alkaline solution has a pH value of at least 11 and less than 13.

* * * * *